United States Patent
Kim et al.

(10) Patent No.: US 8,198,801 B2
(45) Date of Patent: Jun. 12, 2012

(54) MATERIALS FOR INJECTING OR TRANSPORTING HOLES AND ORGANIC ELECTROLUMINESCENCE DEVICES USING THE SAME

(75) Inventors: Ji Eun Kim, Daejeon (KR); Jae Chol Lee, Daejeon (KR); Kong Kyeom Kim, Daejeon (KR); Jae Soon Bae, Daejeon (KR); Jun Gi Jang, Cheongju-si (KR); Sang Young Jeon, Seoul (KR); Min Soo Kang, Daejeon (KR); Wook Dong Cho, Daejeon (KR); Byung Sun Jeon, Seoul (KR); Yeon Hwan Kim, Goyang-si (KR)

(73) Assignee: LG Chem, Ltd., Seoul (KR)

( * ) Notice: Subject to any disclaimer, the term of this patent is extended or adjusted under 35 U.S.C. 154(b) by 291 days.

(21) Appl. No.: 11/083,360

(22) Filed: Mar. 18, 2005

(65) Prior Publication Data
US 2005/0225235 A1    Oct. 13, 2005

(30) Foreign Application Priority Data

Mar. 19, 2004 (KR) .................. 10-2004-0018877
Dec. 30, 2004 (KR) .................. 10-2004-0116388

(51) Int. Cl.
*H01L 51/54* (2006.01)
*H05B 33/14* (2006.01)
*C09K 11/06* (2006.01)

(52) U.S. Cl. ........ 313/504; 313/506; 428/690; 428/917; 257/40; 257/E51.05; 257/E51.051

(58) Field of Classification Search .................. 548/444, 548/442
See application file for complete search history.

(56) References Cited

U.S. PATENT DOCUMENTS

| | | | |
|---|---|---|---|
| 4,356,429 A | 10/1982 | Tang | |
| 4,769,292 A * | 9/1988 | Tang et al. | 428/690 |
| 5,150,006 A | 9/1992 | Van Slyke et al. | |
| 5,256,945 A | 10/1993 | Imai et al. | |
| 5,366,811 A | 11/1994 | Higashi et al. | |
| 5,475,213 A | 12/1995 | Fujii et al. | |
| 5,516,577 A | 5/1996 | Matsuura et al. | |
| 5,554,459 A | 9/1996 | Gozdz et al. | |
| 5,645,948 A | 7/1997 | Shi et al. | |
| 5,840,217 A | 11/1998 | Lupo et al. | |
| 6,334,283 B1 | 1/2002 | Edger | |
| 6,451,455 B1 | 9/2002 | Thompson et al. | |

(Continued)

FOREIGN PATENT DOCUMENTS

JP        57-51781        3/1982

(Continued)

OTHER PUBLICATIONS

Sakakibara et al., JP 2002-124389, machine assisted translation.*

(Continued)

*Primary Examiner* — Jennifer Chriss
*Assistant Examiner* — Brett A Crouse
(74) *Attorney, Agent, or Firm* — McKenna Long & Aldridge LLP

(57) ABSTRACT

The present invention relates to a novel compound that can significantly improve the lifespan, efficiency and thermal stability of an organic light emitting device, and to an organic electroluminescence device or light emitting device comprising the compound in an organic compound layer is also disclosed.

6 Claims, 1 Drawing Sheet

U.S. PATENT DOCUMENTS

| | | |
|---|---|---|
| 6,541,129 B1 | 4/2003 | Kawamura et al. |
| 6,660,410 B2 | 12/2003 | Hosokawa |
| 6,696,181 B2 | 2/2004 | Okunaka et al. |
| 2002/0107405 A1* | 8/2002 | Lin et al. ................ 548/439 |
| 2004/0001969 A1* | 1/2004 | Cosimbescu et al. ......... 428/690 |

FOREIGN PATENT DOCUMENTS

| | | |
|---|---|---|
| JP | 59-194393 | 11/1984 |
| JP | 01-245087 | 9/1989 |
| JP | 02-189890 | 7/1990 |
| JP | 02-222484 | 9/1990 |
| JP | 02-289675 | 11/1990 |
| JP | 03-000791 | 1/1991 |
| JP | 03-033183 | 2/1991 |
| JP | 06-322362 | 11/1994 |
| JP | 09-301934 | 11/1997 |
| JP | 09-310066 A | 12/1997 |
| JP | 10-310574 | 11/1998 |
| JP | 11-219788 | 8/1999 |
| JP | 11-345686 | 12/1999 |
| JP | 2002 047271 A | 2/2002 |
| JP | 2002-124389 | 4/2002 |
| JP | 2002124389 A | 4/2002 |
| JP | 2003-075955 A | 3/2003 |
| JP | 2003-238501 | 8/2003 |
| JP | 2003-317966 | 11/2003 |
| WO | WO 03/017731 | 2/2003 |
| WO | WO 03/064373 | 8/2003 |
| WO | WO 2004/050794 * | 6/2004 |

OTHER PUBLICATIONS

Haniyu, JP 2003-075955, Machine Assisted Translation.*
Shirota et al., Journal of Materials Chemistry, (2000), vol. 10, pp. 1-25.*
Takeshi et al., JP 2003-075955, machine assisted translation.*
Tang, C.W. e al., "Organic electroluminescent diodes," *Appl. Phys. Lett.*, Sep. 21, 1987, vol. 51, pp. 913-915.
"Progress in Hole-Transport Materials for Use in Organic Light-Emitting Diodes", *Progress in Chemistry*, Nov. 2003.

* cited by examiner

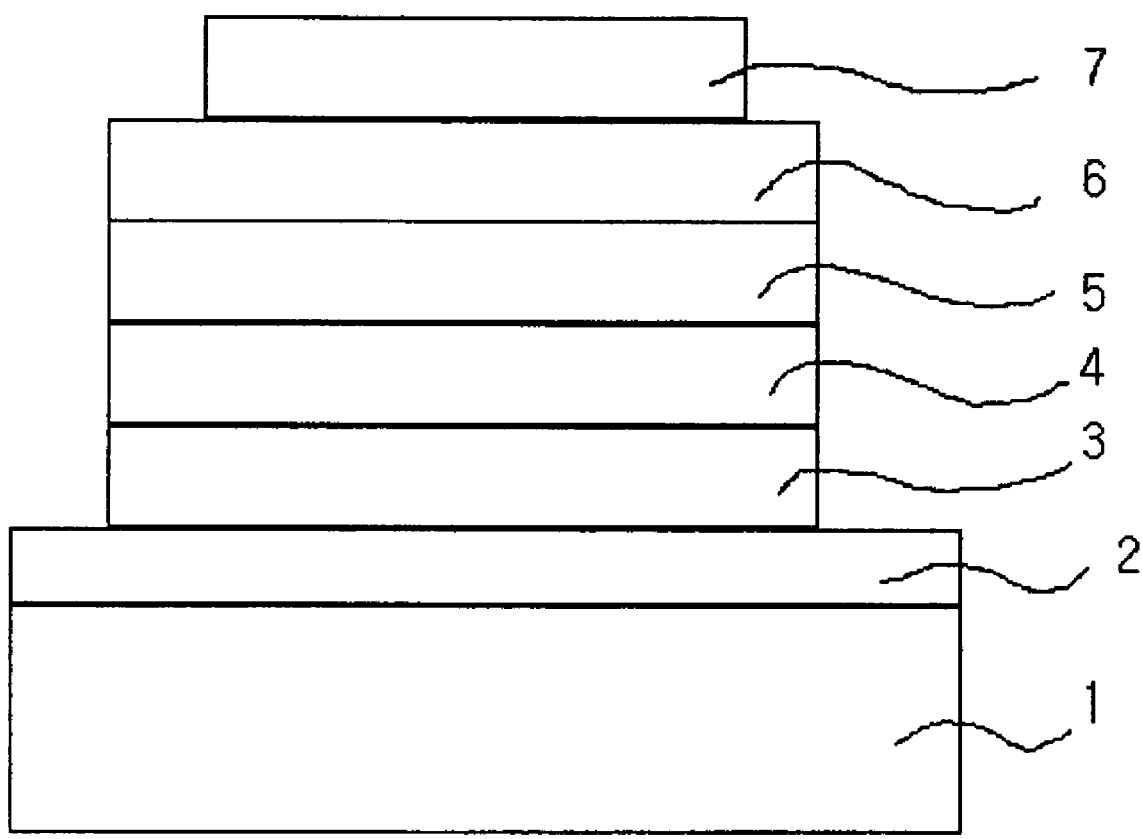

MATERIALS FOR INJECTING OR TRANSPORTING HOLES AND ORGANIC ELECTROLUMINESCENCE DEVICES USING THE SAME

CROSS-REFERENCE TO RELATED APPLICATIONS

This application claims the benefit of Korean Patent Application Nos. 10-2004-18877 and 10-2004-116388, filed Mar. 19, 2004 and Dec. 30, 2004, respectively in Korea, which are hereby incorporated by reference in their entirety for all purposes as if fully set forth herein.

TECHNICAL FIELD

The present invention relates to a novel compound that can greatly improve lifespan, efficiency and thermal stability of organic light emitting devices, and to an organic light emitting device comprising the same compound in an organic compound layer.

BACKGROUND ART

In the era of advanced information technology of the $21^{st}$ century, a great deal of information should be obtained promptly with ease, and thus an importance of the high performance flat panel display for multimedia increases. Although liquid crystal displays (LCDs) have played the main part of flat panel displays up to now, many attempts are made to develop novel flat panel displays that are cost-efficient, show excellent performance and are differentiated from liquid crystal displays all over the world. Organic electroluminescence (EL) devices or organic light emitting devices that are expected to play an important role as advanced flat panel displays have advantages of lower drive voltage, higher response rate, higher efficiency and wider view angle, compared to liquid crystal displays. In addition, because displays using organic electroluminescence phenomenon permit a total module thickness of 2 mm or less and can be manufactured on plastic substrates having a thickness of 0.3 mm or less, it is possible to meet the trend of thinning and downsizing of displays. Moreover, organic electroluminescence displays have an additional advantage in that they are produced at a lower cost compared to liquid crystal displays.

Organic light emitting devices are based on the mechanism wherein electrons and holes injected to an organic film formed of organic compounds through an anode and a cathode form exitons when they are recombined and then light having a certain wavelength is emitted from the exitons. In 1965, Pope et al. found electroluminescence in an anthracene single crystal for the first time. Following this, in 1987, Tang et al. in Kodak Co. found that an organic light emitting device formed of organic materials with a structure having separate functional laminated layers, i.e., a hole transport layer and light emitting layer laminated to each other, can provide a high luminance of 1000 cd/m$^2$ or higher even under a low voltage of 10V or less. After those findings, organic light emitting devices has been a matter of great interest in the field of display technology (Tang, C. W.; Vanslyke, S. A. *Appl. Phys. Lett.* 1987, 51, 913). Such organic light emitting devices are classified into those using fluorescence and those using phosphorescence capable of providing a high efficiency of up to three times of the fluorescence-based efficiency. Alternatively, such organic light emitting devices may be classified according to molecular weights of the organic materials forming organic light emitting devices, i.e., those prepared by a low-molecular weight method wherein a device is formed by using a vacuum sublimation process and those prepared by a high-molecular weight method wherein a device is formed by using solution processes such as a spin coating, ink jet printing or roll coating process.

As shown in FIG. 1, a conventional organic light emitting device includes an anode, a hole injection layer that accepts holes from the anode, a hole transport layer that transports holes, a light emitting layer in which holes and electrons are recombined to emit light, an electron transport layer that accepts electrons from a cathode and transport them to the light emitting layer, and a cathode. The above thin film layers are formed by a vacuum deposition process. The reason for manufacturing organic light emitting devices having a multilayered thin film structure is as follows. It is possible to transport holes and electrons to a light emitting layer more efficiently when a suitable hole transport layer and electron transport layer are used, because the moving rate of holes is significantly higher than that of electrons in organic materials. Additionally, it is possible to increase luminous efficiency when hole density is balanced with electron density in a light emitting layer.

Hereinafter, a conventional organic light emitting device will be explained referring to FIG. 1.

A substrate 1 is the support for an organic light emitting device and may be formed of a silicone wafer, quartz or glass plate, metal plate, plastic film or sheet, etc. Preferably, glass plates or transparent plates made of synthetic resins such as polyester, polymethacrylate or polysulfone are used.

A first electrode (anode) 2 is disposed on the substrate 1. The anode serves to inject holes to a hole injection layer 3 and may be formed of metals such as aluminum, gold, silver, nickel, palladium or platinum, metal oxides such as indium-tin oxides or indium-zinc oxides, halogenated metals, carbon black, or conductive polymers such as poly(3-methylthiophene), polypyrrole or polyaniline.

The hole injection layer 3 is disposed on the anode 2. Materials used in the hole injection layer have to provide high efficiency of hole injection from the anode and have to transport the injected holes efficiently. In this regard, the materials should have low ionization potential, high transparency to visible light and excellent stability to holes.

Materials for the hole injection layer include compounds that have excellent thermal stability while maintaining a stable interface with the anode. Typical examples of the materials include copper phthalocyanine (CuPc), which is a porphyrin-copper complex disclosed in U.S. Pat. No. 4,356,429 by Kodak, Co. Because CuPc is the most stable compound for use in a hole injection layer, it has been used widely. However, it shows an absorption band at the blue and red zones, and thus has problems when manufacturing full-color display devices. Recently, starburst-like aromatic aryl amine compounds having no absorption band at the blue zone are known (U.S. Pat. No. 5,256,945 and Japanese Laid-Open Patent No. 1999-219788, and see the following formulae 4-12). Particularly, among the starburst-like amines having no absorption band at the blue zone, compounds represented by the following formulae 8-12 having a glass transition temperature of 100° C. or higher and excellent stability are used.

CuPc
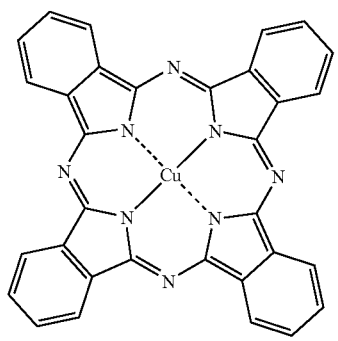
formula 4
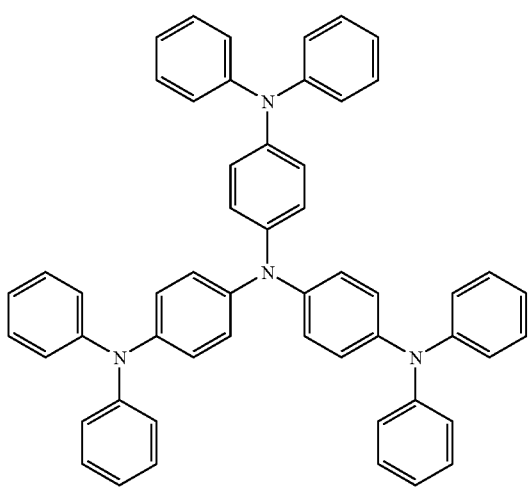
formula 5
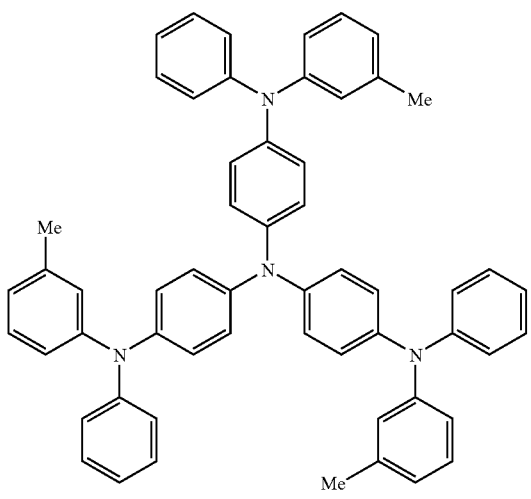
formula 6
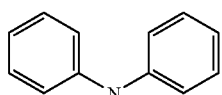
formula 7
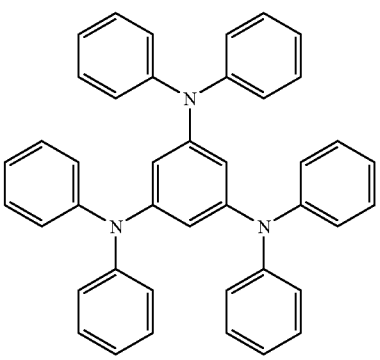
formula 8
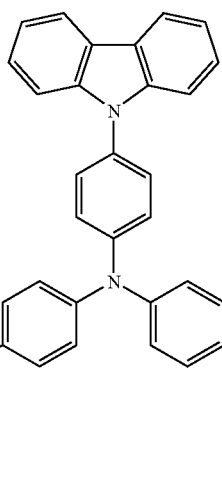

formula 9
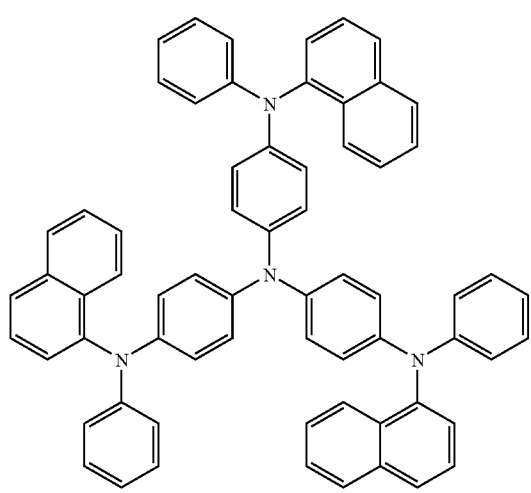
formula 10
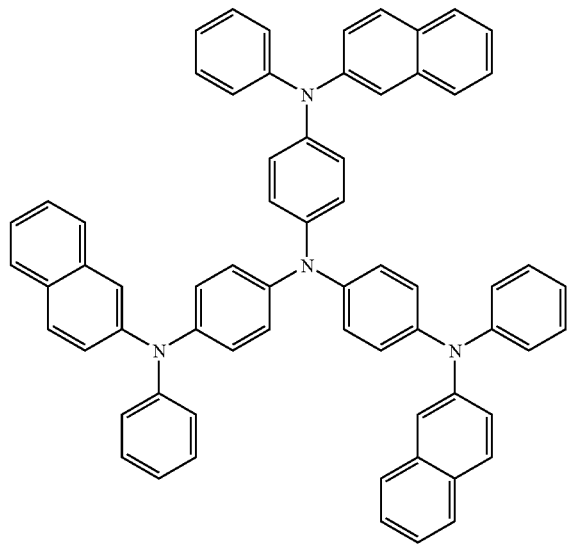
formula 11
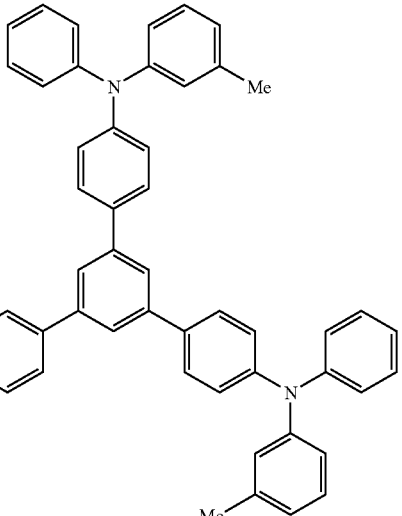
formula 12
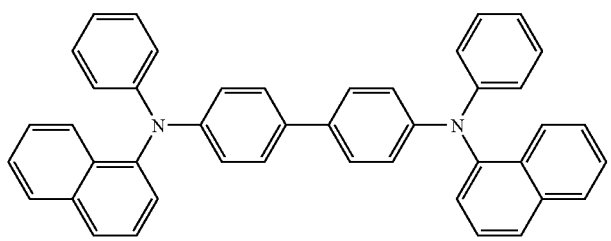
Recently, many hole injection materials having a higher glass transition temperature and more improved thermal stability have been reported. Most of them are compounds derived from NPB of Kodak, Co. and are represented by the following formulae 13-17 (see, Japanese Laid-Open Patent No. Hei9-301934 and U.S. Pat. Nos. 6,334,283 and 6,541,129).
NPB
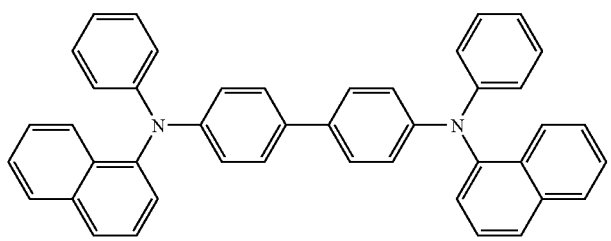

formula 13
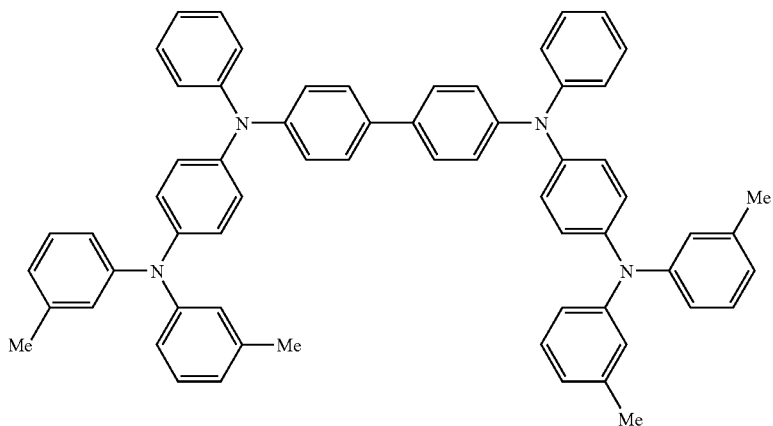
formula 14
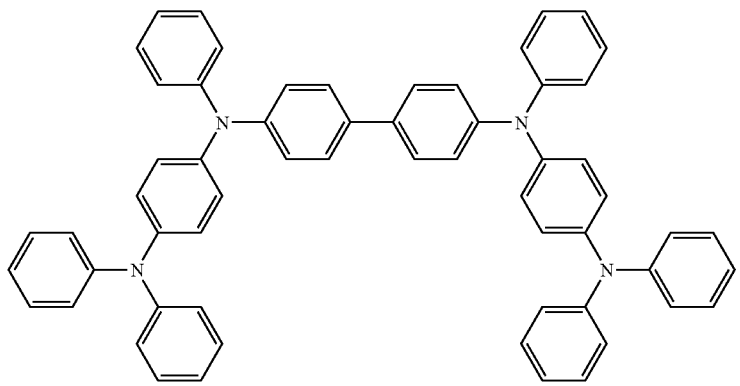
formula 15
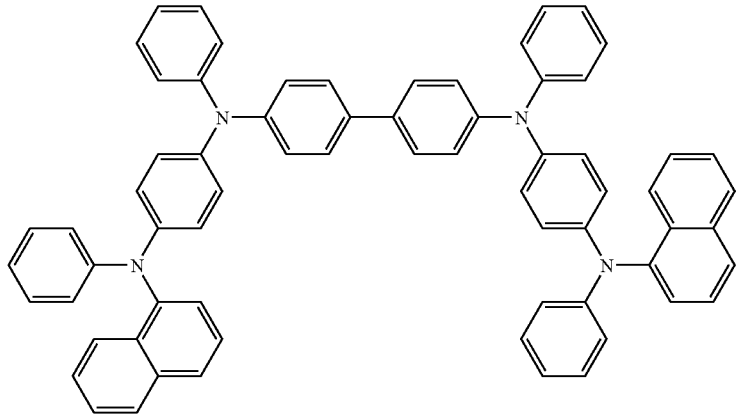
formula 16
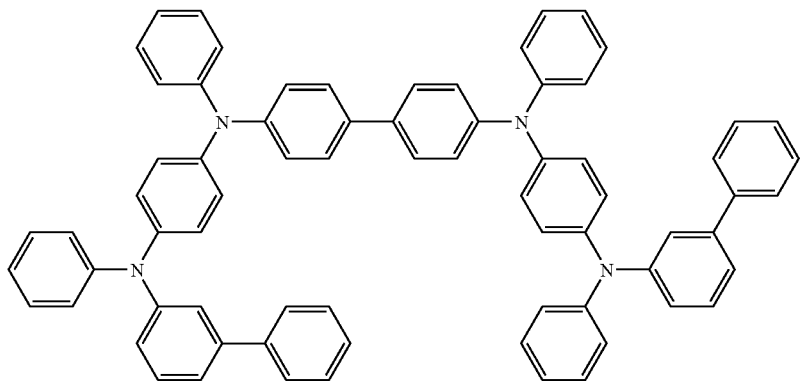

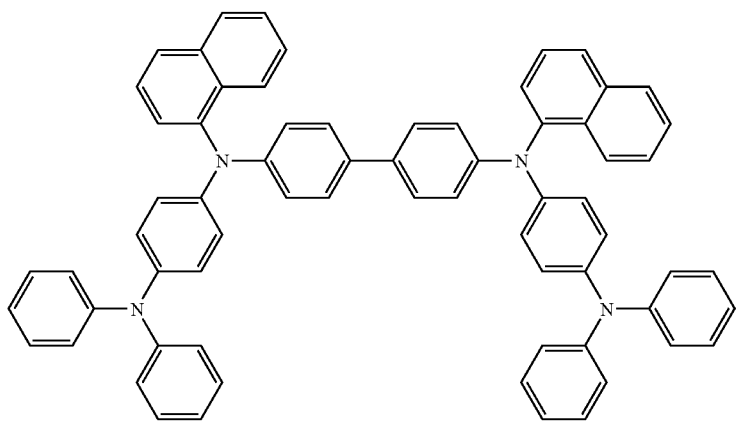

Additionally, Japanese Laid-Open Patent No. 2003-238501 discloses aromatic oligoamine derivatives having at least five nitrogen atoms in one molecule (formulae 18 and 19).

formula 18

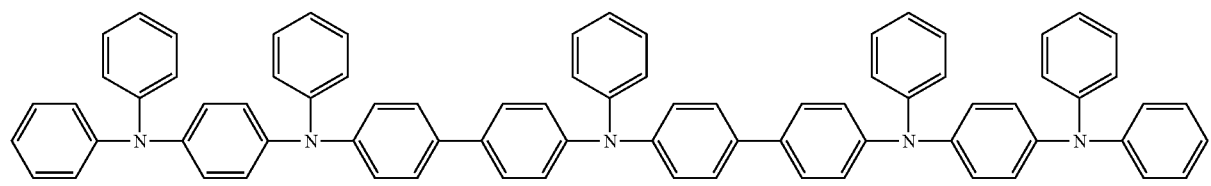

formula 19

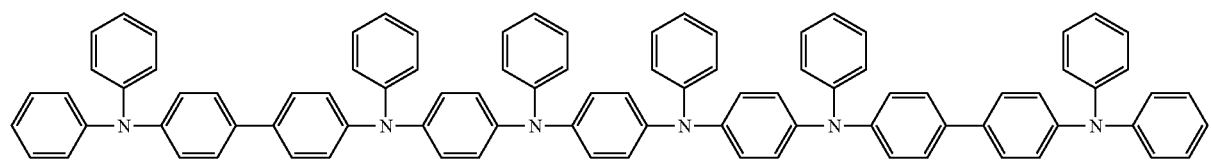

Further, more recently, Japanese Laid-Open Patent No. 2003-317966 and U.S. Pat. No. 6,660,410 disclose a carbazole group-containing material (formula 20), which is specifically used as host forming a light emitting layer in an organic light emitting device using phosphorescence and is claimed to improve the lifespan of an organic light emitting device compared to conventionally known CBP (carbazole biphenyl). Other compounds used in a hole injection layer are represented by the following formulae 21-27.

formula 20

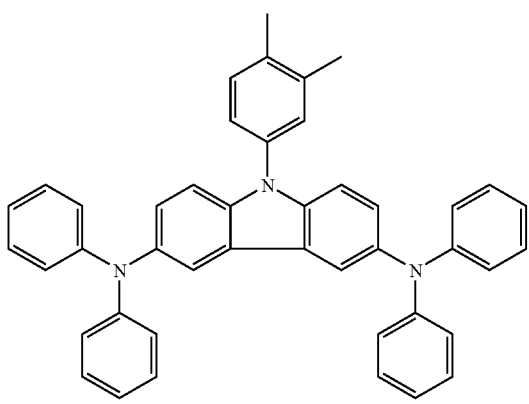

formula 21
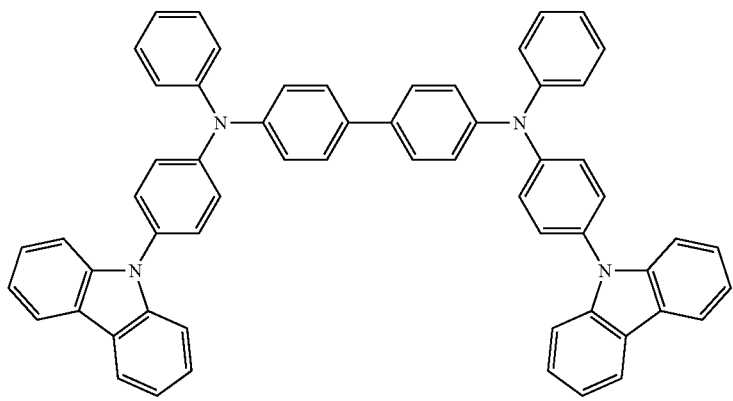
formula 22
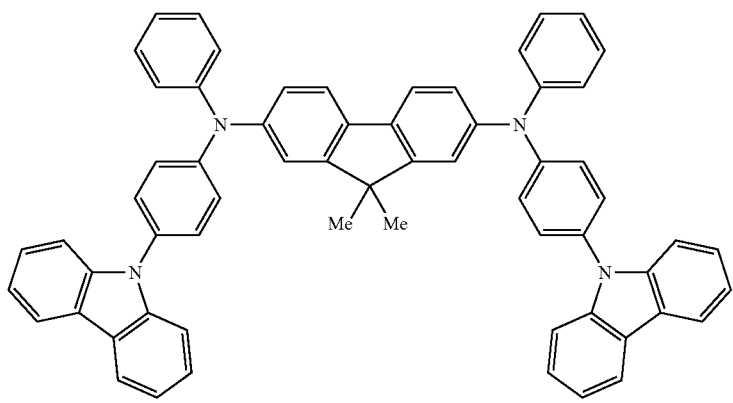
formula 23
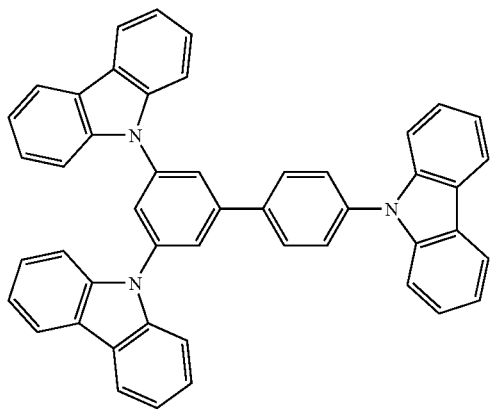
formula 24
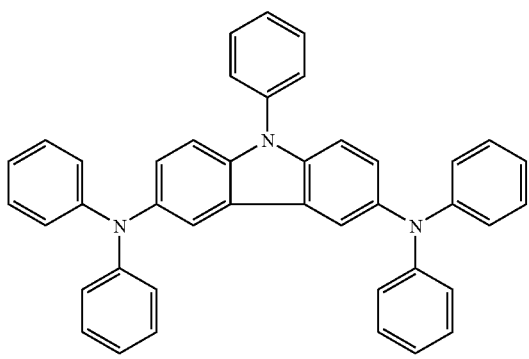

formula 25

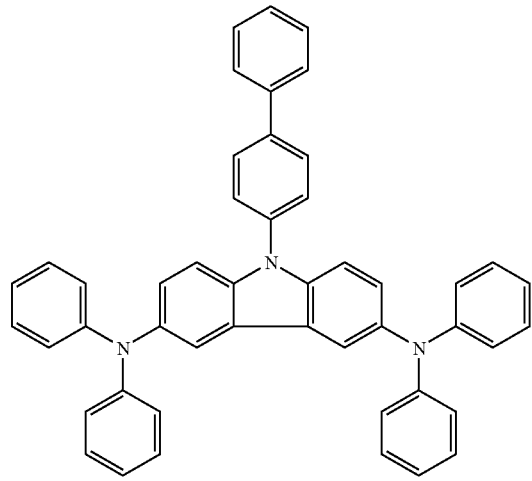

formula 26

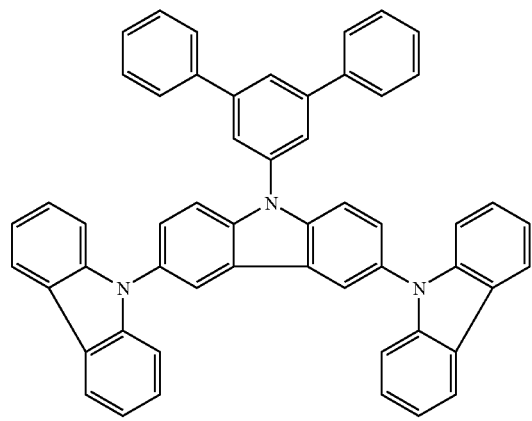

formula 27

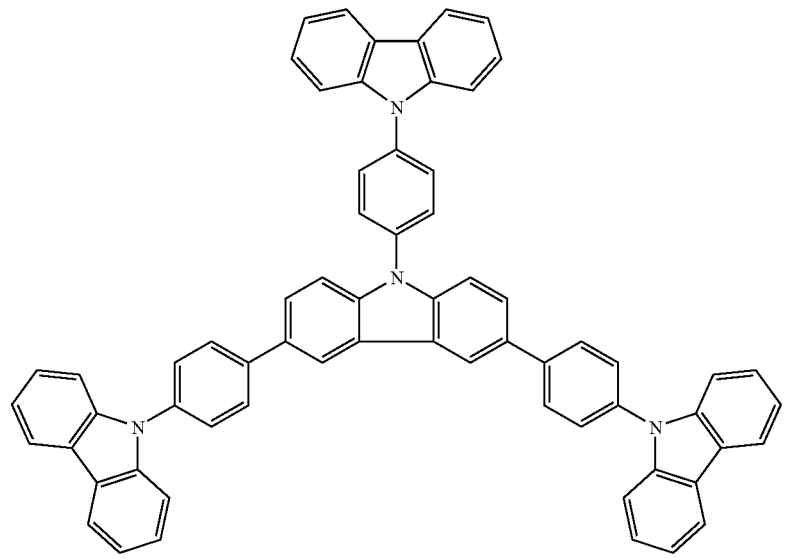

A hole transport layer 4 is disposed on the hole injection layer 3. The hole transport layer serves to accept holes from the hole injection layer and transport them to an organic light emitting layer 5 disposed thereon. The hole transport layer has high hole transportability and stability to holes. It also serves as a barrier to protect electrons. In addition to the above-mentioned basic requirements, when it is used in display devices for cars, for example, it is preferable that the materials for a hole transport layer have an improved heat resistance and a glass transition temperature (Tg) of 80° C. or higher. Materials satisfying such requirements include NPB, spyro-arylamine compounds, perylene-arylamine compounds, azacycloheptatriene compounds, bis(diphenylvinylphenyl)anthracene, silicon germanium oxide compounds, silicon-containing arylamine compounds, or the like.

Meanwhile, as an important organic single molecules for a hole transport layer, there is arylamine compounds having high hole transport rate and excellent electrical stability. In order to improve thermal stability of arylamine compounds, hole transport materials into which a naphthyl substituent or spyro group is introduced are reported (see, U.S. Pat. Nos. 5,554,459 and 5,840,217). In the beginning, N,N'-diphenyl-N,N'-bis(3-methylphenyl)-1,1'-diphenyl-4,4'-diamine (TPD) is frequently used as organic hole transport material. However, because TPD is unstable at a temperature of 60° C. or higher, N-naphthyl-N-phenyl-1,1'-diphenyl-4,4'-diamine (NPD) based materials or amine compounds substituted with a greater number of aromatic groups that have a higher glass transition temperature are used at the present time. Particularly, organic single molecules for use in a hole transport layer should have high hole transport rate. Additionally, because a hole transport layer is in contact with a light emitting layer and forms an interface therebetween, organic single materials for a hole transport layer should have an adequate ionization potential value of between that of a hole injection layer and that of a light emitting layer so as to inhibit the generation of exitons at the interface between hole transport layer and light emitting layer. Further, the organic single materials for a hole transport layer are required to control the electrons transported from the light emitting layer.

An organic light emitting layer 5 is disposed on the hole transport layer 4. The organic light emitting layer, which serves to emit lights by the recombination of holes and electrons injected from the anode and cathode, respectively, is formed of materials having high quantum efficiency.

Organic single molecules for use in a light emitting layer where light emission is accomplished by the recombination of holes and electrons are classified functionally into host materials and guest materials. In general, host materials or guest materials can accomplish light emission when used alone. However, host materials are doped with guest materials in order to solve the problems of low efficiency and luminance and the problem of self-packing of the same molecules that causes the excimer characteristics to come out in addition to the unique characteristics of each molecule.

More particularly, as green light emitting layer, 8-hydroxyquinoline aluminum salt (Alq3) is uniquely used and may be doped with high-quantum efficiency materials such as quinacridone or C545t so as to increase luminous efficiency. Organic materials for a blue light emitting layer have problems in that they have low melting points and low luminous stability at the initial time and that they have poor lifespan, compared to Alq3 as green light emitting material. Additionally, because most materials for a blue light emitting layer represent a light blue color rather than pure blue color, they are not suitable for full-color version displays, and so, they are also doped with perylene or distryl amines (DSA) to increase luminous efficiency. Typical organic materials for a blue light emitting layer include aromatic hydrocarbons, spyro-type compounds, aluminum-containing organometallic compounds, heterocyclic compounds having an imidazole group, fused aromatic compounds, as disclosed in U.S. Pat. Nos. 5,516,577, 5,366,811, 5,840,217, 5,150,006 and 5,645, 948. Meanwhile, in the case of a red light emitting layer, a large amount of green light emitting material doped with a small amount of red light emitting material is used due to the characteristically narrow band gap of red light emission. However, such materials have structural problems disturbing the improvement of lifespan.

An electron transport layer 6 is disposed on the organic light emitting layer 5. In the electron transport layer 6, such materials as having high electron injection efficiency from a cathode 7 (a second electrode) and capable of transporting the injected electrons efficiently are used. For satisfying this, the materials should have high electron affinity and electron moving rate and excellent stability to electrons. Materials that meet the above requirements include: aromatic compounds such as tetraphenylbutadiene (Japanese Laid-Open Patent No. Sho57-51781), metal complexes such as 8-hydroxyquinoline aluminum (Japanese Laid-Open Patent No. Sho59-194393), metal complexes of 10-hydroxybenzo[h] quinoline (Japanese Laid-Open Patent No. Hei6-322362), cyclopentadiene derivatives (Japanese Laid-Open Patent No. Hei2-289675), bisstyrylbenzene derivatives (Japanese Laid-Open Patent Nos. Hei1-245087 and Hei2-222484), perylene derivatives (Japanese Laid-Open Patent Nos. Hei2-189890 and Hei3-791), p-phenylene derivatives (Japanese Laid-Open Patent Nos. Hei3-33183 and Hei11-345686), oxazole derivatives, or the like.

Additionally, preferred organic single molecules for use in an electron transport layer include organometal complexes having relatively high stability to electrons and high electron moving rate. Particularly, it is reported that Alq3 is the most preferred, because it has excellent stability and high electron affinity. In addition to the above-mentioned materials, other electron transport materials known to one skilled in the art include Flavon or silol series available from Chisso Corporation.

There is no especially preferred candidate other than the above materials for use in the electron transport layer. Generally, electron transport materials are used in the form of a mixture with metals for use in cathodes. Otherwise, inorganic materials such as lithium fluoride (LiF) may be used.

The cathode 7 serves to inject electrons to the organic light emitting layer 5. As materials for the cathode, the materials used in the anode 2 may be used. However, it is preferable to use metals having low work function in order to inject electrons more efficiently. Particular examples of the metals include lithium, cesium, sodium, tin, magnesium, indium, calcium, aluminum, etc., and alloys thereof.

However, the organic electroluminescence display device using organic single molecules suitable for each of the layers forming the device generally has short life span and has problems that it provides poor shelf durability and reliability. It is thought that such problems result from physical, chemical, photochemical and electrochemical changes in organic materials, oxidation of cathode, interlayer separation, and melting, crystallization and pyrolysis of organic compounds.

BRIEF DESCRIPTION OF THE DRAWINGS

FIG. 1 is a sectional view showing the structure of a conventional organic electroluminescence device.

BRIEF DESCRIPTION OF INDICATION NUMBERS

1: substrate
2: anode
3: hole injection layer
4: hole transport layer
5: organic light emitting layer
6: electron transport layer
7: cathode

DISCLOSURE OF THE INVENTION

As described above, conventional hole injection materials including organometal complexes such as CuPC, arylamine compounds and carbazole group-containing materials have problems in that they have a difficulty in realizing full color and show poor stability.

The present inventors have synthesized novel organic compounds containing a carbazole group, represented by the following formula 1. And They have found that the above novel compounds can provide significantly improved efficiency, lifespan and thermal stability of an organic light emitting device, when used as hole injection and transport materials. The present invention is based on such findings.

As described above, it is possible to realize desired color in an organic electroluminescence device by modifying the structure of a suitable organic single molecule. In this regard, various high-efficiency organic electroluminescence devices are provided by using host-guest systems. However, such devices show insufficient luminance characteristics, lifespan and durability for practical use. Therefore, the present invention has been made in view of the above-mentioned problems. It is an object of the present invention to provide a novel material for hole injection and hole transport layer, which can improve luminous efficiency, stability and lifespan of an organic electroluminescence device, and to provide an organic electroluminescence device using the same material.

It is another object of the present invention to provide a material having high glass transition temperature, excellent thermal stability and sublimation property needed for vacuum vapor deposition processes.

According to an aspect of the present invention, there are provided an organic compound represented by the following formula 1 and an organic electroluminescence device comprising the same compound in an organic compound layer:

[formula 1]

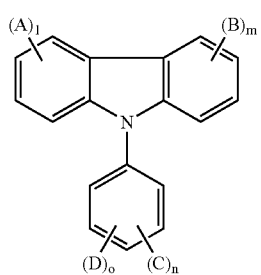

wherein A is

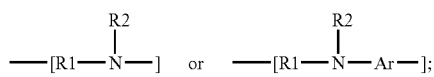

B is

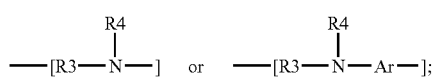

C is

D is,

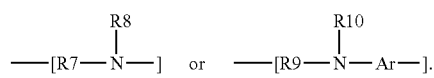

In the above formula, R1 to R10 are the same or different, and preferably each comprises, only once or repeatedly at least two times, at least one selected from the group consisting of a hydrogen atom; aliphatic hydrocarbon having 1-20 carbon atoms; aromatic hydrocarbon non-substituted or substituted with a nitro, nitrile, halogen, alkyl, alkoxy or amino group; silicon group having an aromatic substituent; heterocyclic aromatic hydrocarbon non-substituted or substituted with a nitro, nitrile, halogen, alkyl, alkoxy or amino group; thiophene group substituted with a C1-C20 hydrocarbon or C6-C24 aromatic hydrocarbon; and a boron group substituted with an aromatic hydrocarbon, and Ar is an aromatic hydrocarbon non-substituted or substituted with a nitro, nitrile, halogen, alkyl, alkoxy or amino group.

In the above formula, each of l, m and n is an integer of 1 or more and o is an integer of 0 or more, preferably, l, m and n represent 1 at the same time, and o is 0, with the proviso that the compound represented by formula 1 wherein R1, R2, R3, R4, R5 and R6 represent hydrogen atoms simultaneously and D is also a hydrogen atom is excluded.

The above aromatic hydrocarbon includes monocyclic aromatic rings such as phenyl, biphenyl and terphenyl and multicyclic aromatic rings such as naphthyl, anthracenyl, phenanthracene, pyrenyl and perylenyl or the like. Additionally, the above heteroaromatic hydrocarbon includes thiophene, furan, pyrrole, imidazole, thiazole, oxazole, oxadiazole, thiadiazole, triazole, pyridyl, pyridazyl, pyrazine, quinoline, isoquinoline, etc.

Preferably, the compound represented by the above formula 1 may be a compound represented by any one formula selectd from the following formulae 2a-2e:

[formula 2a]

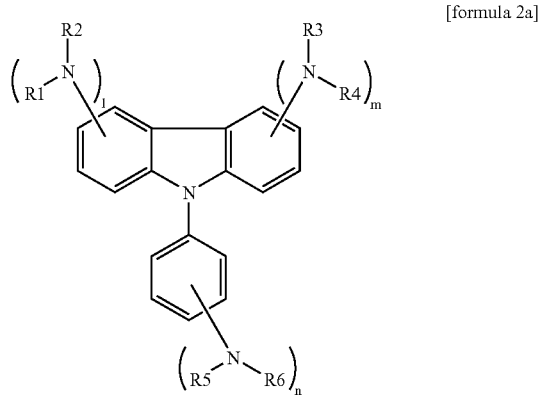

[formula 2b]
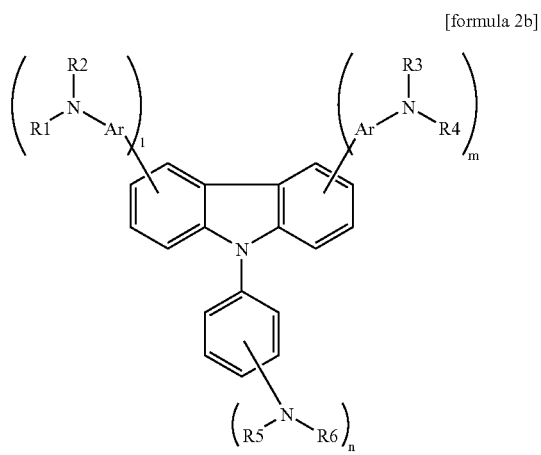
[formula 2c]
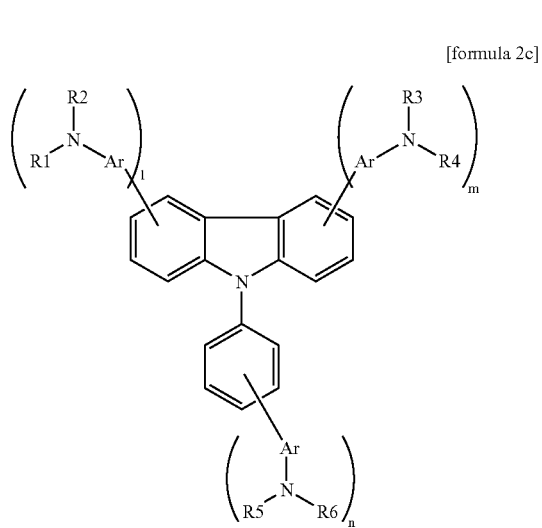
[formula 2d]
[formula 2e]
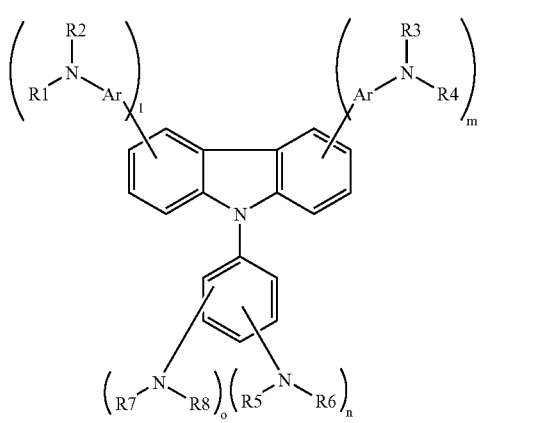
More preferably, the compound represented by the above formula 1 may be a compound represented by any one formula selected from the following formulae 3a-3n:
[formula 3a]
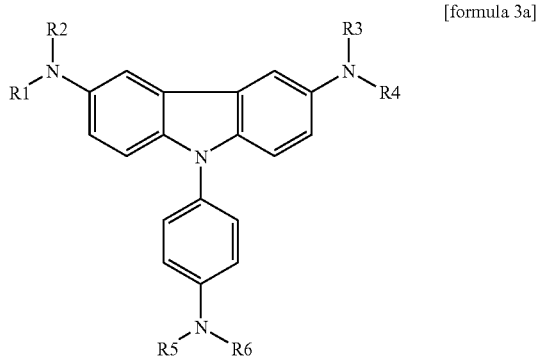
[formula 3b]
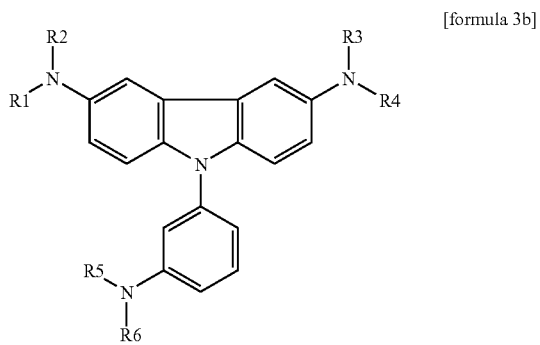
[formula 3c]
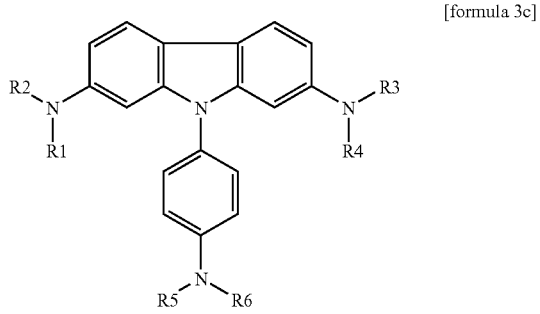

[formula 3d]
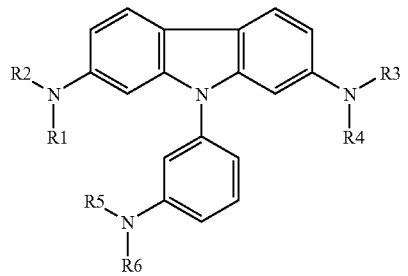
[formula 3e]
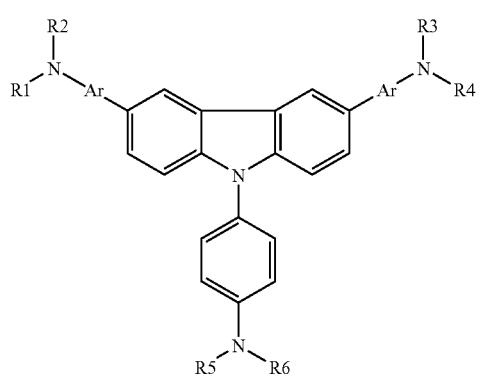
[formula 3f]
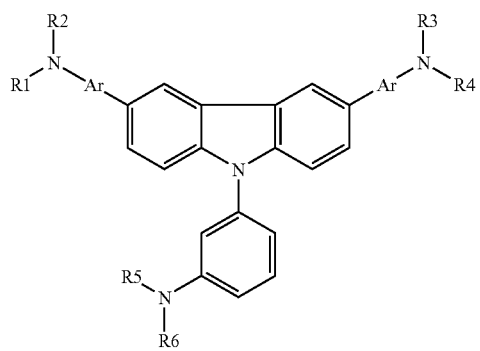
[formula 3g]
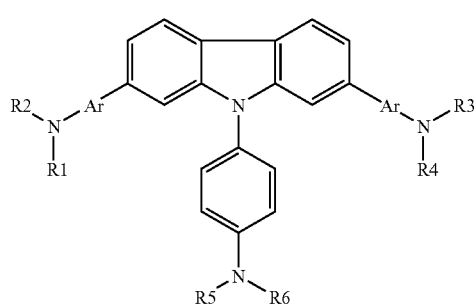
[formula 3h]
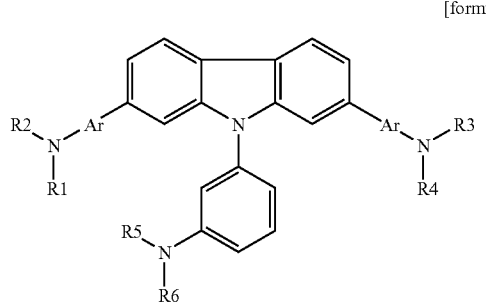
[formula 3i]
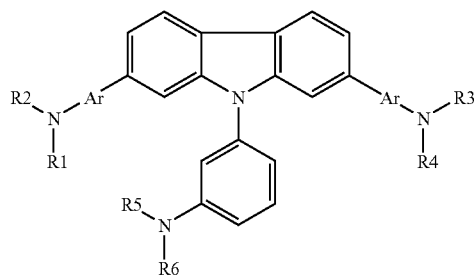
[formula 3j]
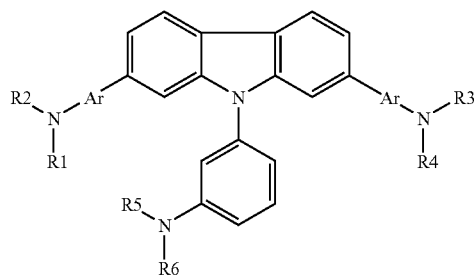
[formula 3k]
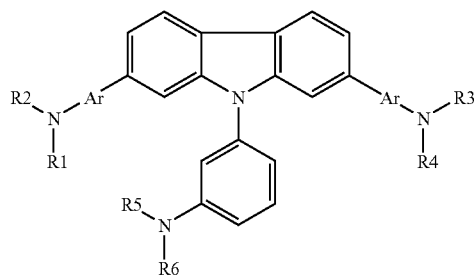

-continued

[formula 3l]

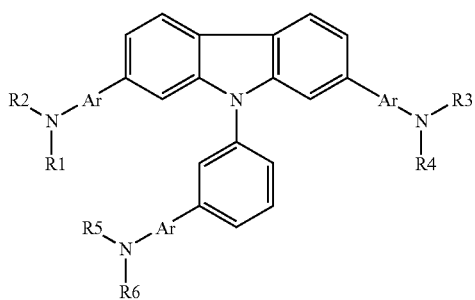

[formula 3m]

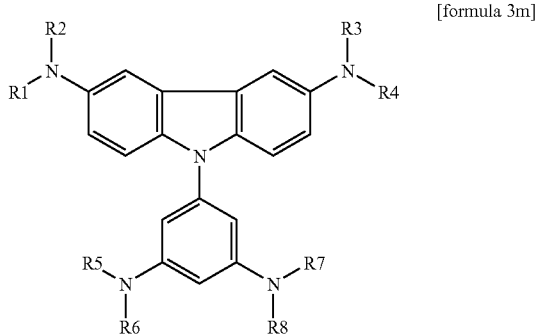

[formula 3n]

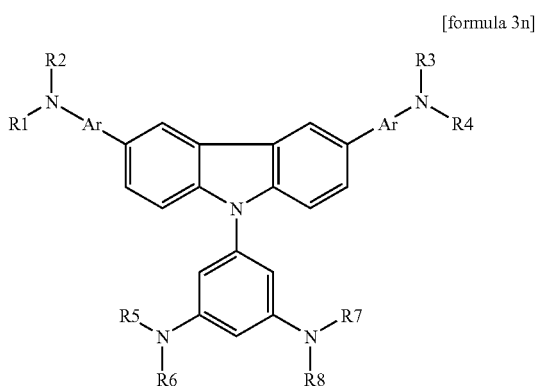

In the above formulae 2a-2e and 3a-3n, each of R1-R8 is the same as defined with regard to the above formula 1.

Hereinafter, the present invention will be described in more detail.

The organic compounds represented by the formula of 1, 2 or 3 are capable of serving as hole injection and hole transport materials, and thus can be used in at least one layer selected from a hole injection layer, hole transport layer and a light emitting layer in an organic light emitting device.

Particularly, each of the compounds comprises a carbazole group and accepts and transports holes with ease. It is thought that such functions result from the cyclic structure present in the carbazole group and the presence of an aryl group bonded to the carbazole group. Therefore, an organic material layer comprising the above compound may be used as a hole injection layer or hole transport layer. Additionally, the organic material layer may be used as a light emitting layer where holes and electrons are recombined to accomplish light emission. In other words, the compound according to the present invention can perform at least one function selected from the group consisting of hole injection, hole transport and light emission. Similarly, the layer comprising the above compound in an organic light emitting device can serve as at least one selected from the group consisting of a hole injection layer, hole transport layer and a light emitting layer. Additionally, the layer comprising the above compound can be used as a hole injection/hole transport layer, hole injection/hole transport/light emitting layer, etc.

More particularly, it is thought that the compound may accept and transport holes stably and safely by virtue of the aryl group of the carbazole group or the aryl group bonded to the carbazole group as a substituent and the carbazole group itself. In addition, the substituent bonded to the carbazole group is derived from an amine group. Such substituents maintain the movement of holes and the structure of the compound according to the present invention in a stable state, while not disturbing the flow of holes. Therefore, the organic light emitting device comprising the compound shows excellent stability and improved lifespan.

In addition, the substituents of the compound according to the present invention, i.e., R1-R10 may represent any other substituents than the groups as defined above, as long as the compound having substituents corresponding to R1-R10 can perform a desired function as an organic material layer in an organic light emitting device. For example, when R1-R10 represent alkyl groups or alkyl-substituted substituents, there is no limitation in the length of each alkyl group. Because the length of an alkyl group included in the compound does not affect the conjugation length of the compound, it has no direct effect on the wavelength of the compound or on the characteristics of a device. However, the length of an alkyl group may affect the selection of a method of applying the compound to an organic light emitting device, for example, a vacuum deposition method or a solution coating method. Therefore, there is no particular limitation in length of alkyl groups that may be included in the compound represented by the above formulae.

With regard to R1-R10 in the above formulae, particular examples of the aromatic compound include monocyclic aromatic rings such as phenyl, biphenyl, terphenyl, etc., and multicyclic aromatic rings such as naphthyl, anthracenyl, pyrenyl, perylenyl, etc. Particular examples of the heteroaromatic compound include thiophene, furan, pyrrole, imidazole, thiazole, oxazole, oxadiazole, thiadiazole, triazole, pyridyl, pyridazyl, pyrazine, quinoline, isoquinoline, etc.

The aliphatic hydrocarbon having 1-20 carbon atoms includes both linear aliphatic hydrocarbons and branched aliphatic hydrocarbons. Particular examples of such hydrocarbons include alkyl groups such as methyl, ethyl, n-propyl, iso-propyl, n-butyl, sec-butyl, iso-butyl, tert-butyl, pentyl, hexyl, etc.; alkenyl groups having a double bond, such as styryl; and alkynyl groups having a triple bond, such as acetylene.

Non-limiting examples of the compound according to the present invention include the compounds represented by the following formulae 28-260.

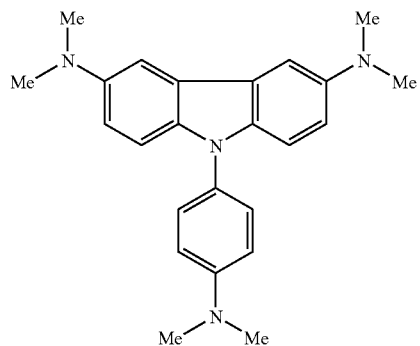
formula 28
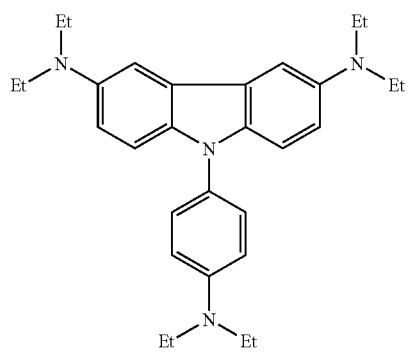
formula 29
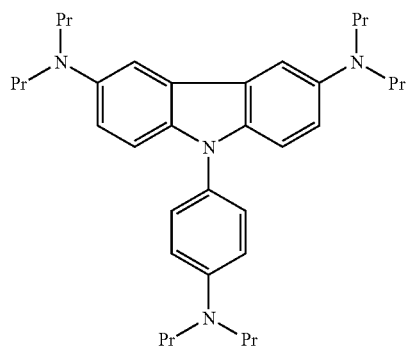
formula 30
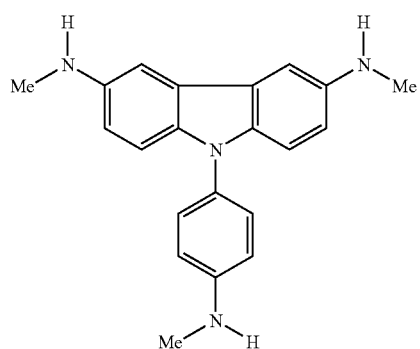
formula 31

-continued
formula 32
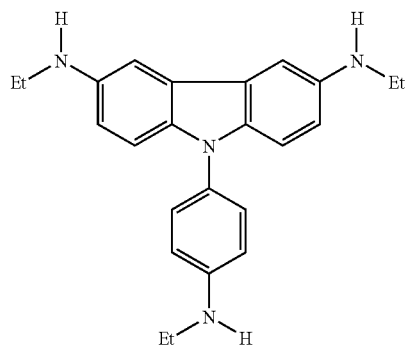
formula 33
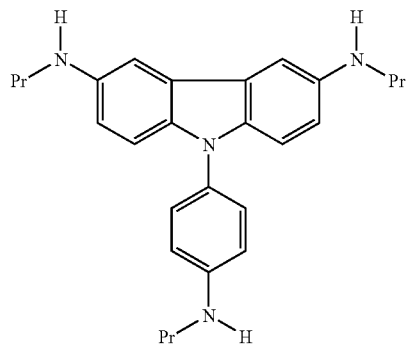
formula 34
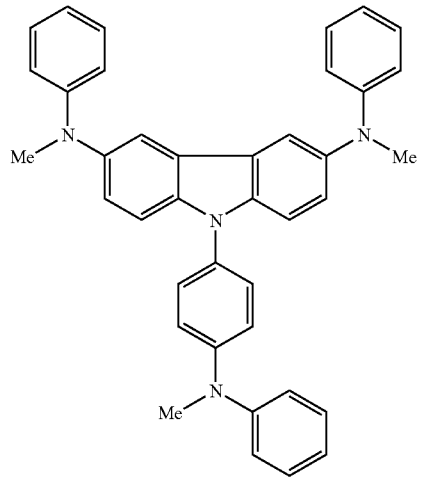
formula 35
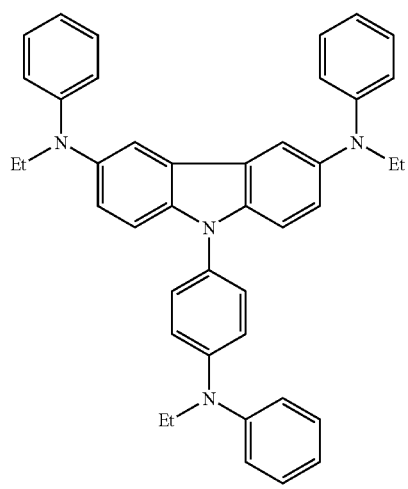

-continued
formula 36
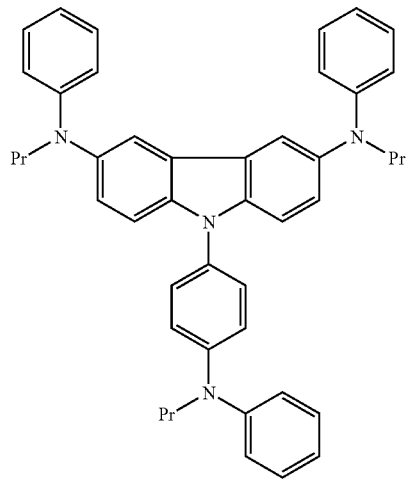
formula 37
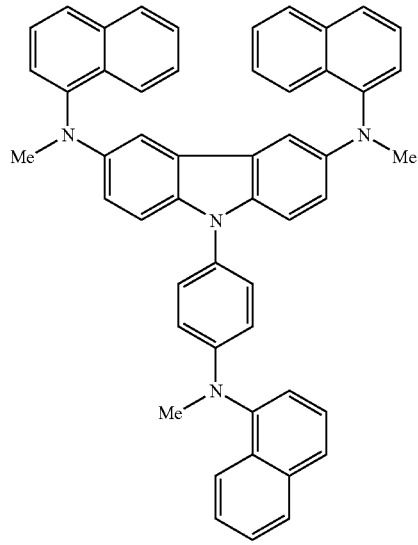
formula 38
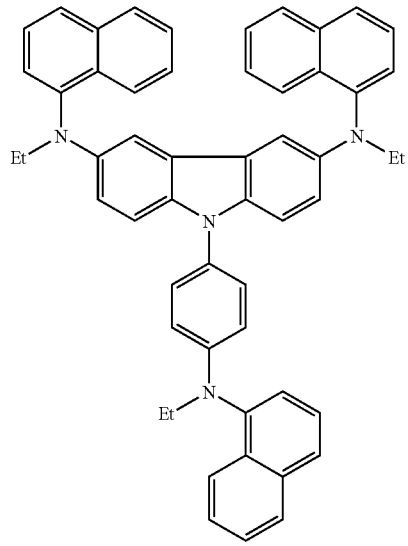

-continued
formula 39
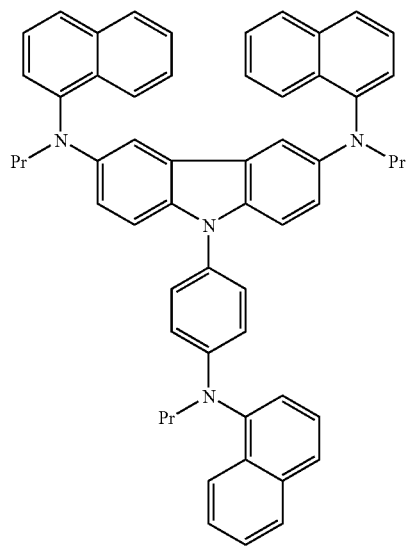
formula 40
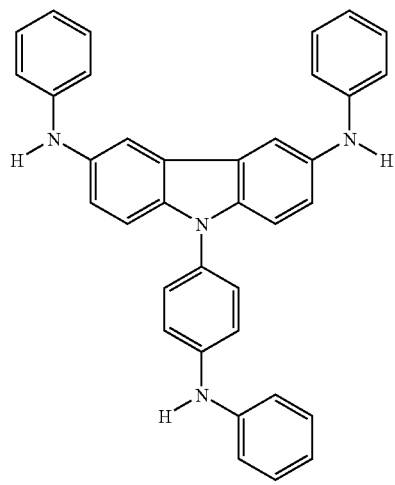
formula 41
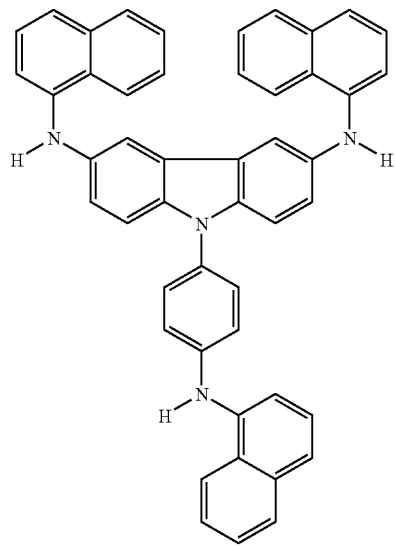

-continued
formula 42
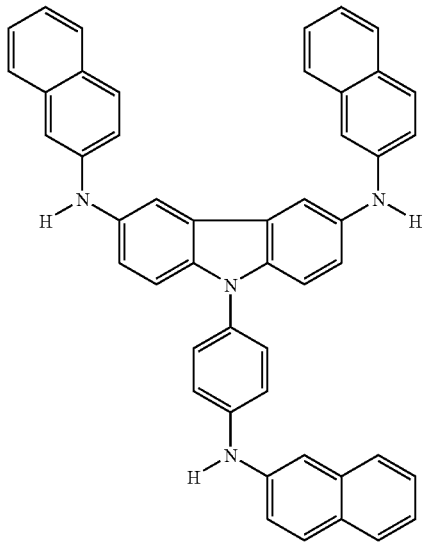
formula 43
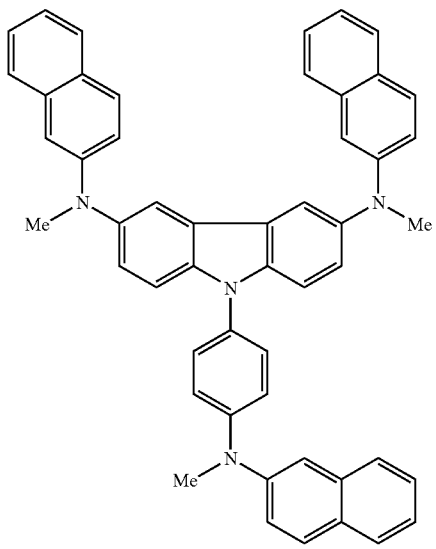
formula 44
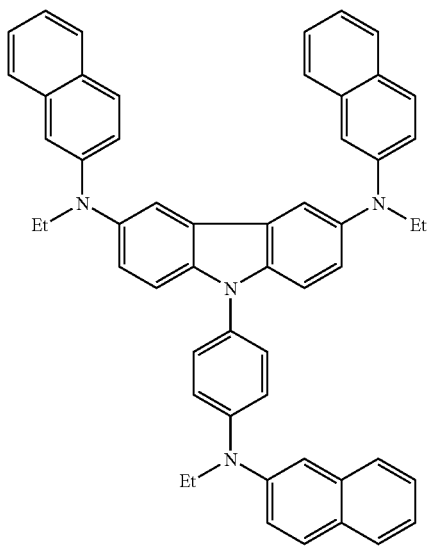

formula 45
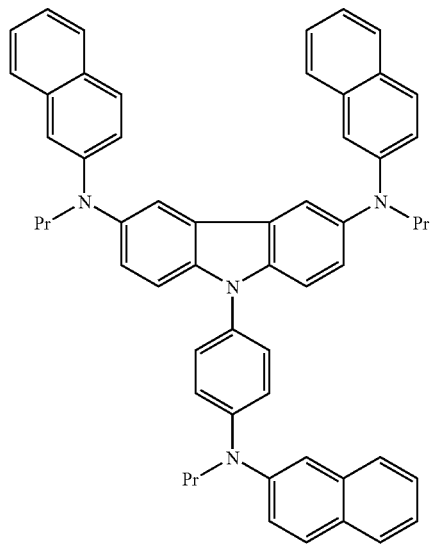
formula 46
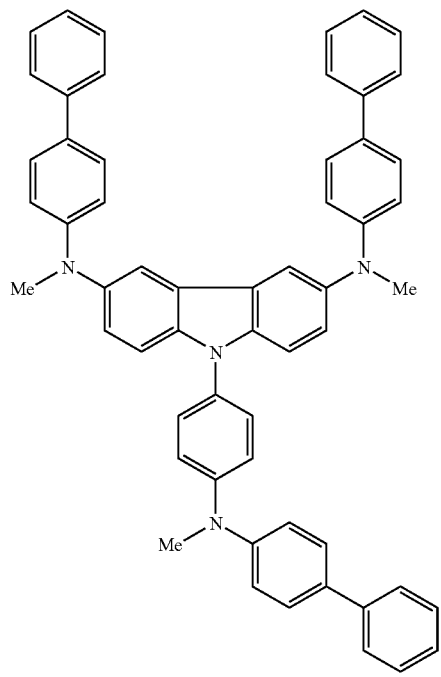

-continued
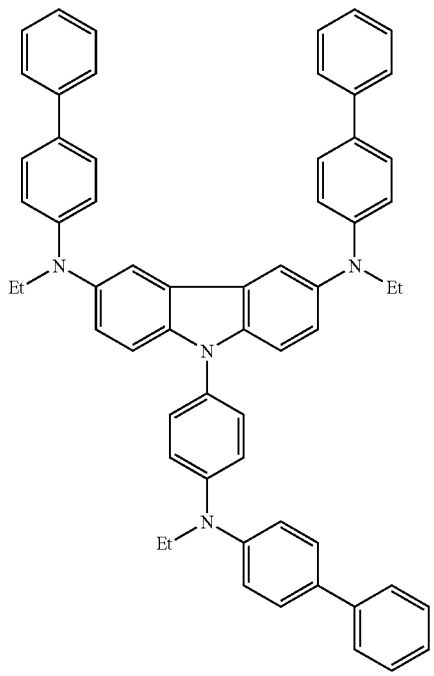
formula 47
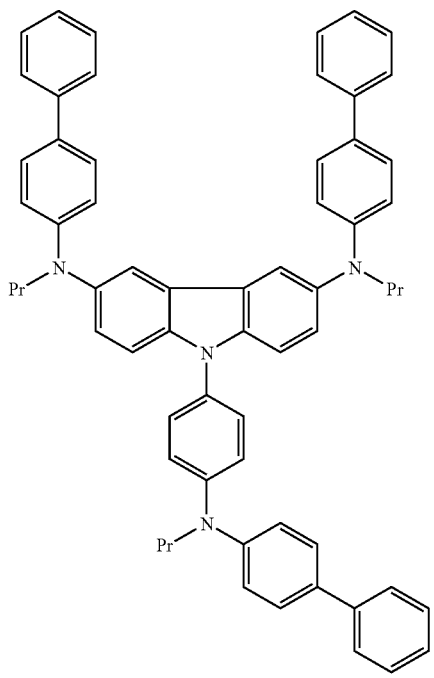
formula 48 formula 49
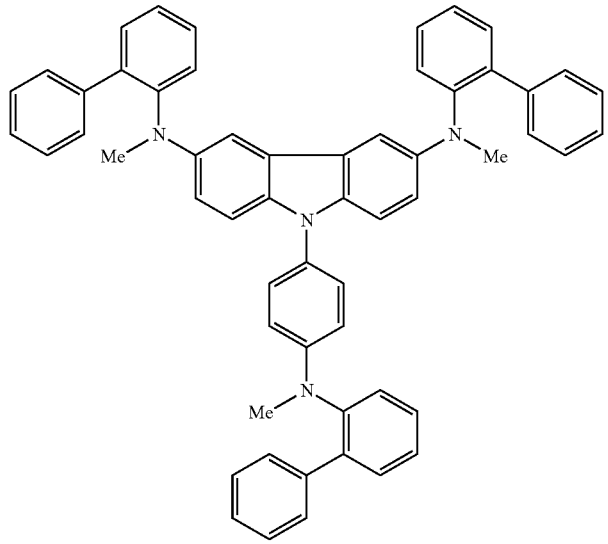
formula 50
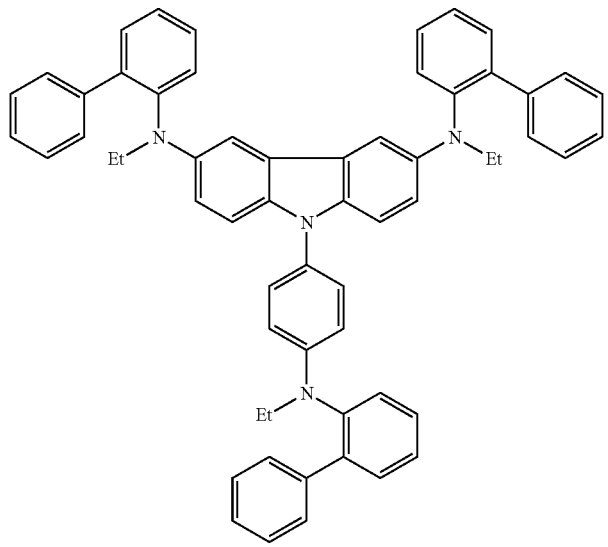
formula 51
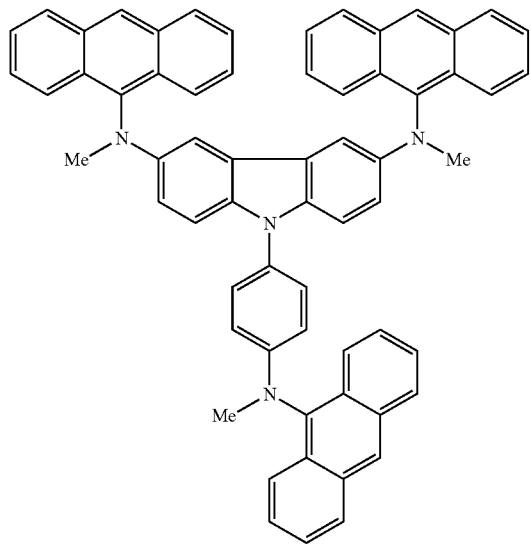

-continued
formula 52
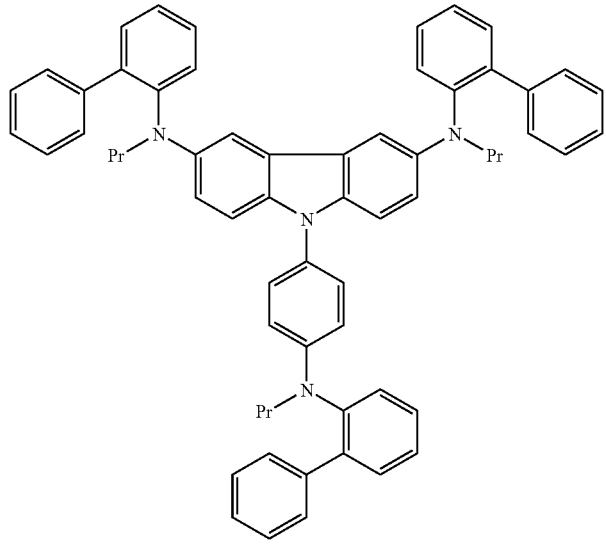
formula 53
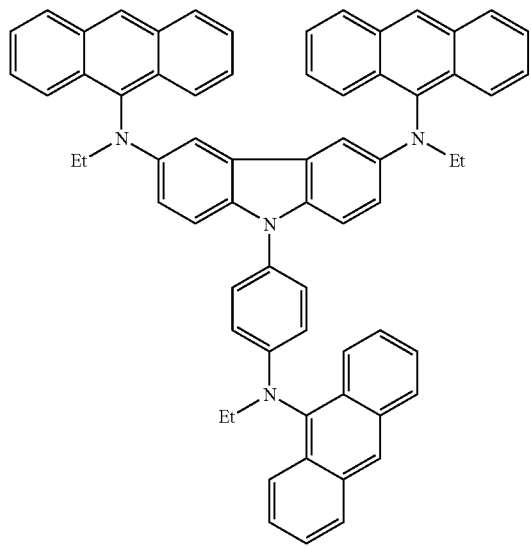
formula 54
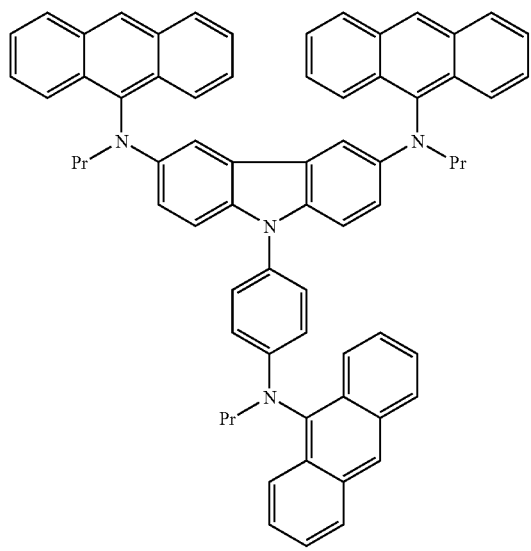

formula 55
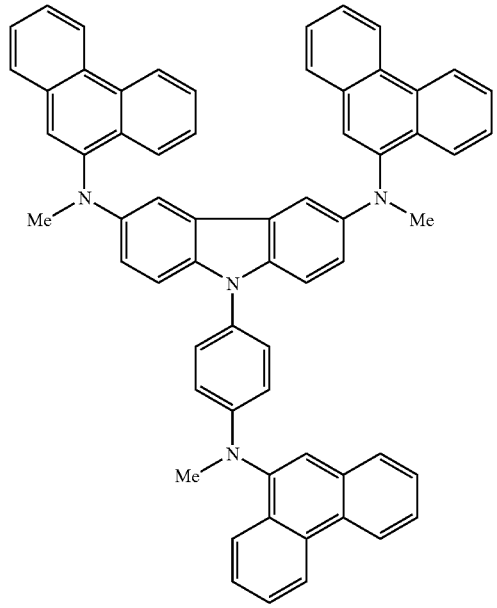
formula 56
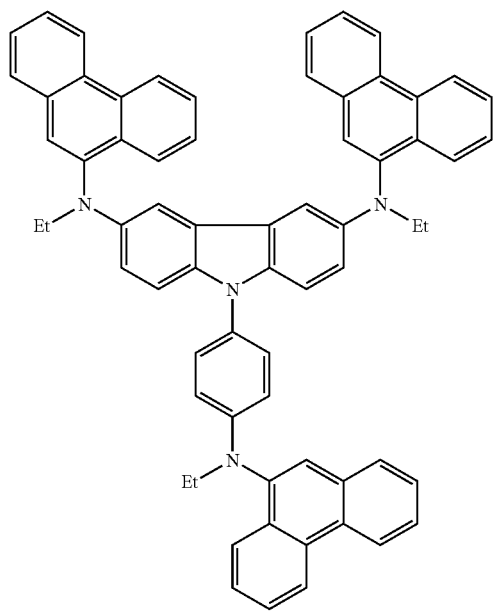

formula 57
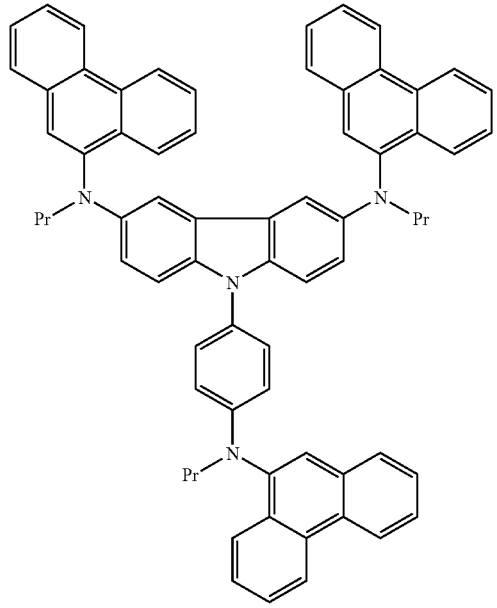
formula 58
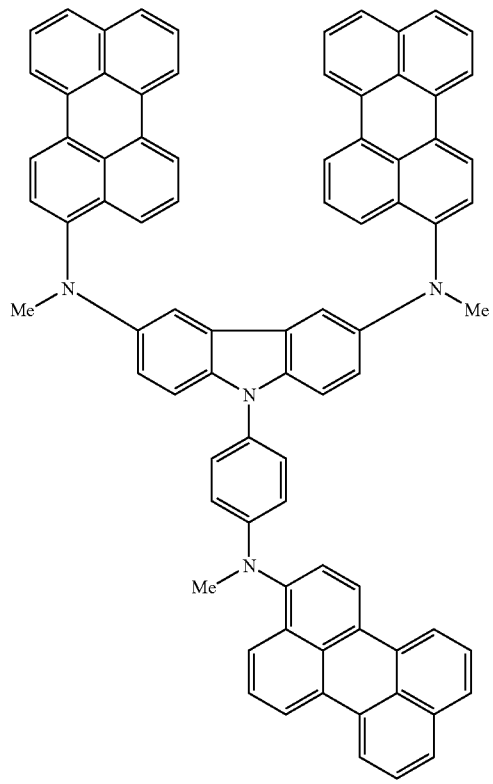

formula 59
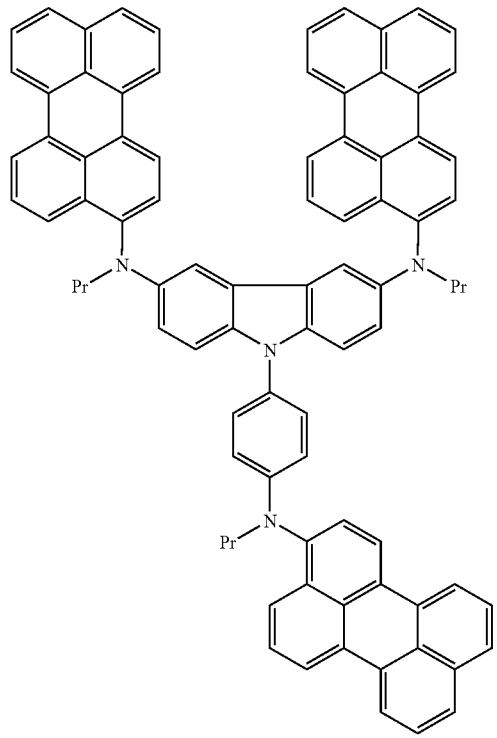
formula 60
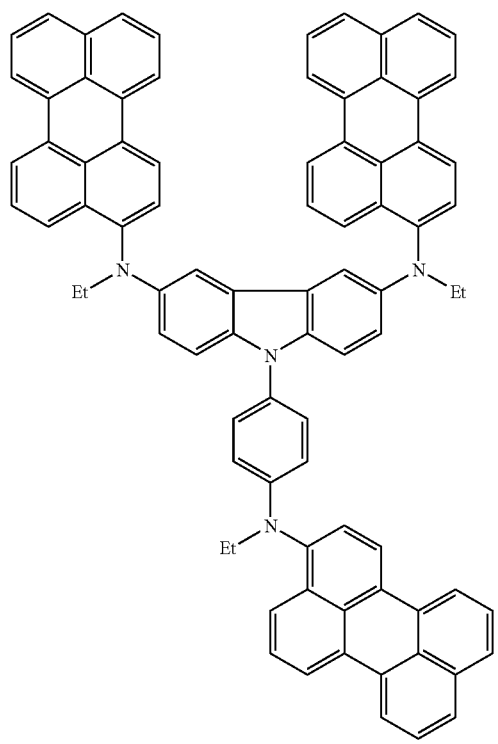

-continued
formula 61
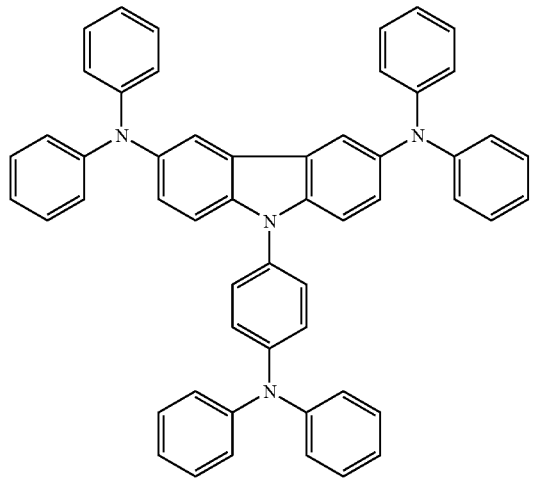
formula 62
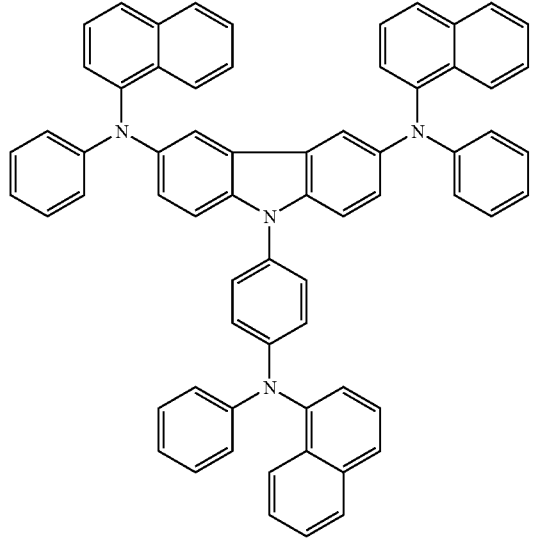
formula 63
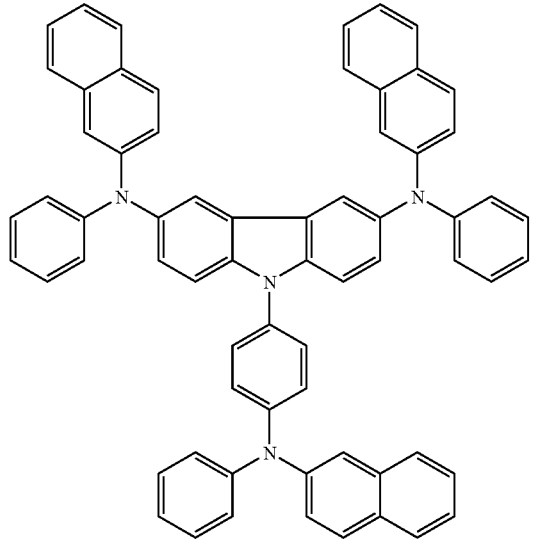

-continued
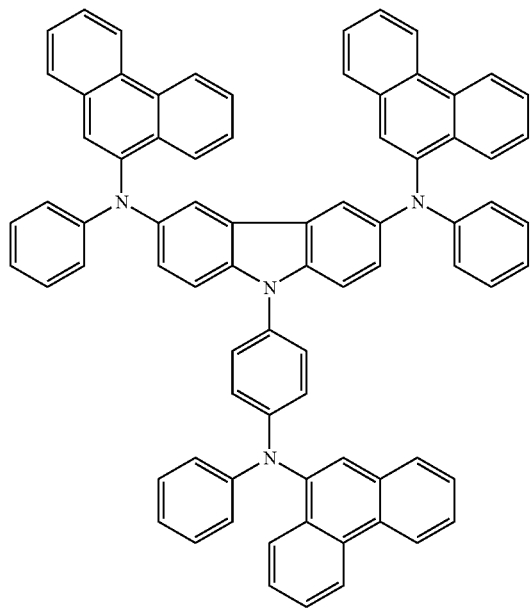
formula 64
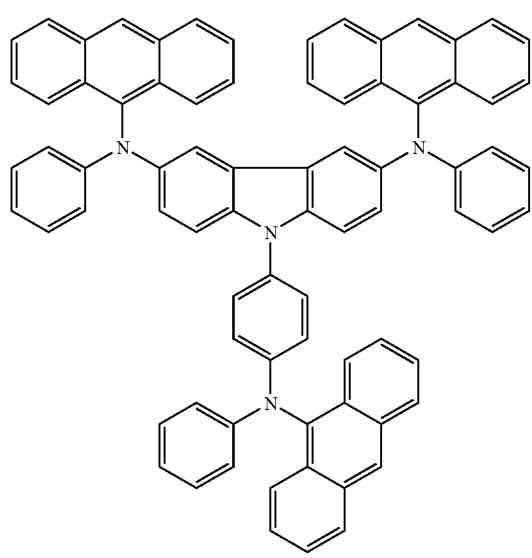
formula 65 formula 66
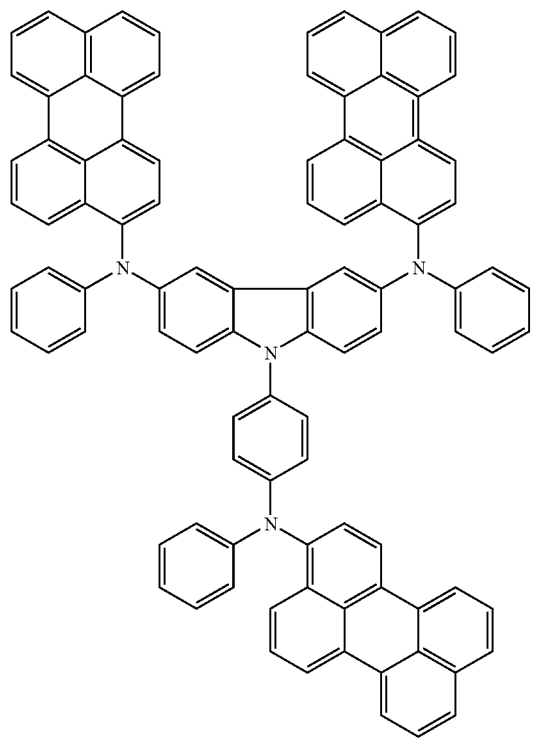
formula 67
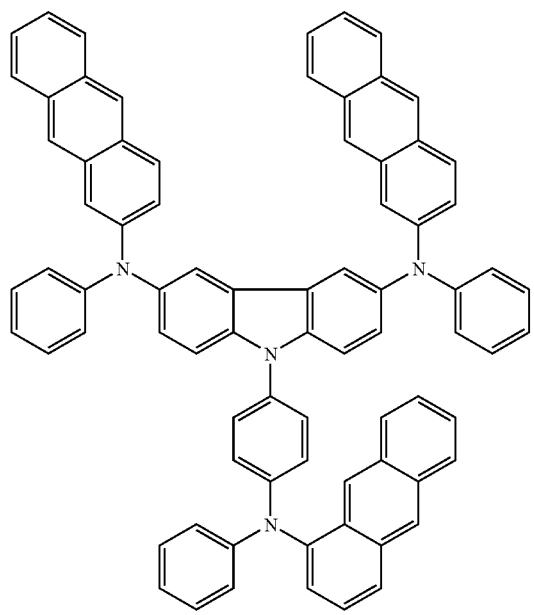

formula 68
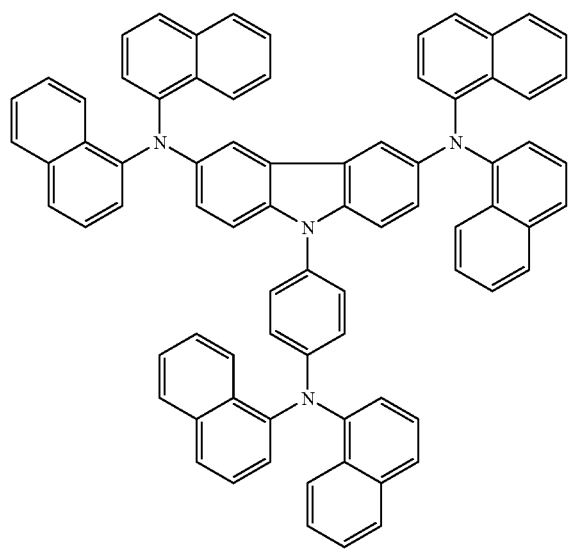
formula 69
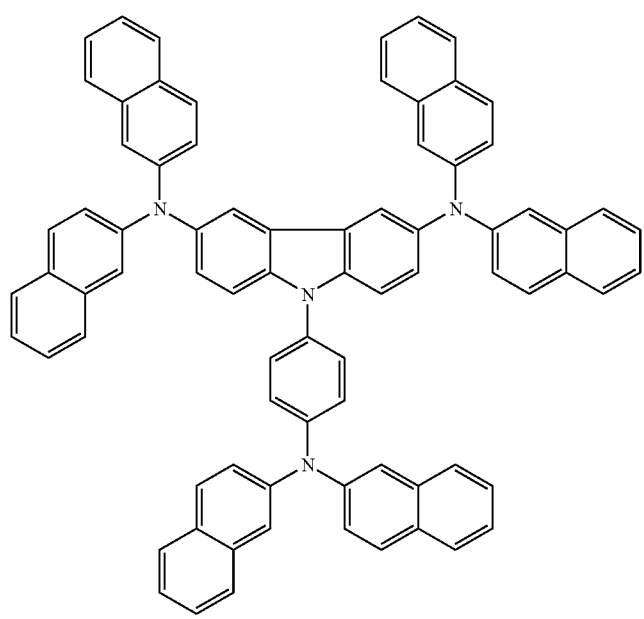

-continued
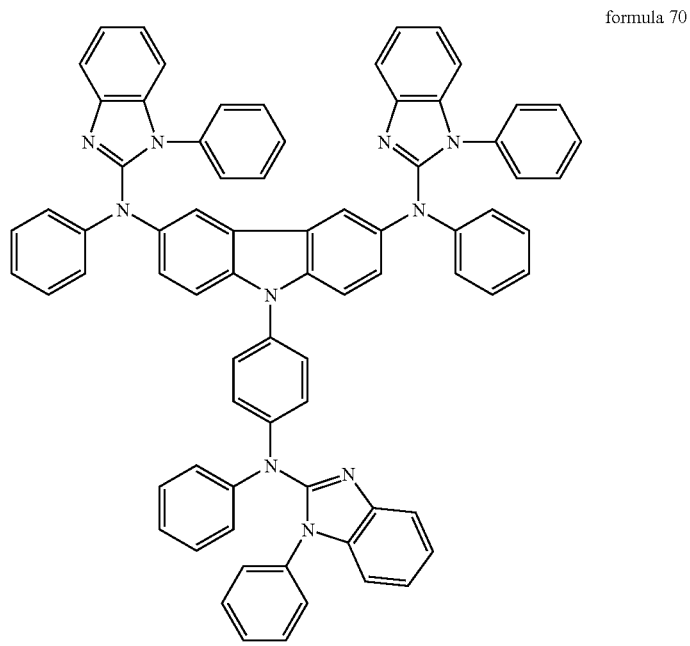
formula 70
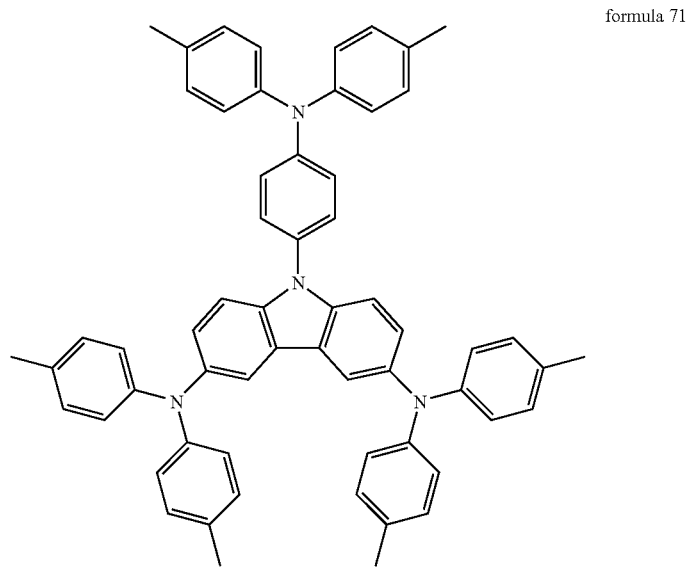
formula 71

-continued
formula 72
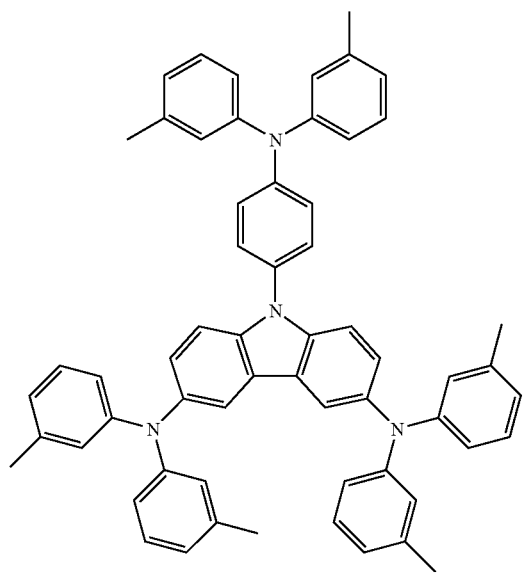
formula 73
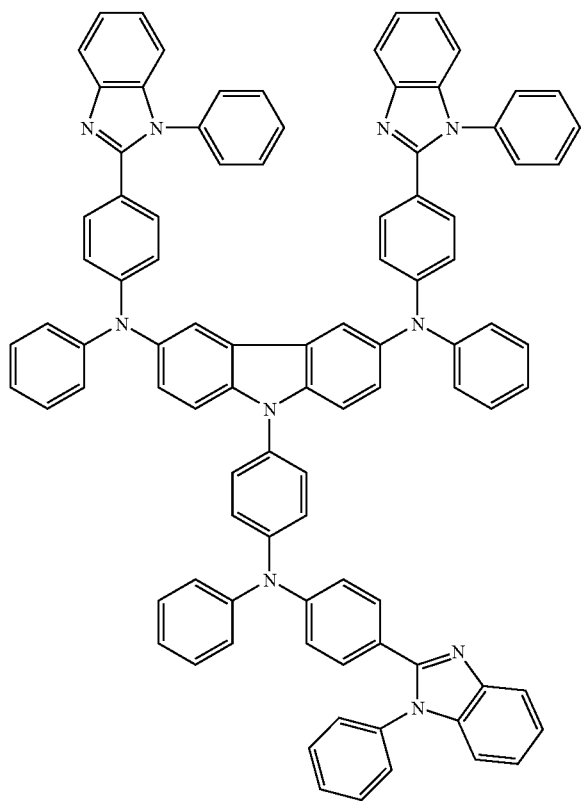

formula 74
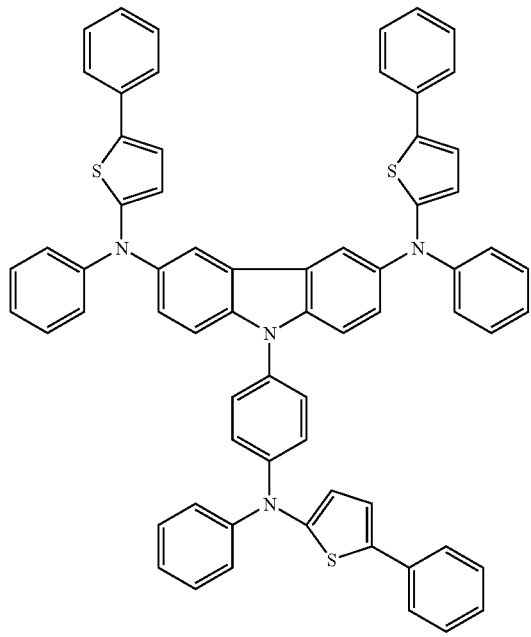
formula 75
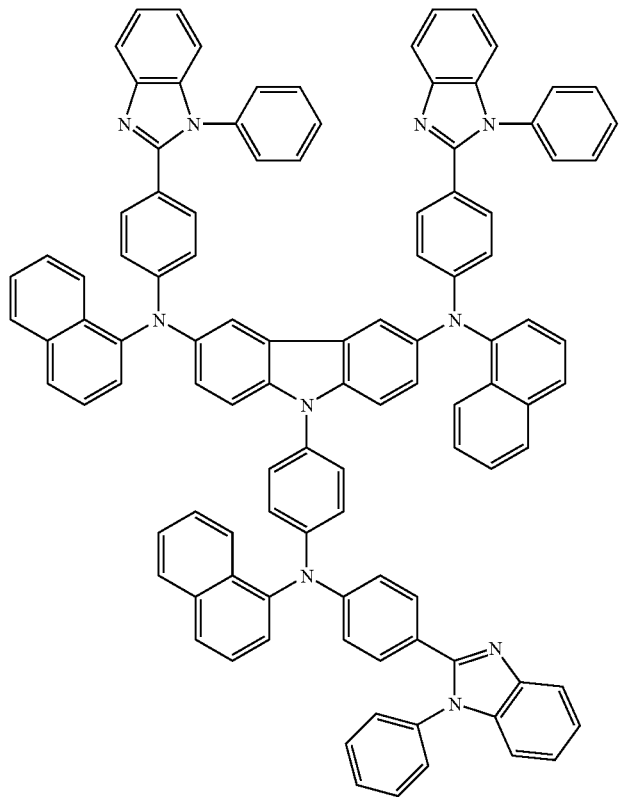

formula 76
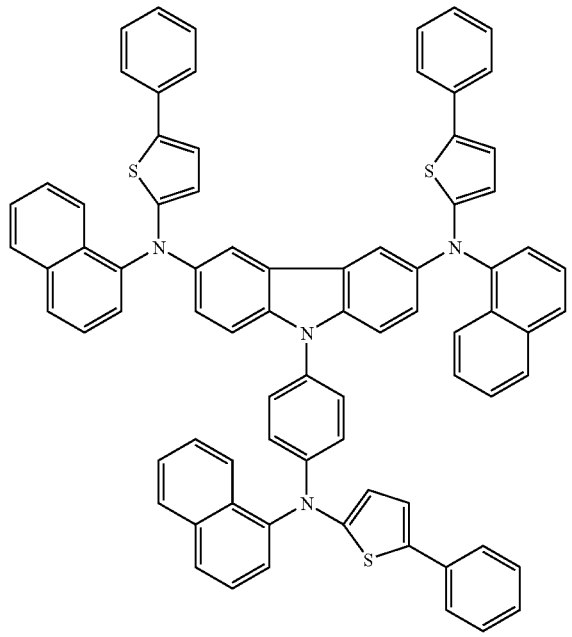
formula 77
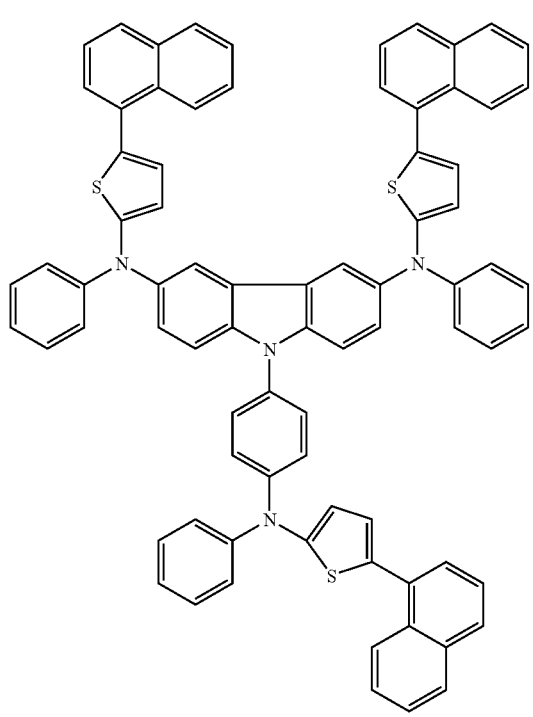

-continued
formula 78
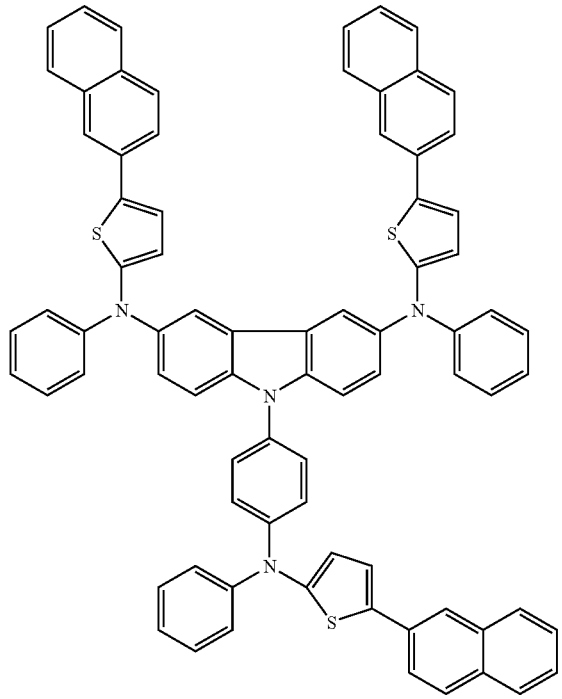
formula 79
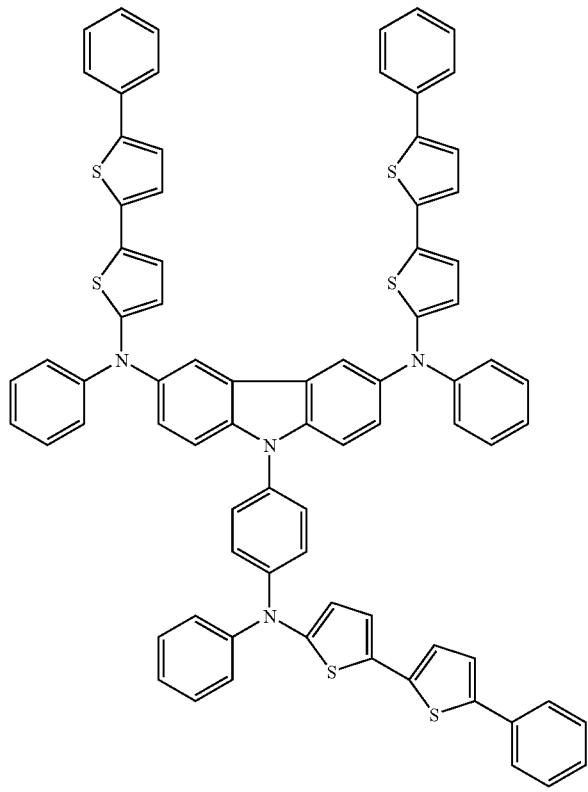

-continued
formula 80
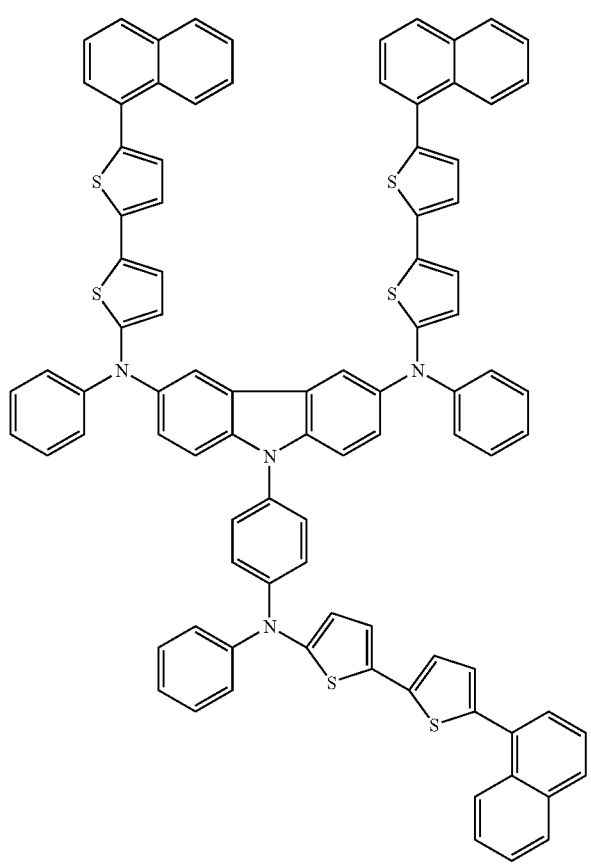
formula 81
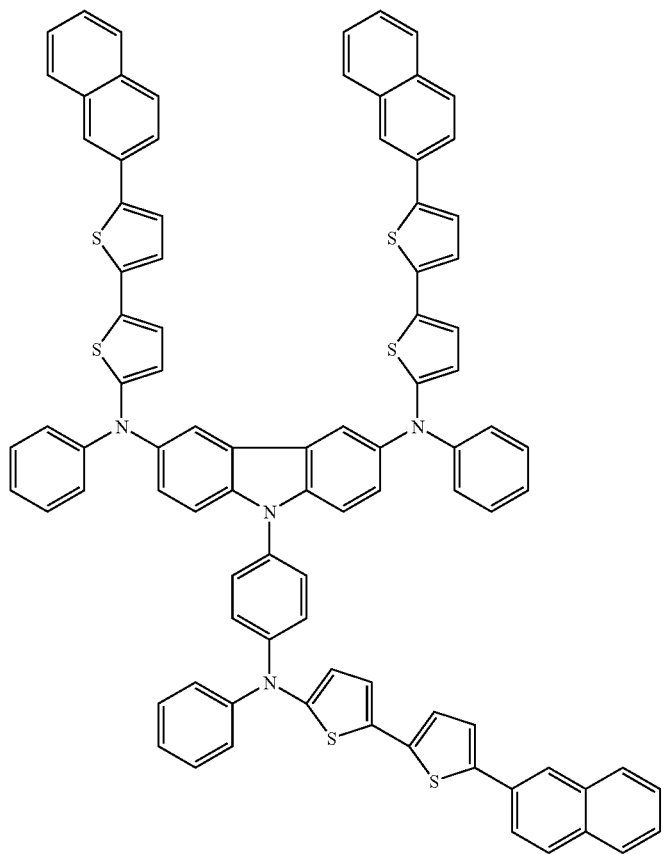

formula 82
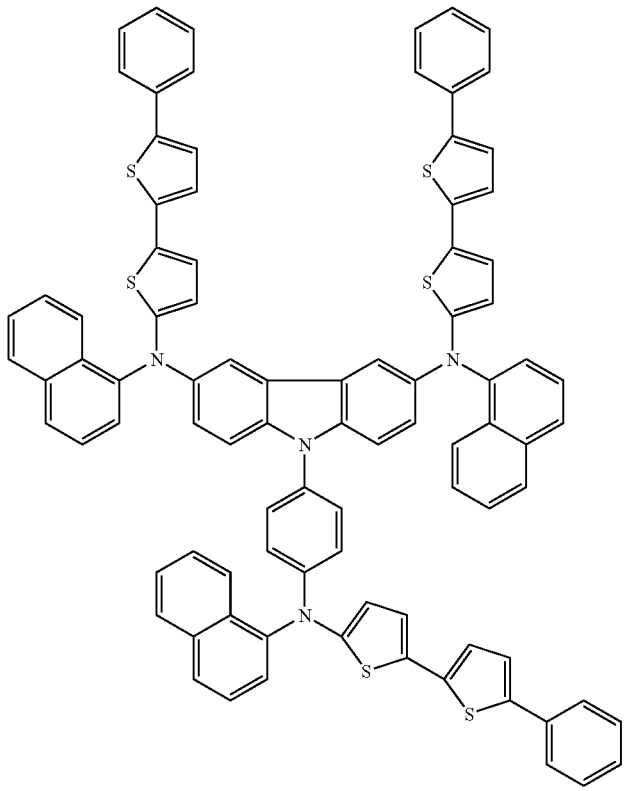
formula 83
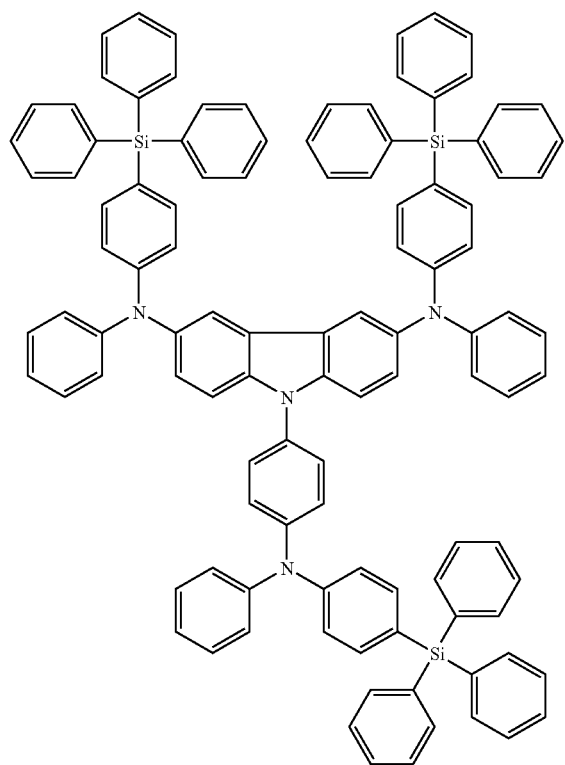

-continued
formula 84
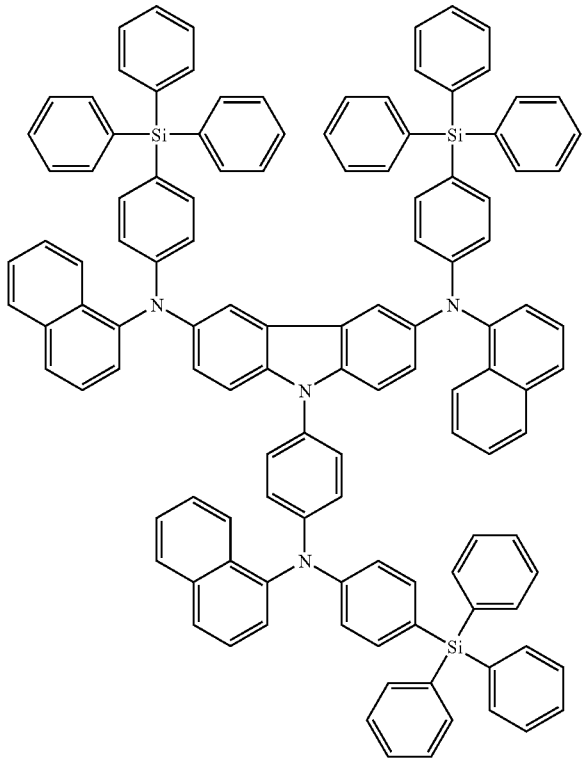
formula 85
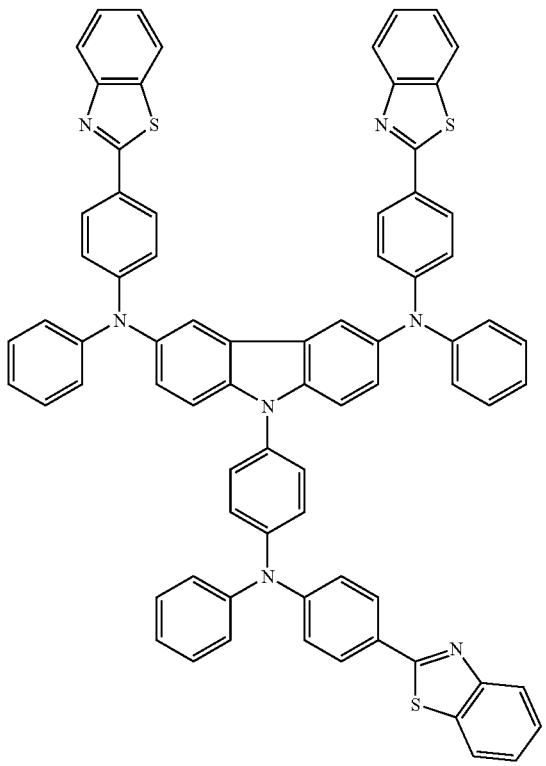

formula 86
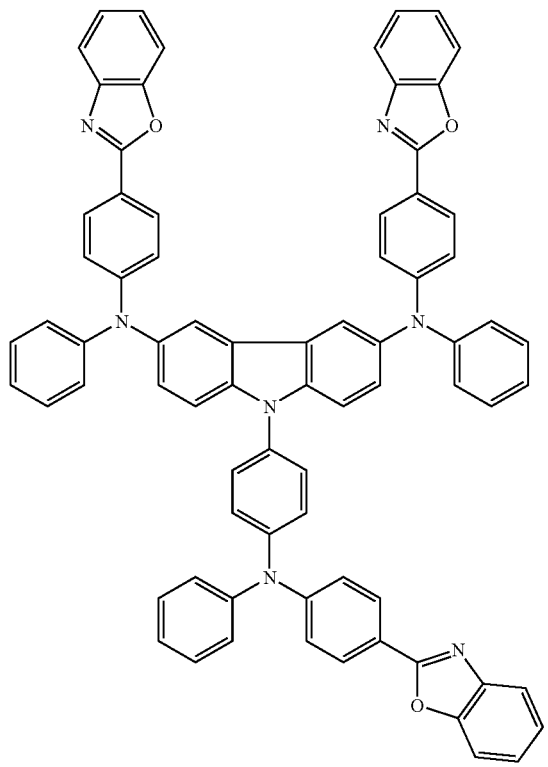
formula 87
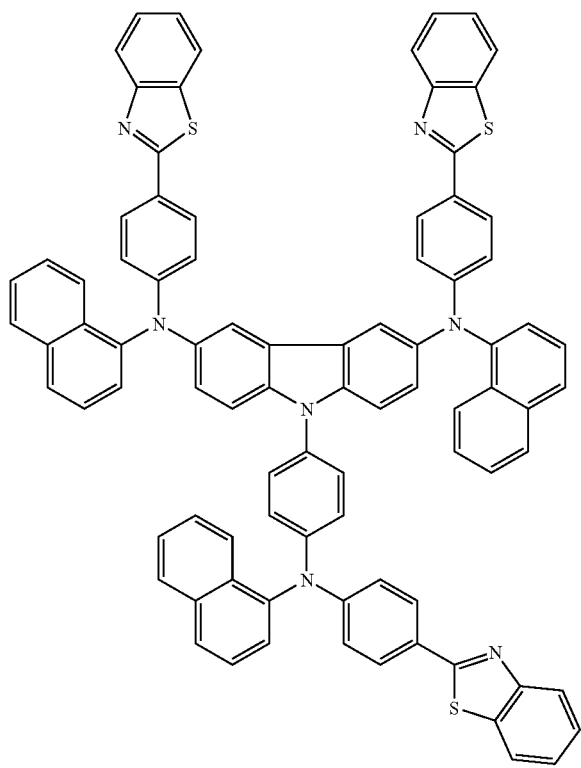

formula 88
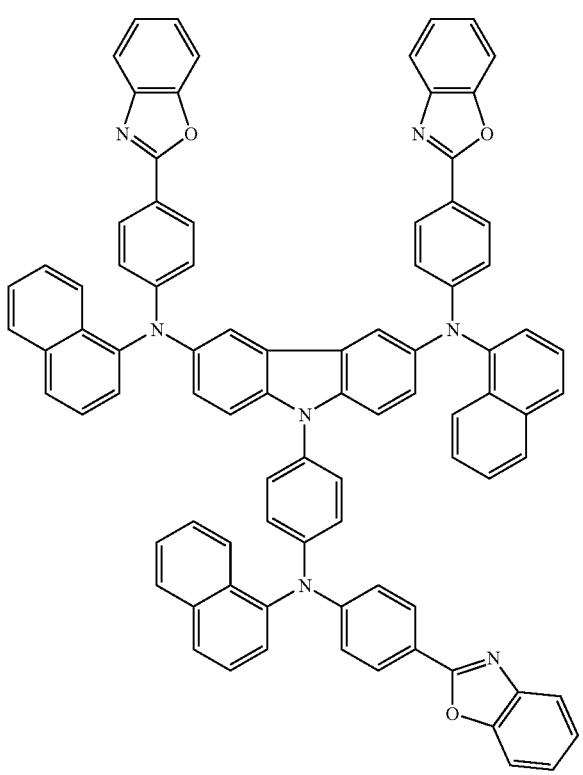
formula 89
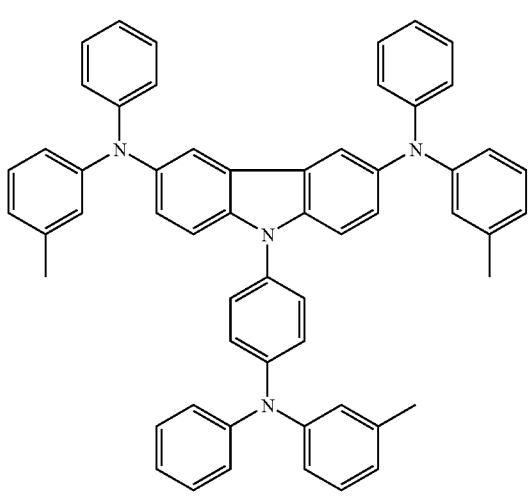

-continued
formula 90
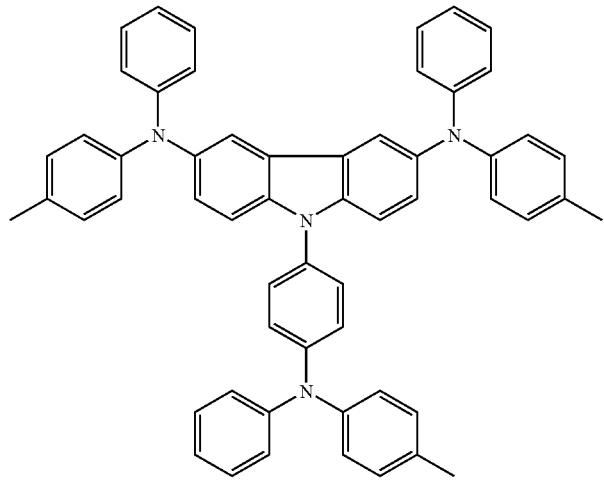
formula 91
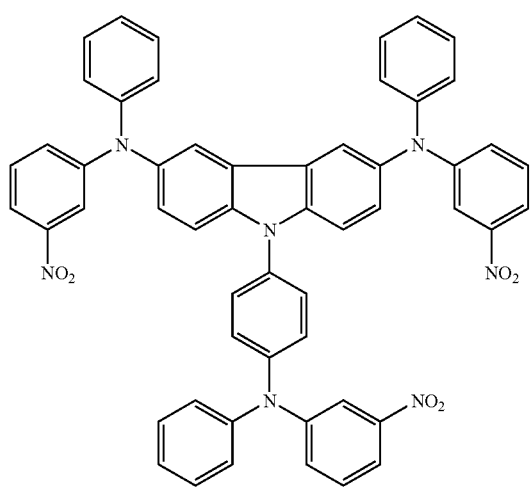
formula 92
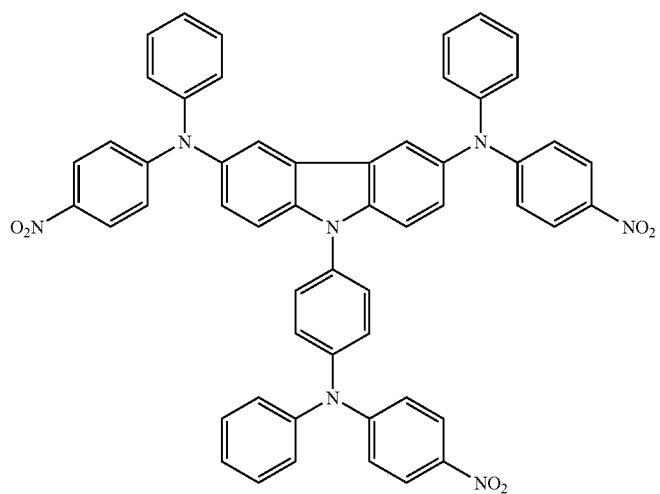

-continued
formula 93
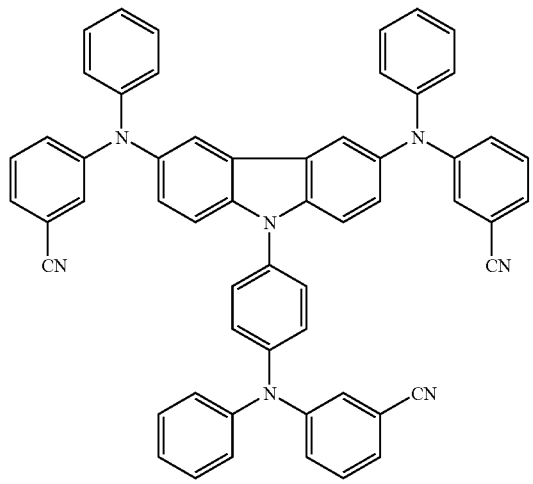
formula 94
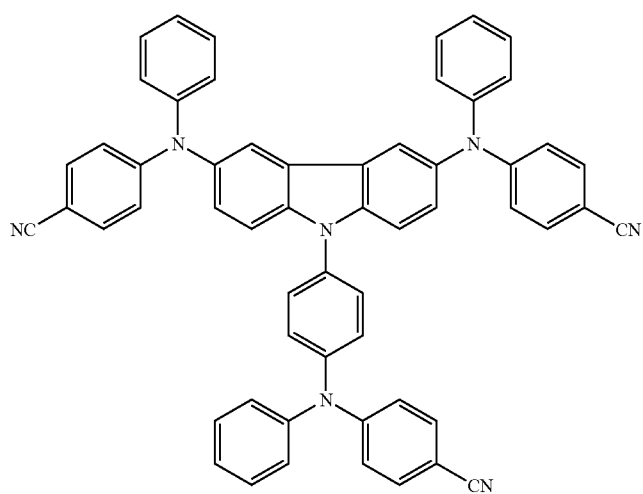
formula 95
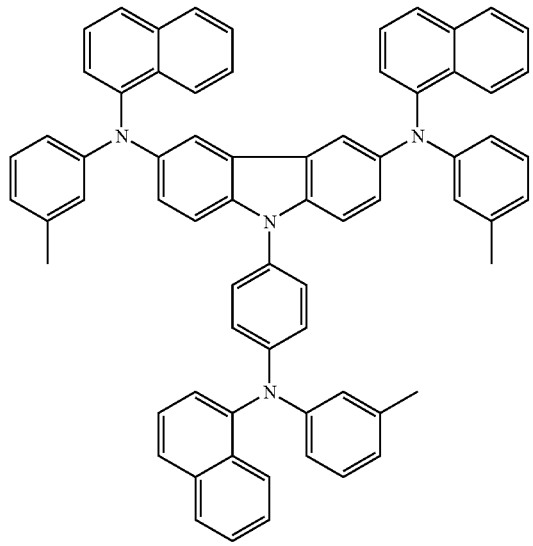

-continued
formula 96
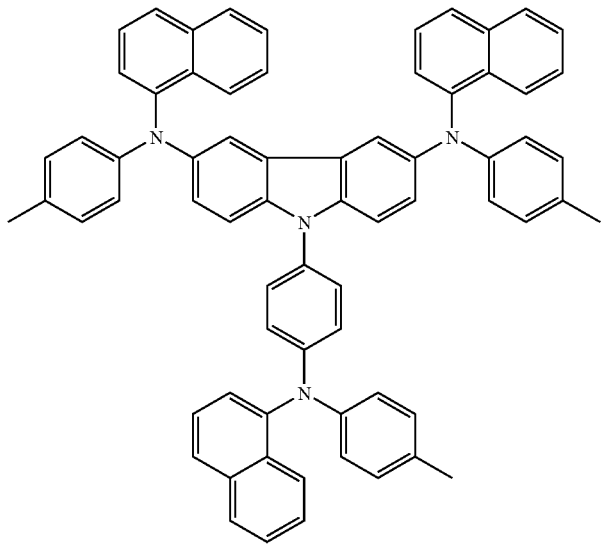
formula 97
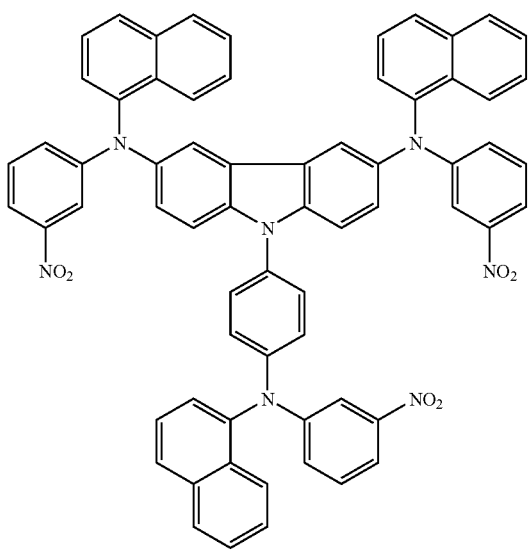
formula 98
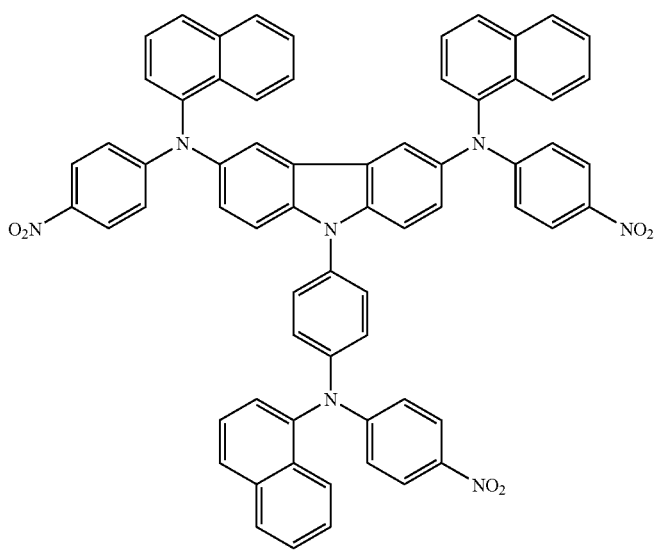

formula 99
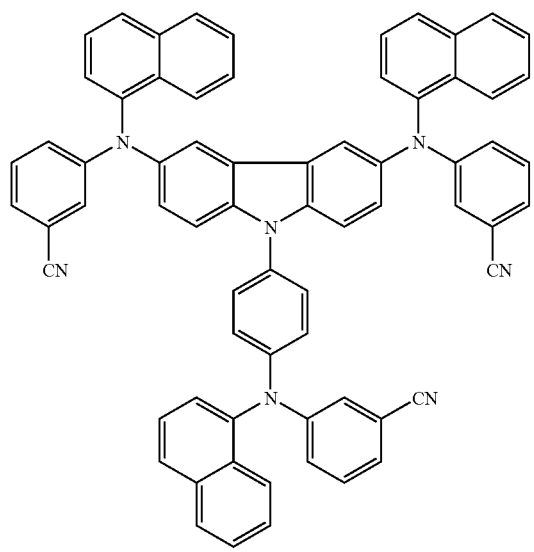
formula 100
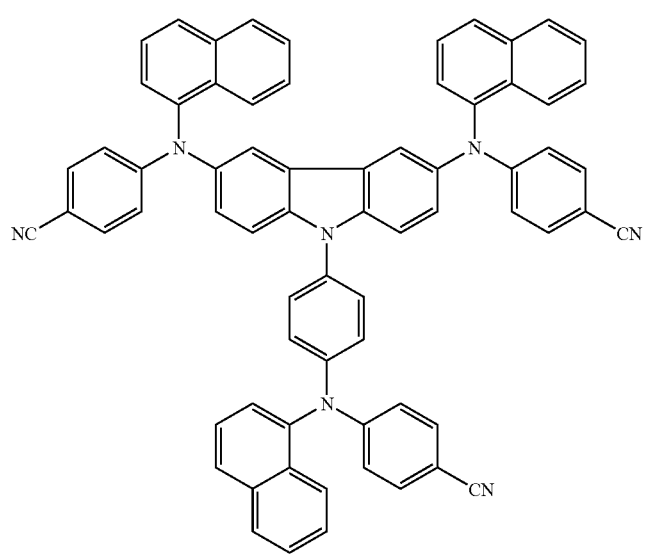
formula 101
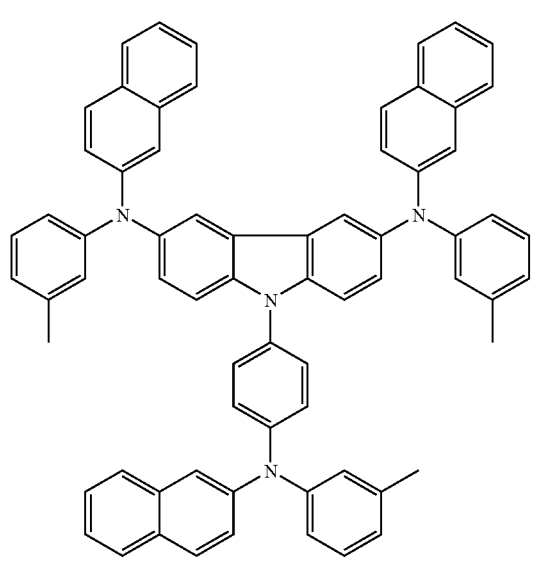

formula 102
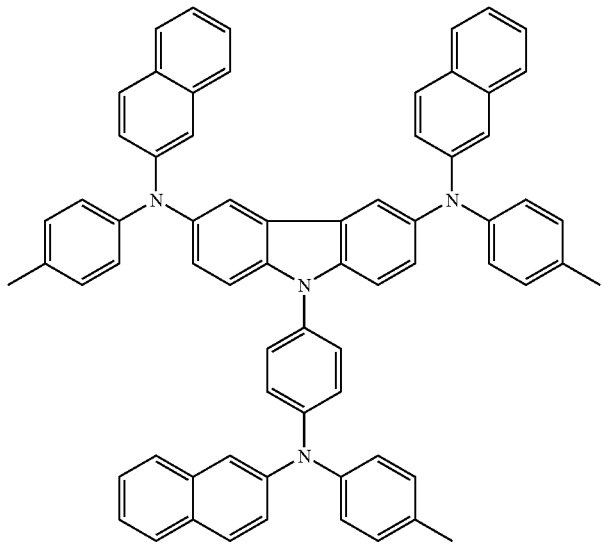
formula 103
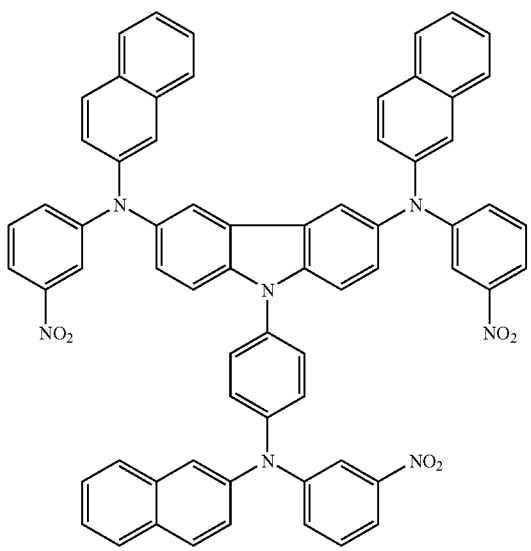
formula 104
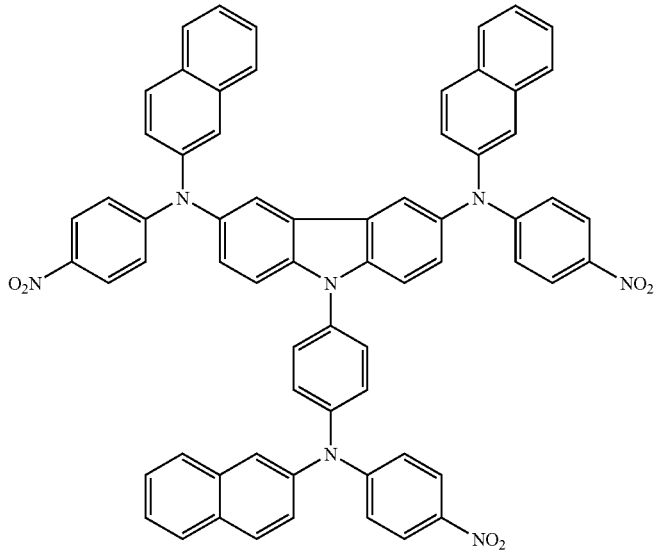

-continued
formula 105
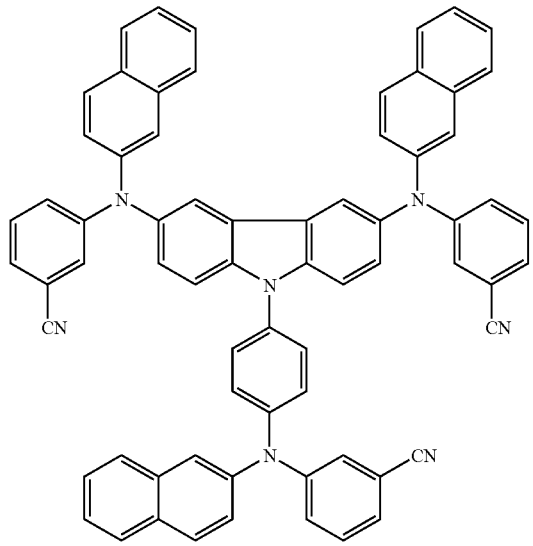
formula 106
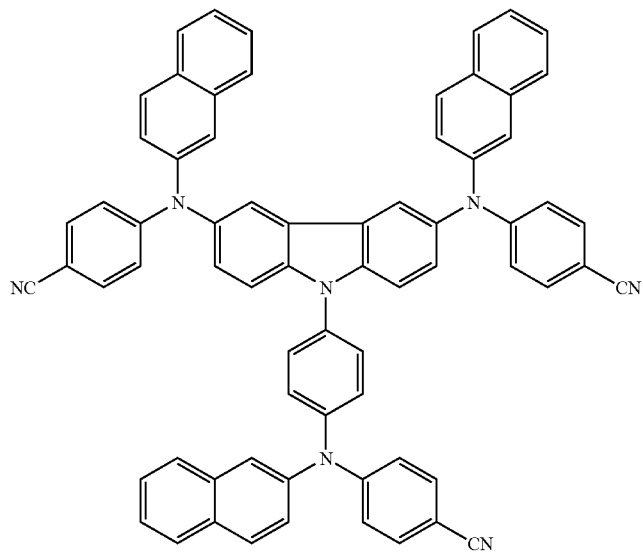
formula 107
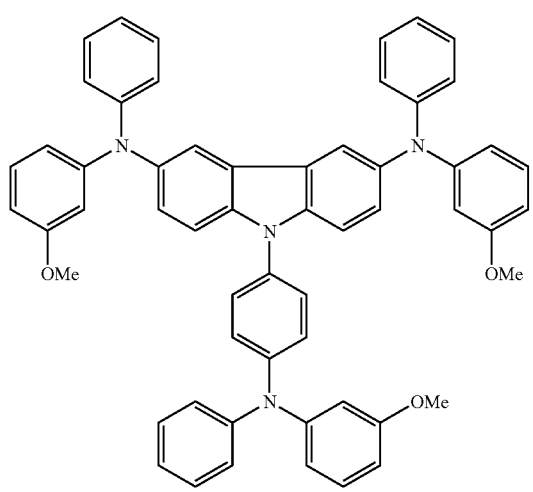

formula 108
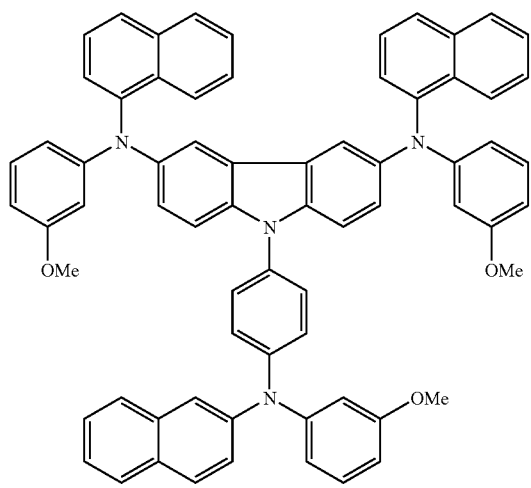
formula 109
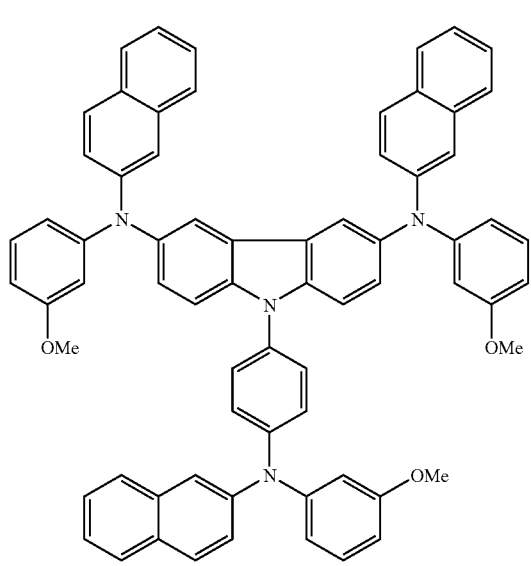
formula 110
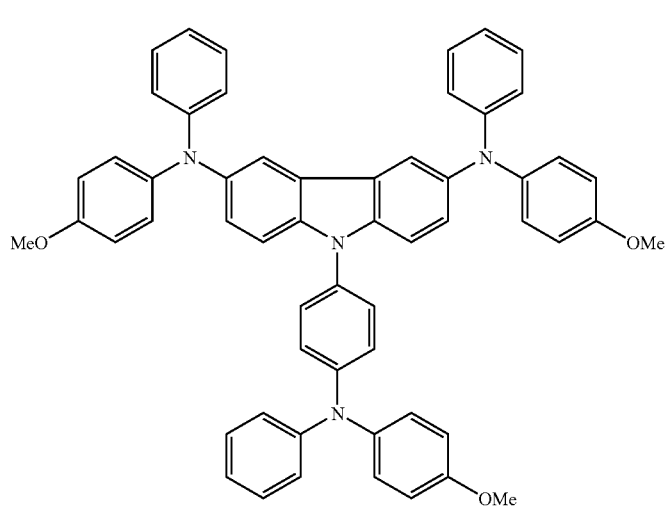

-continued
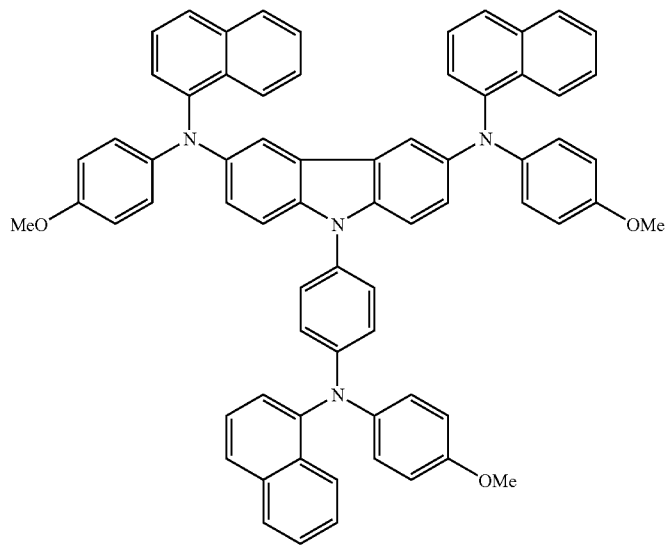
formula 111
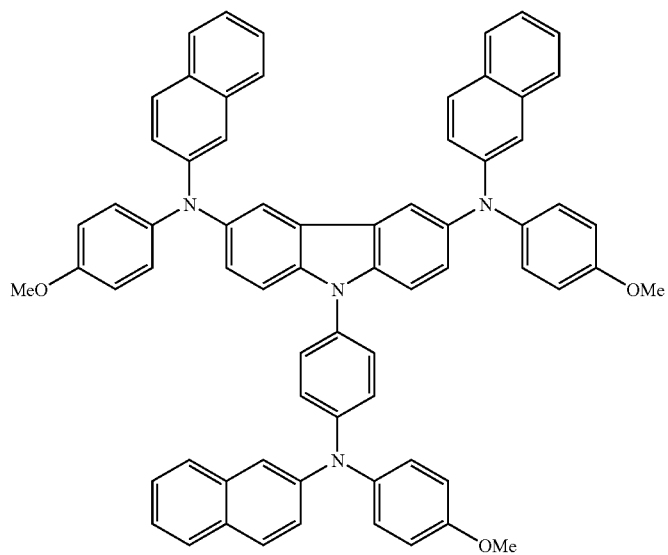
formula 112
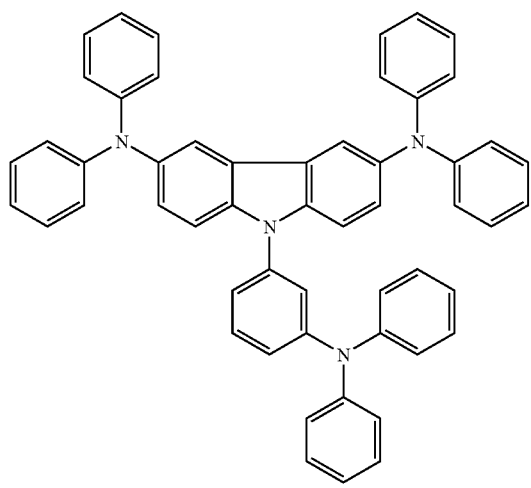
formula 113 formula 114
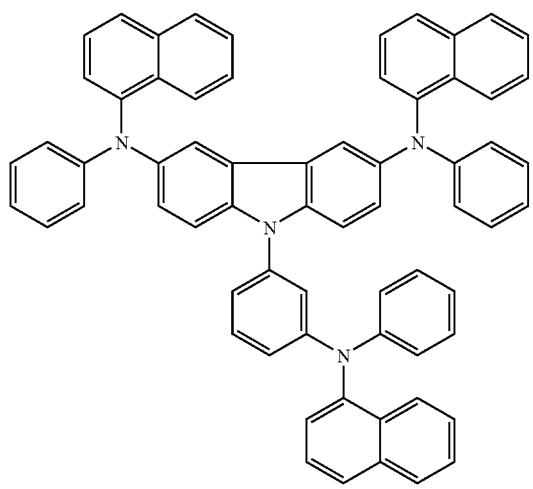
formula 115
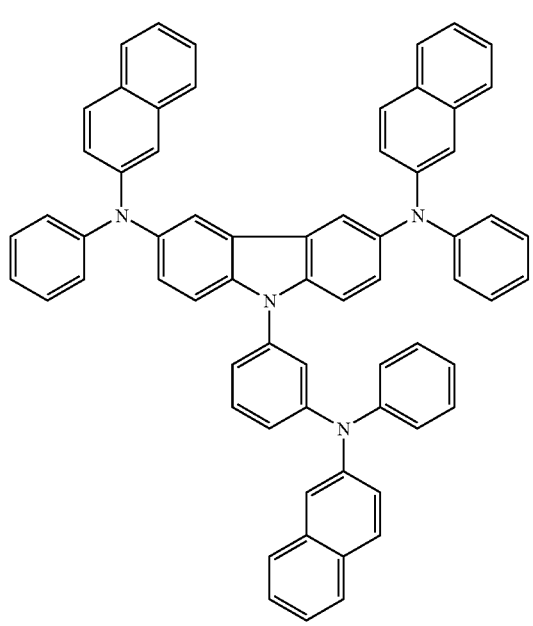
formula 116
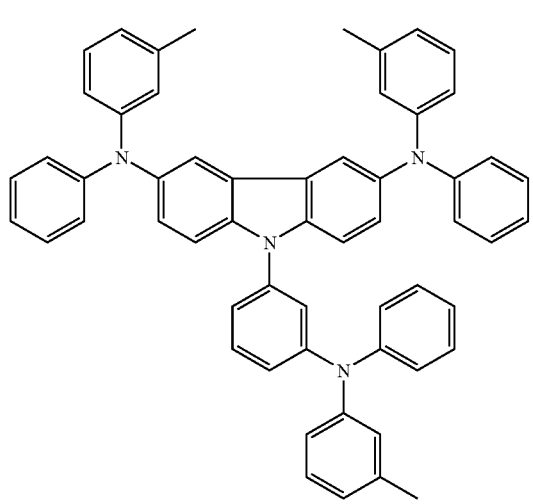

-continued
formula 117
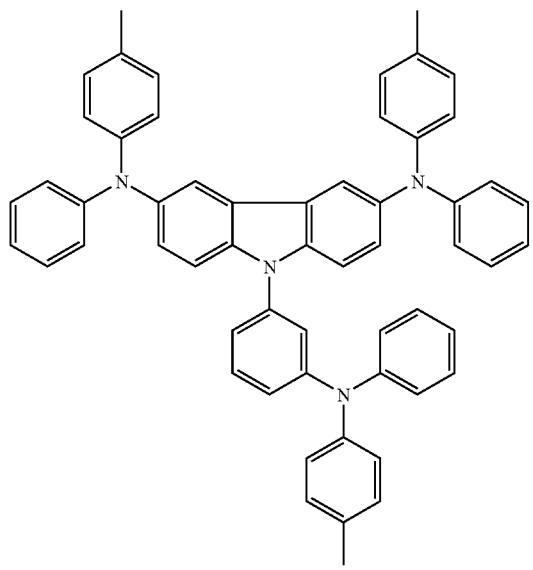
formula 118
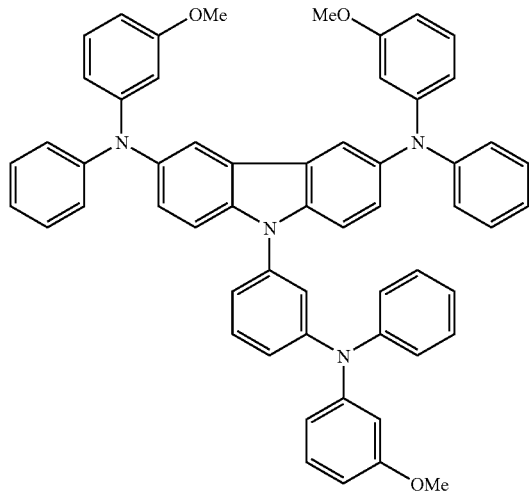
formula 119
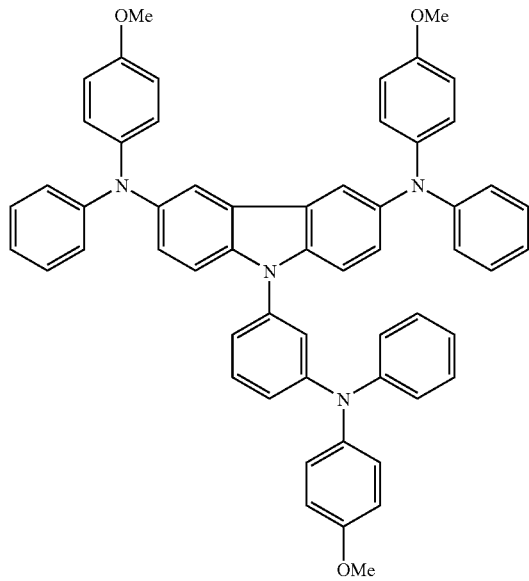

-continued
formula 120
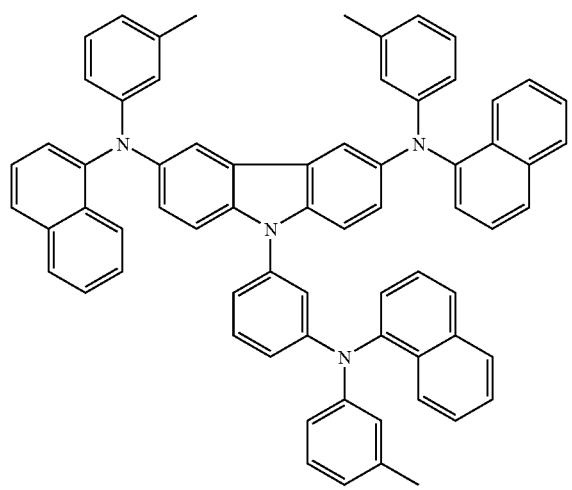
formula 121
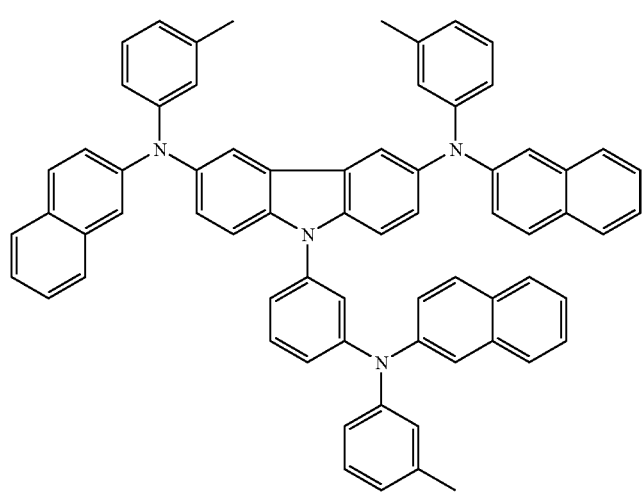
formula 122
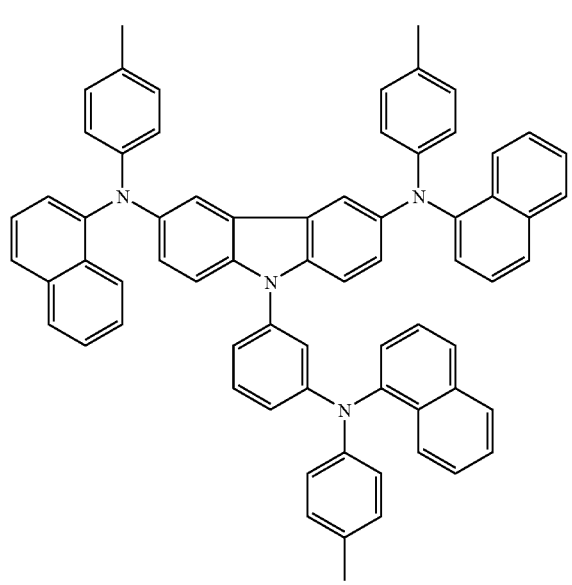

formula 123
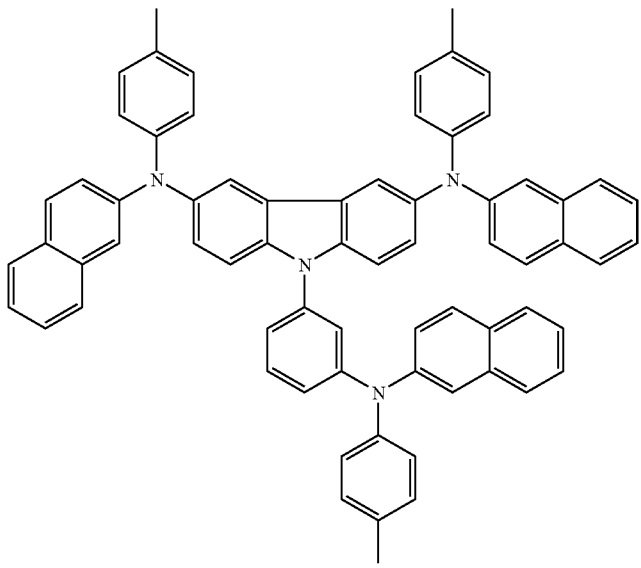
formula 124
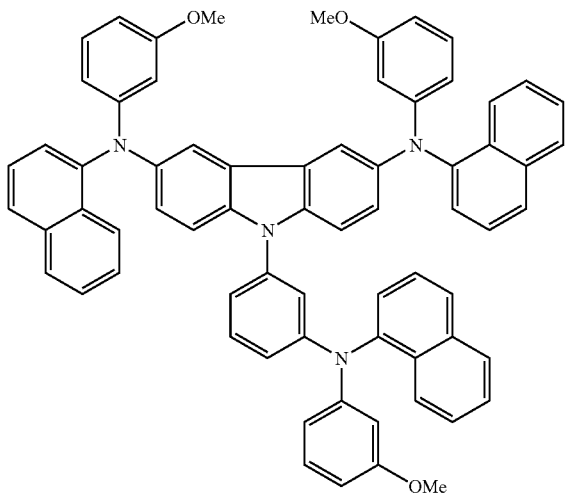
formula 125
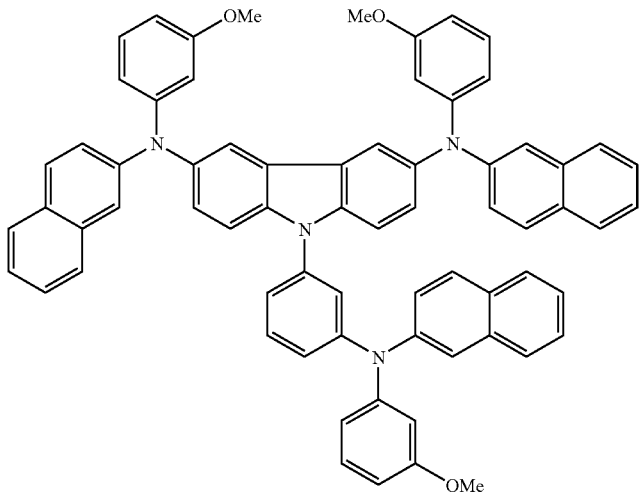

formula 126
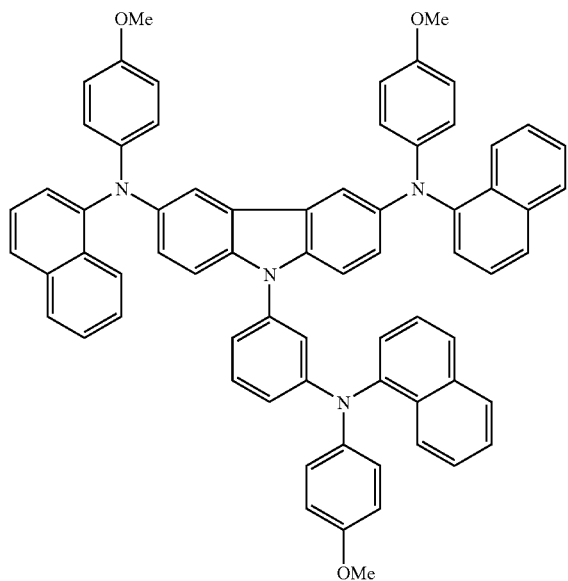
formula 127
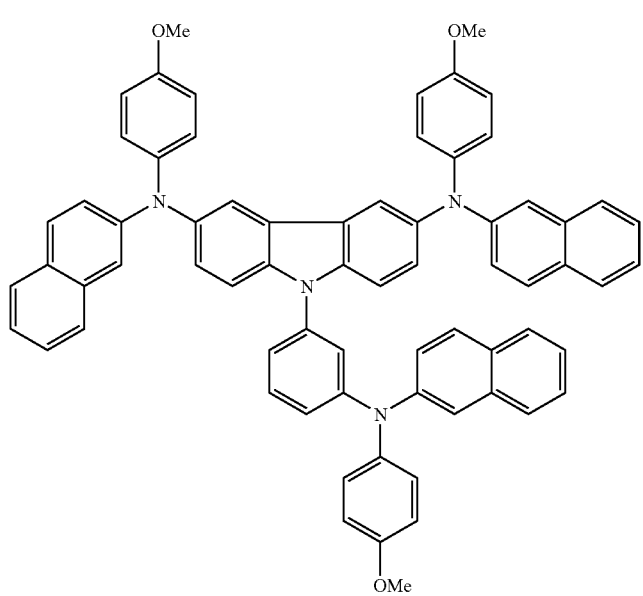
formula 128
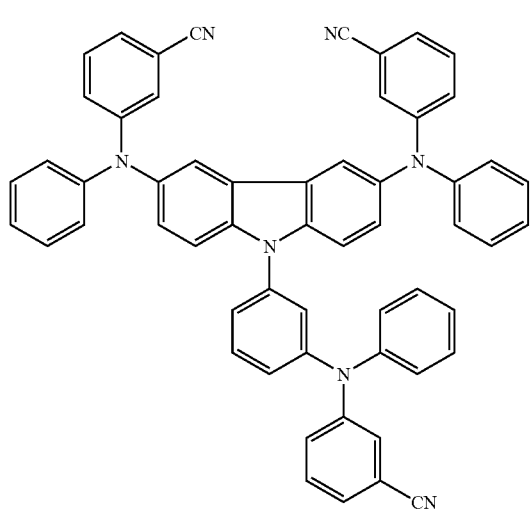

-continued
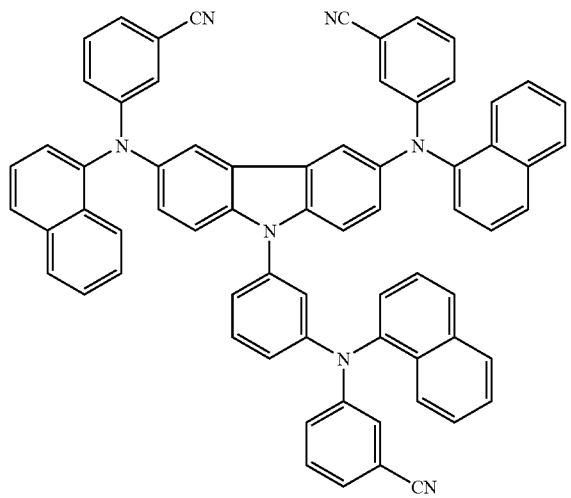
formula 129
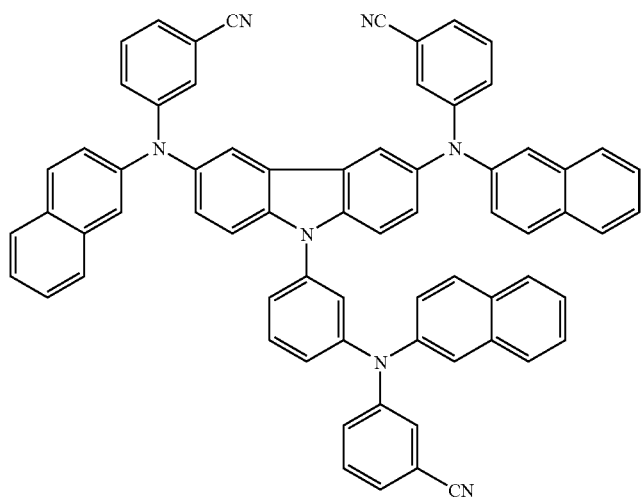
formula 130
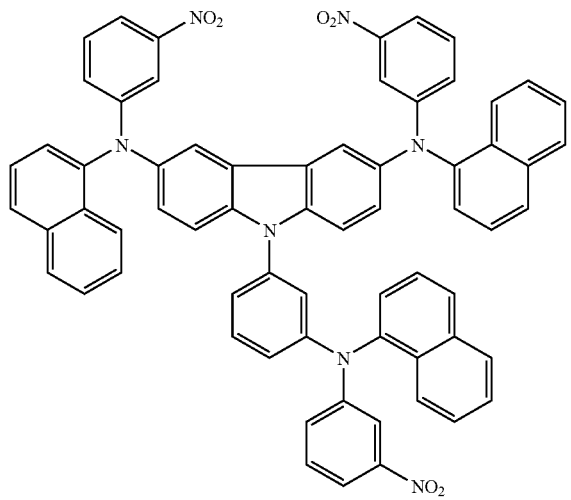
formula 131

-continued
formula 132
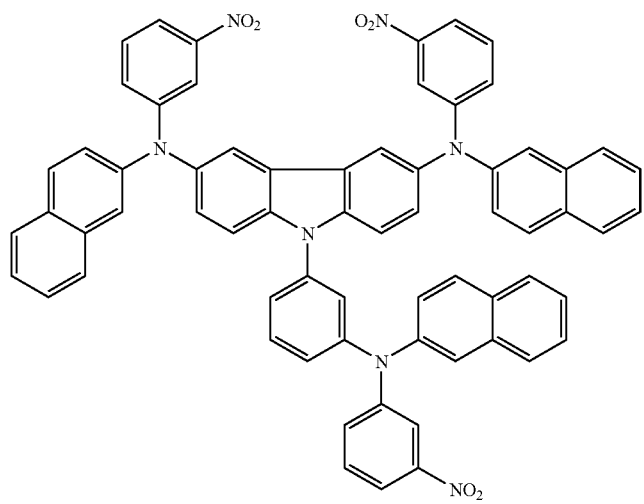
formula 133
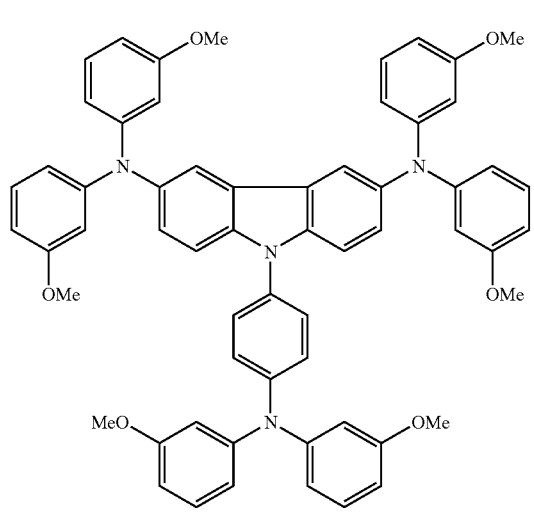
formula 134
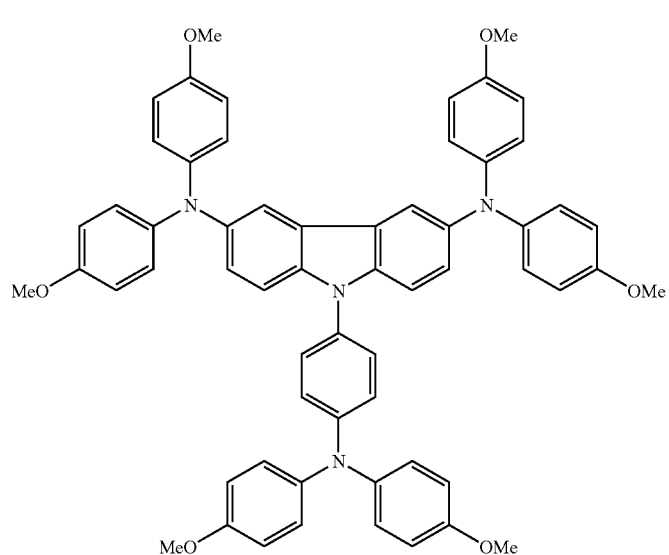

formula 135
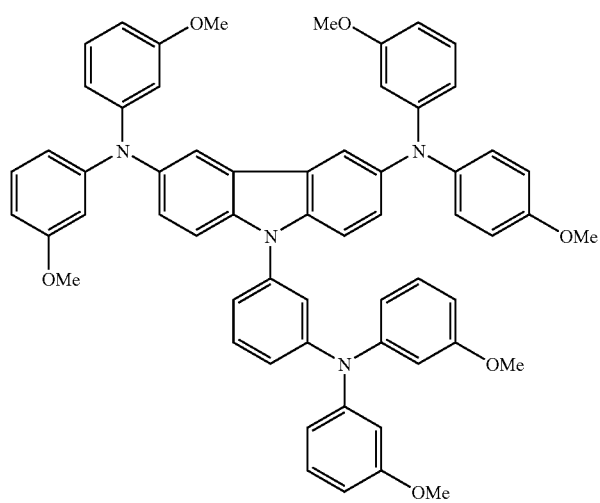
formula 136
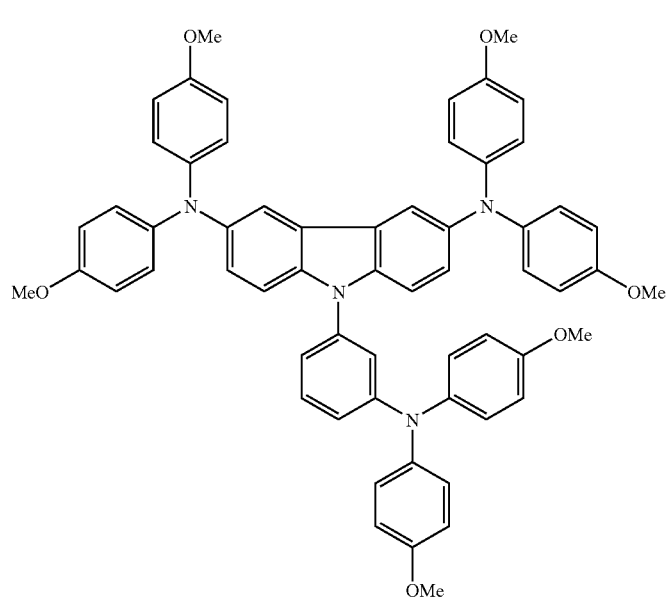
formula 137
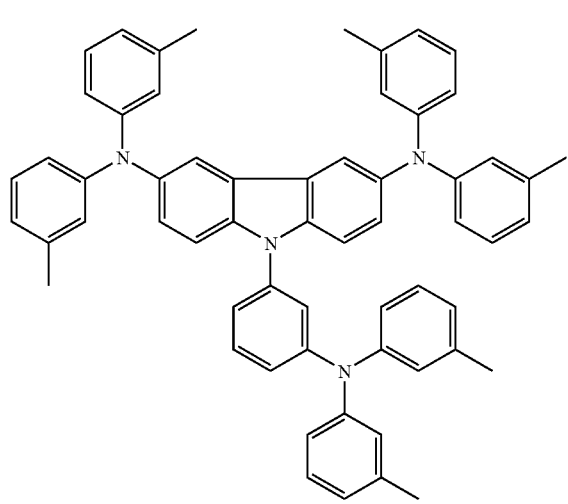

formula 138
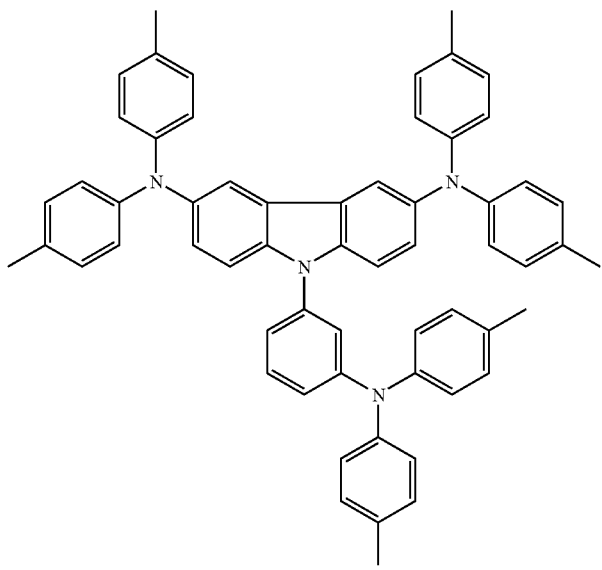
formula 139
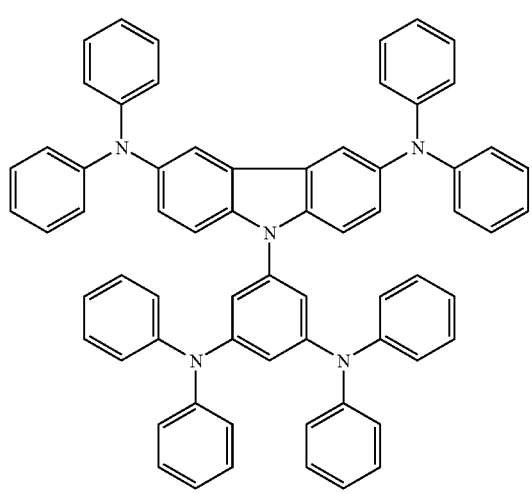
formula 140
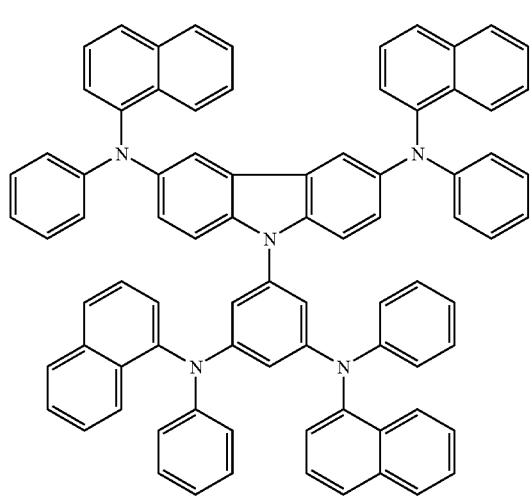

-continued
formula 141
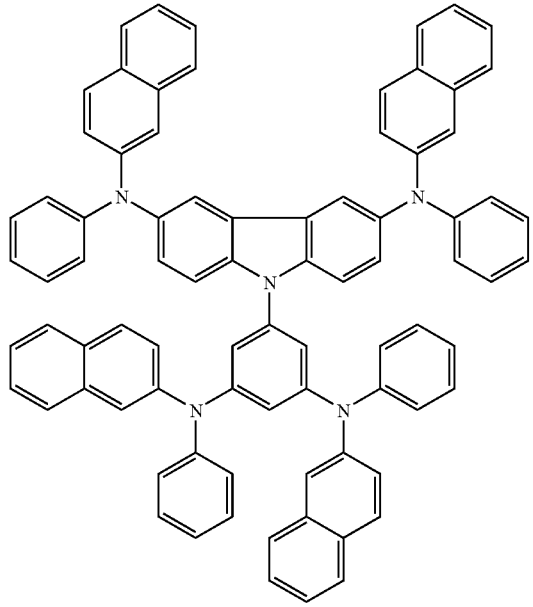
formula 142
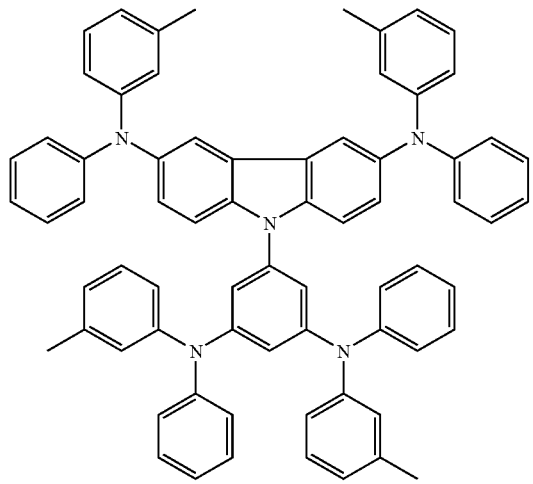
formula 143
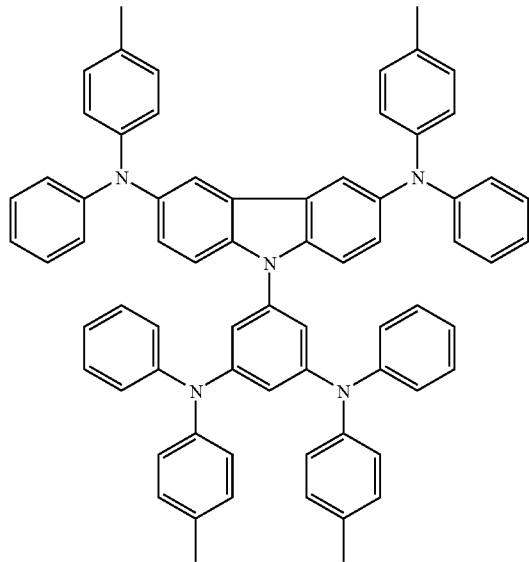

-continued
formula 144
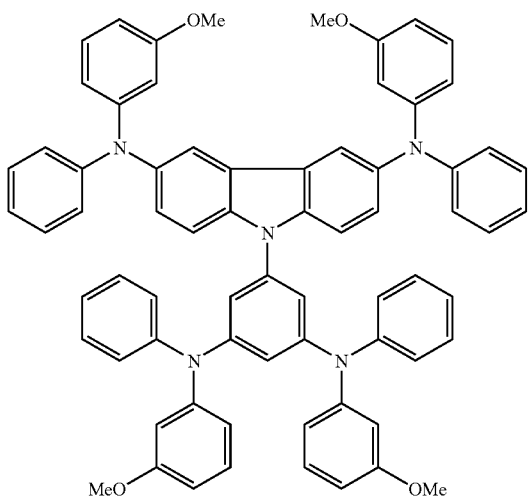
formula 145
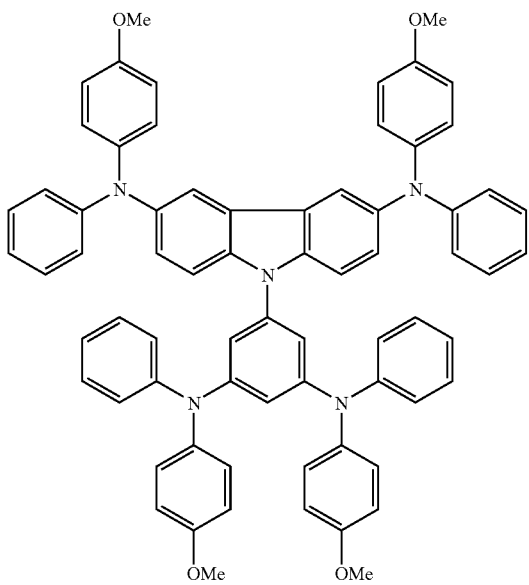
formula 146
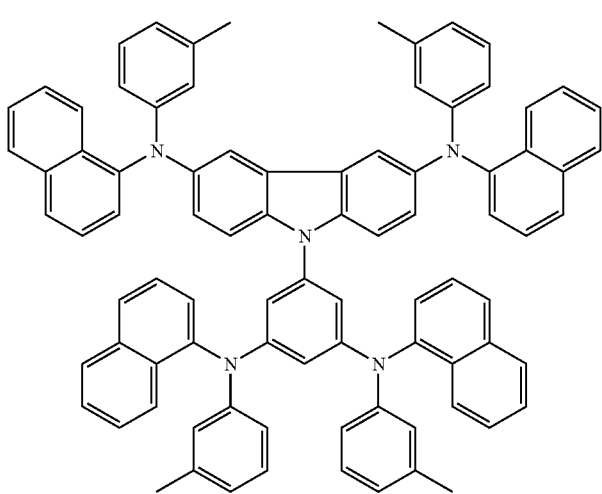

-continued
formula 147
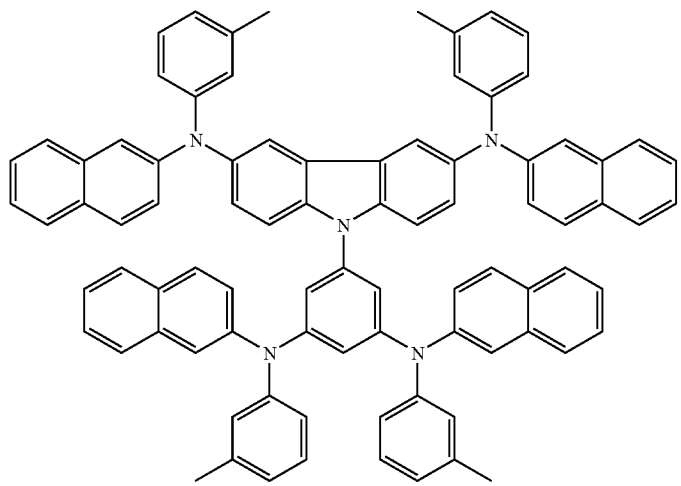
formula 148
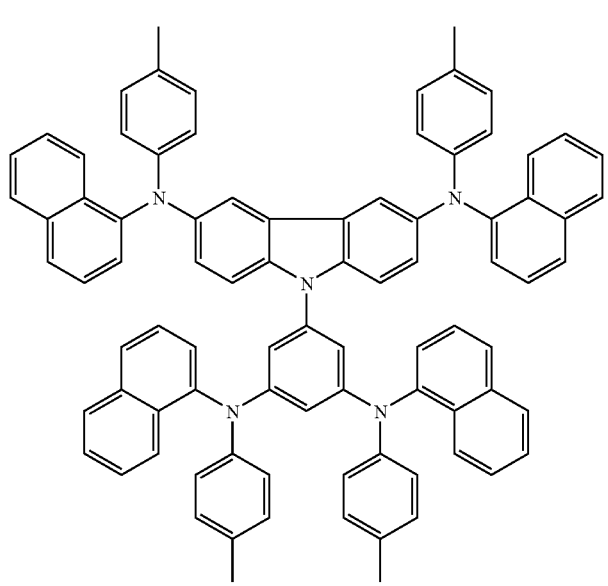
formula 149
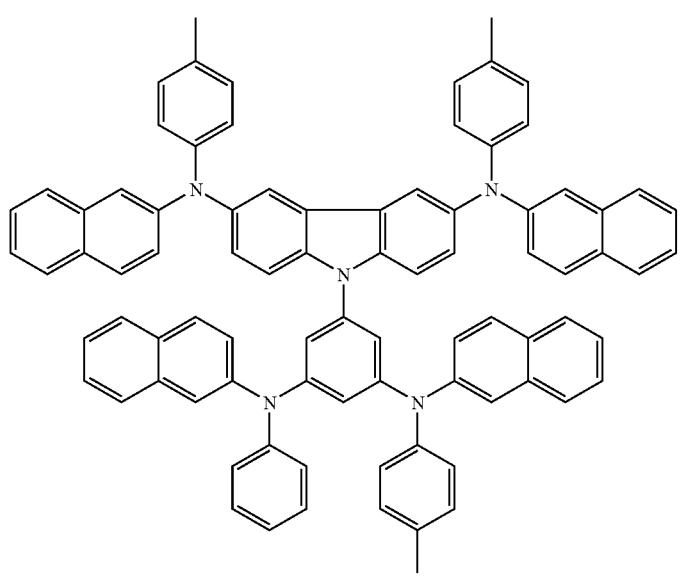

-continued
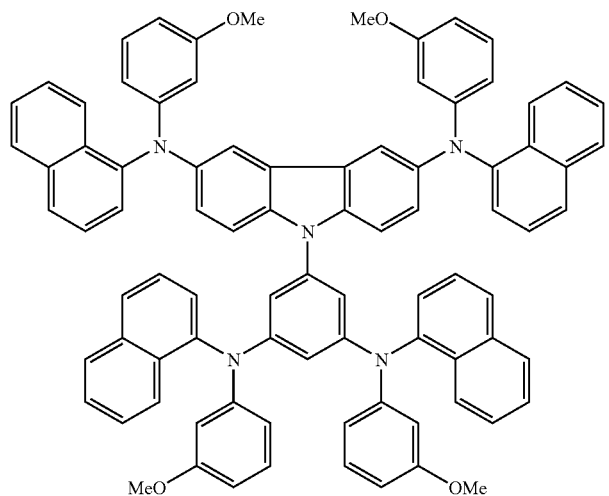
formula 150
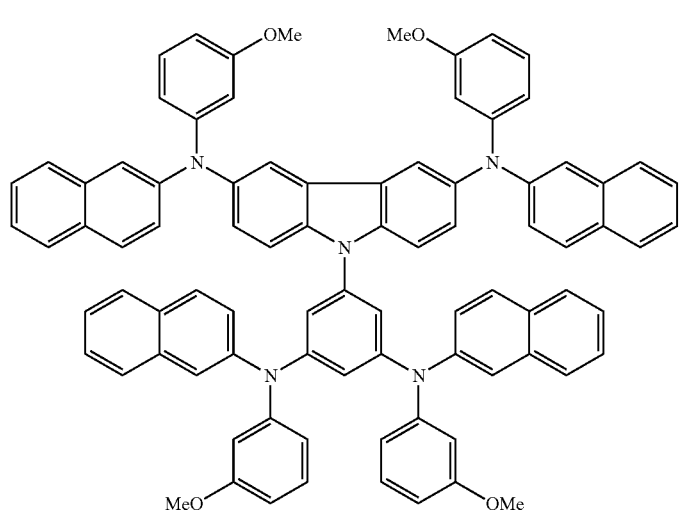
formula 151
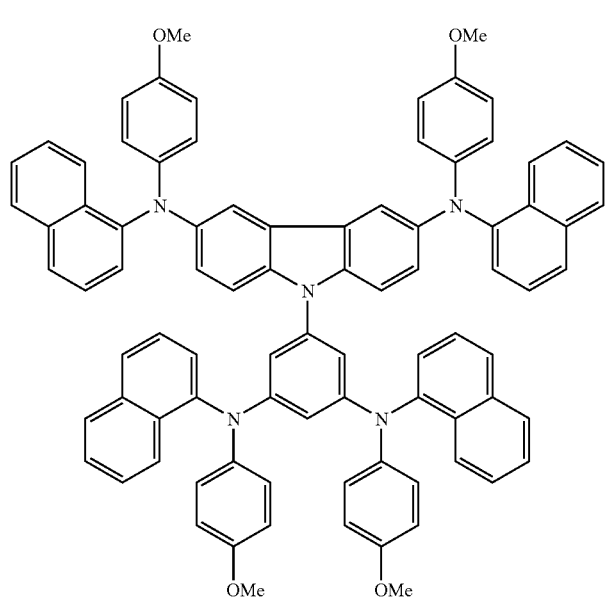
formula 152 formula 153
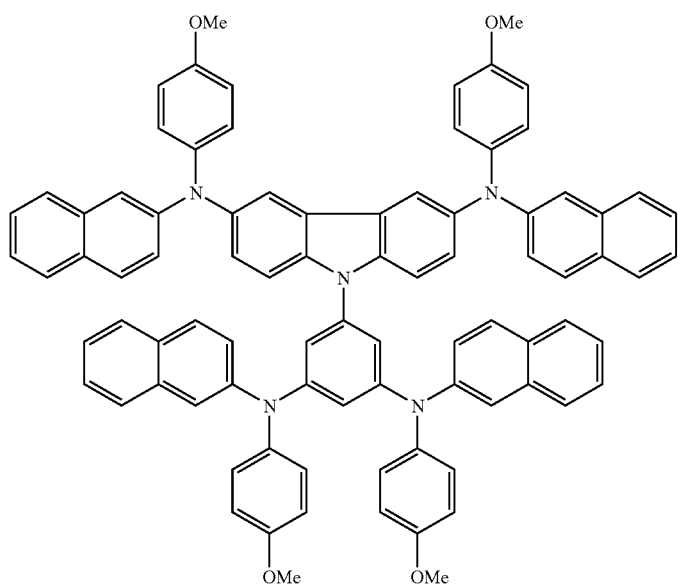
formula 154
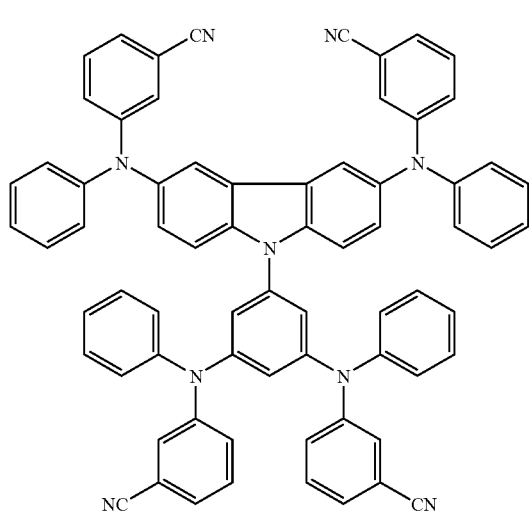
formula 155
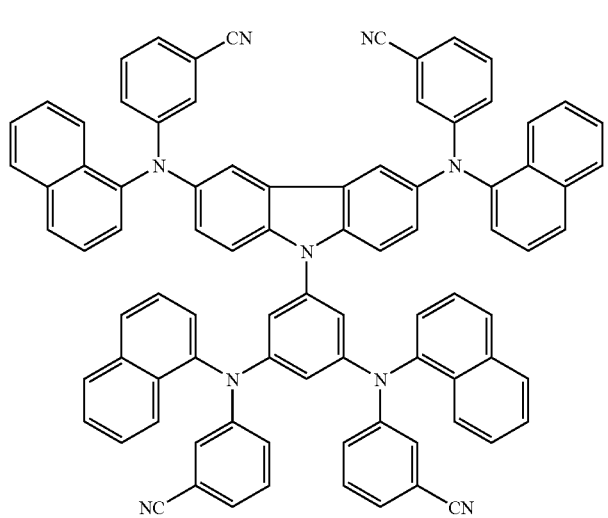

-continued
formula 156
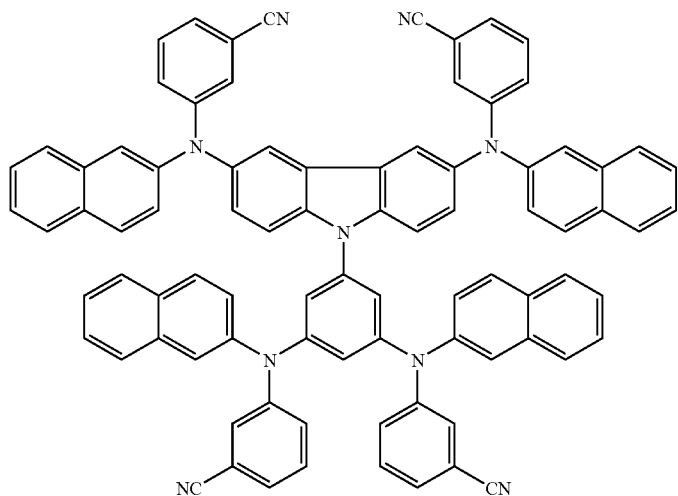
formula 157
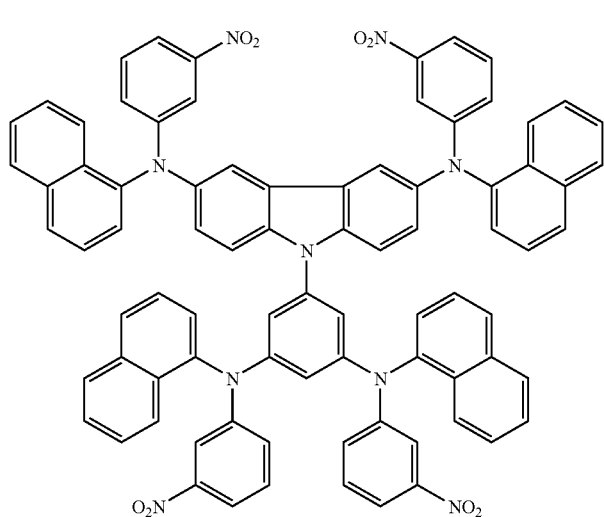
formula 158
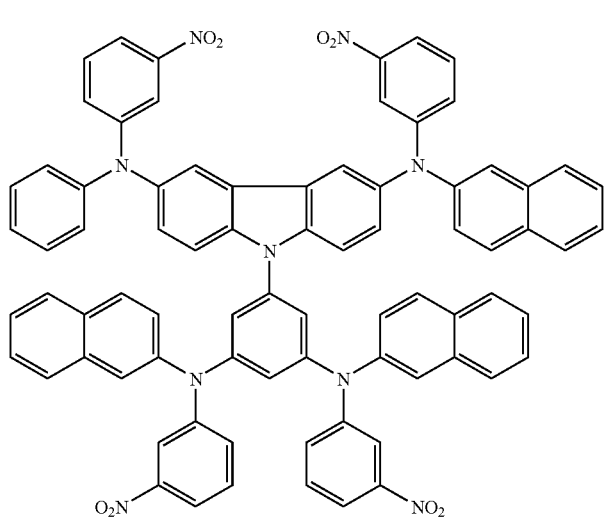

formula 159
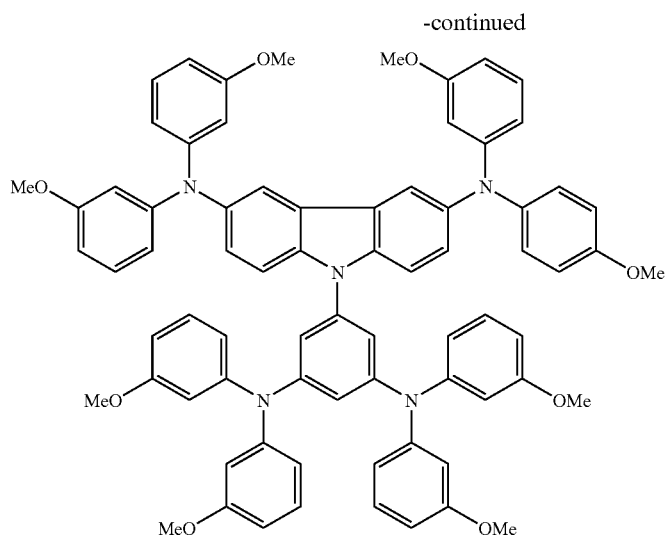
formula 160
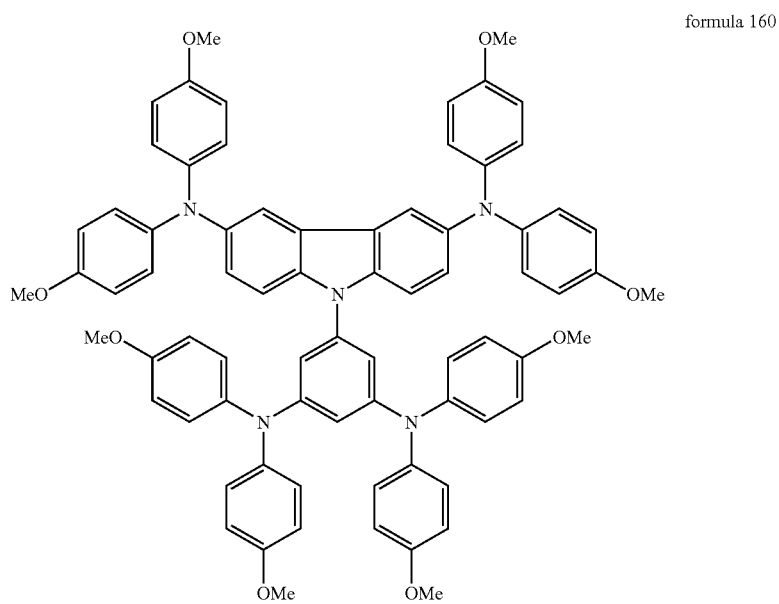
formula 161
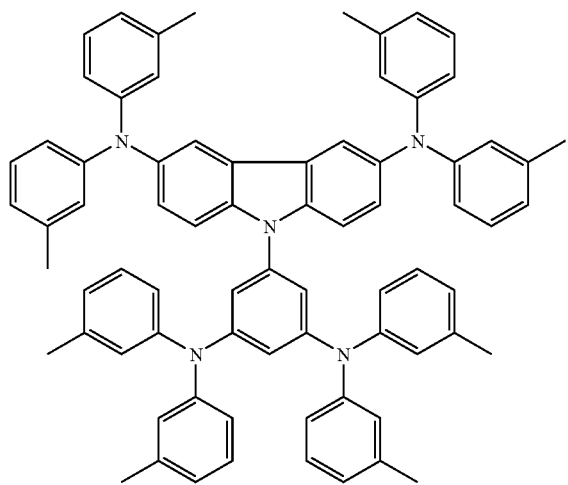

-continued
formula 162
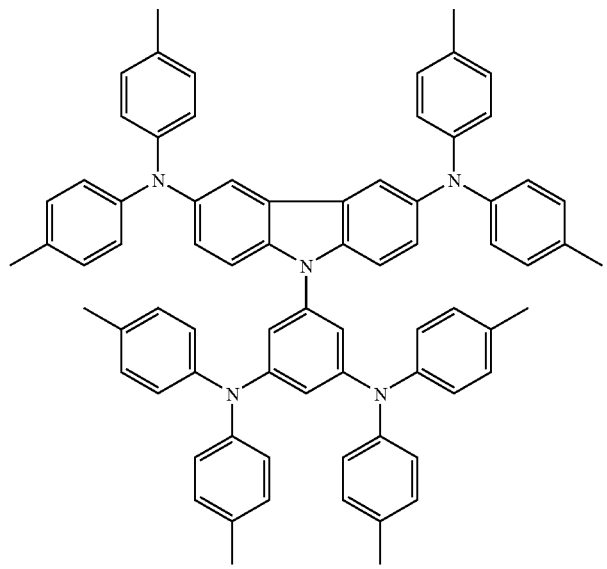
formula 163
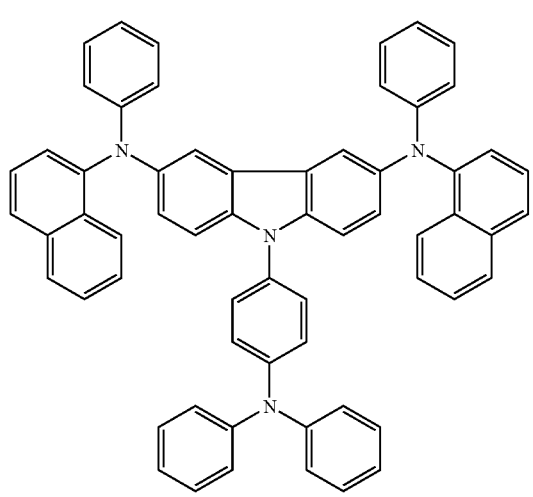
formula 164
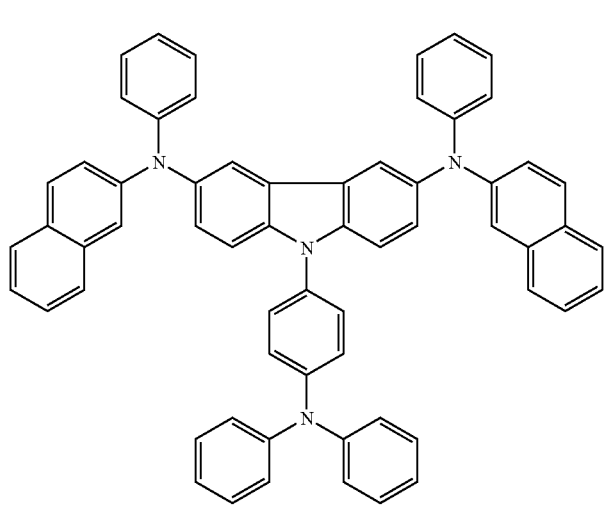

-continued
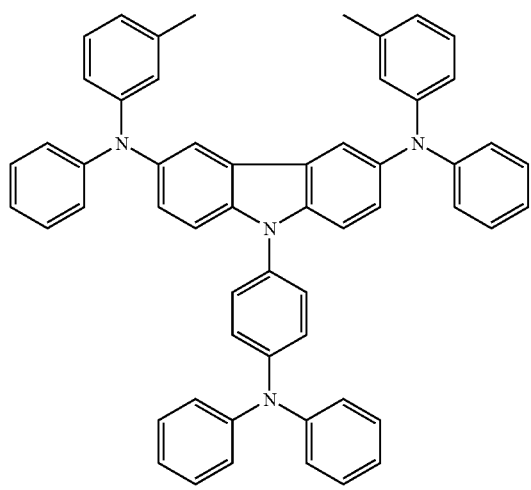
formula 165
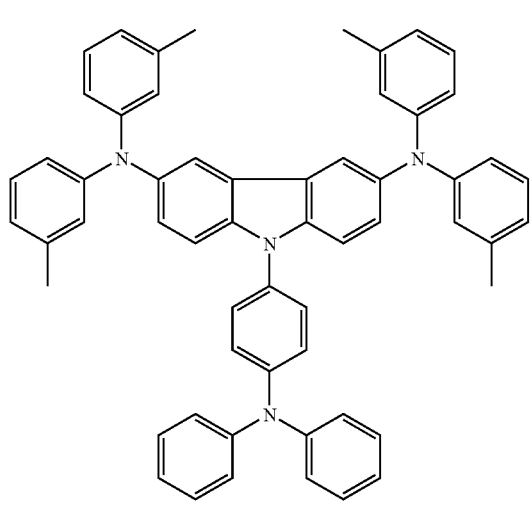
formula 166
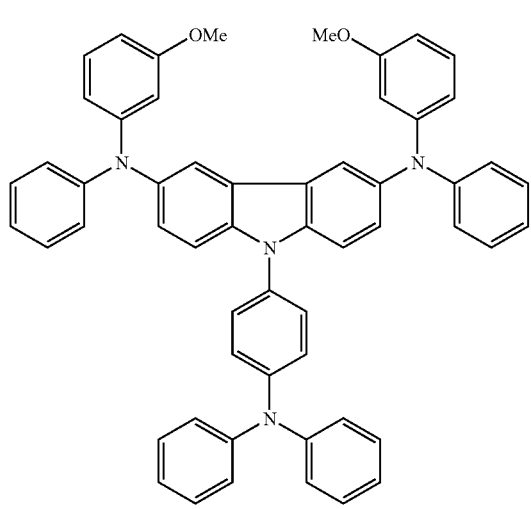
formula 167

-continued
formula 168
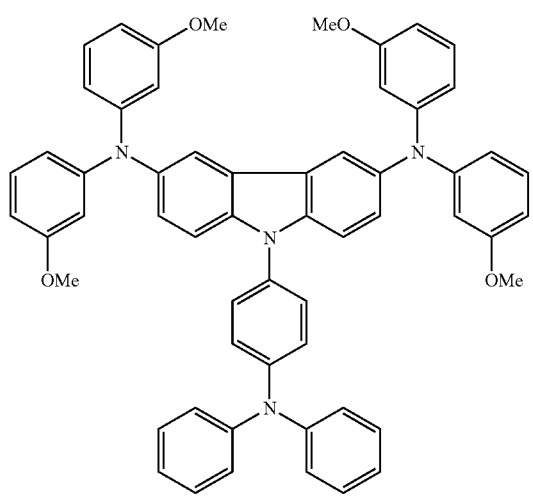
formula 169
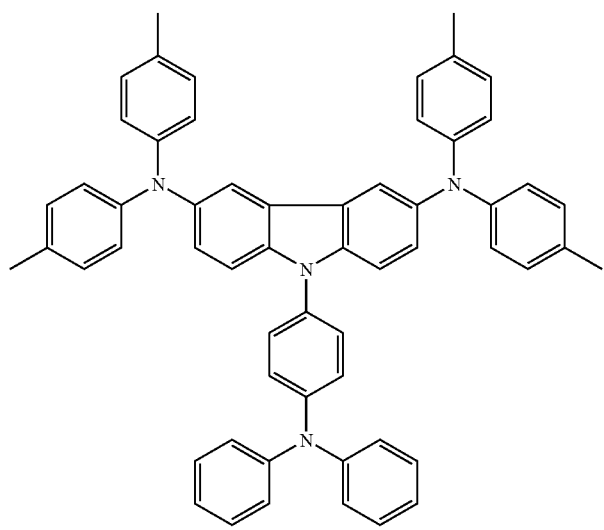
formula 170
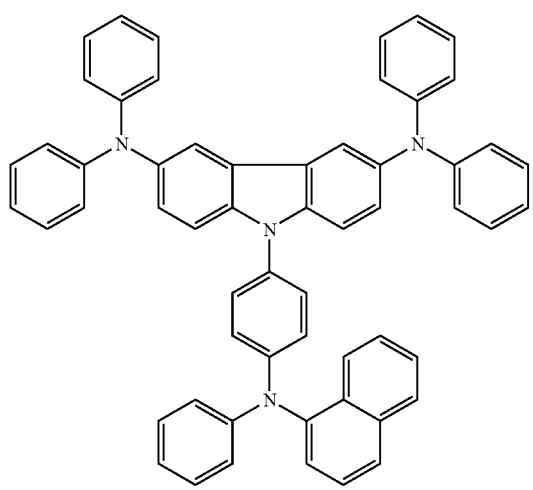

-continued
formula 171
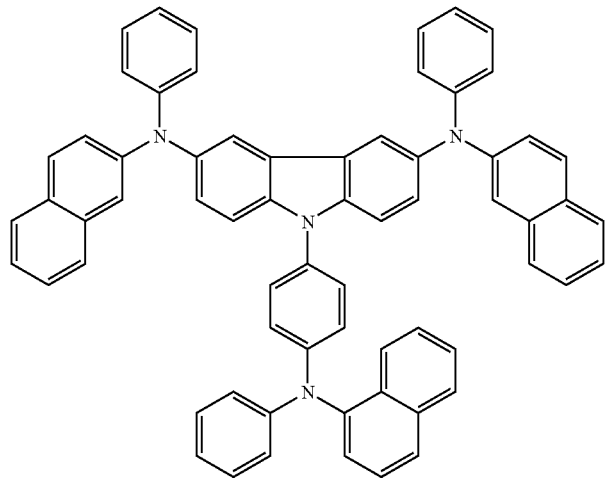
formula 172
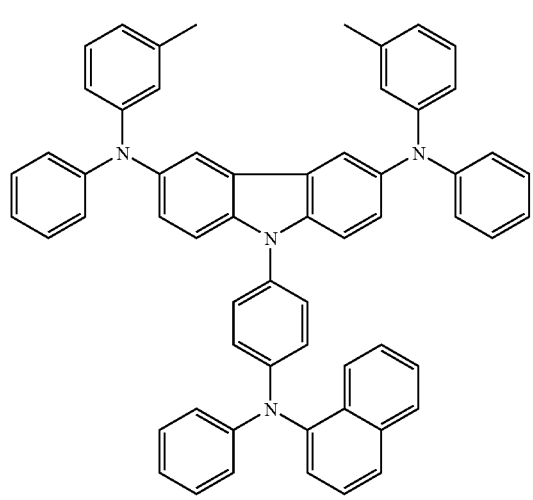
formula 173
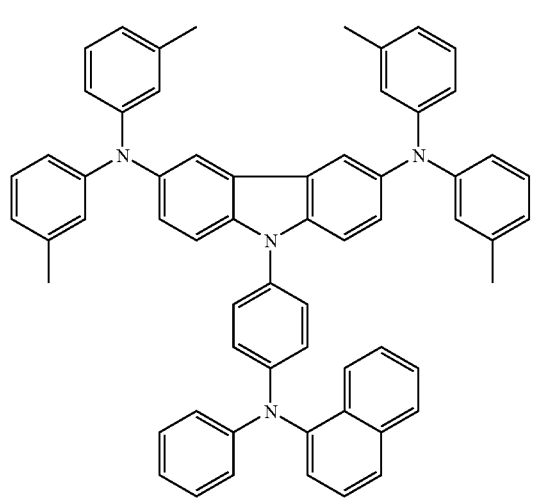

-continued
formula 174
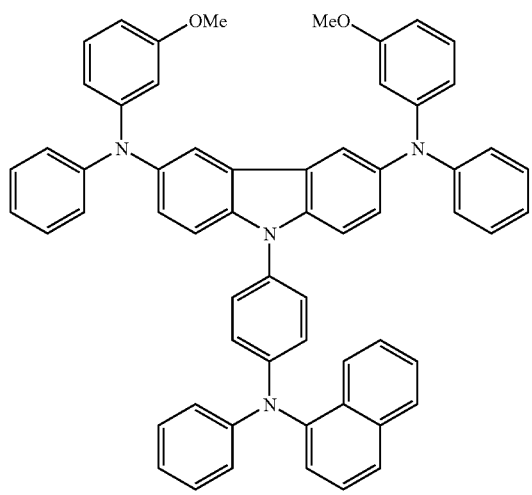
formula 175
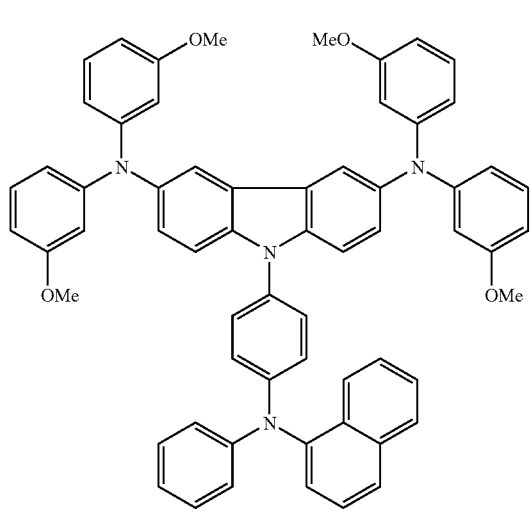
formula 176
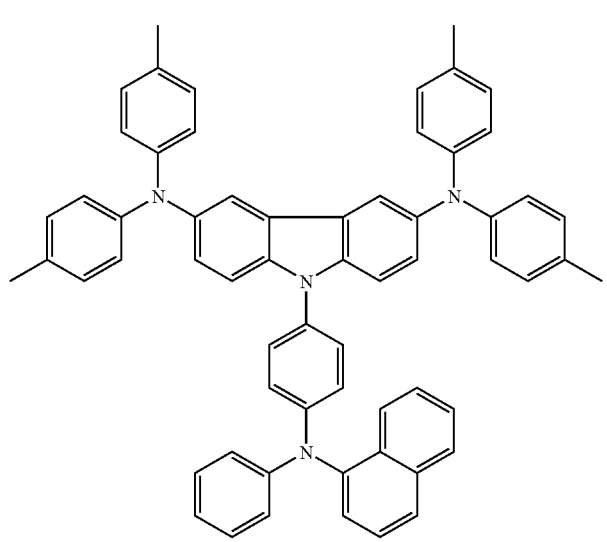

-continued
formula 177
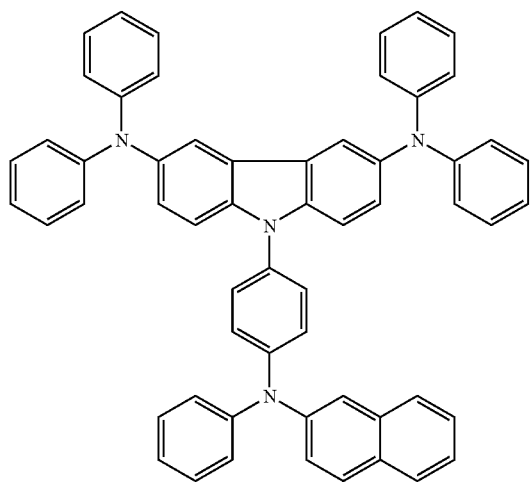
formula 178
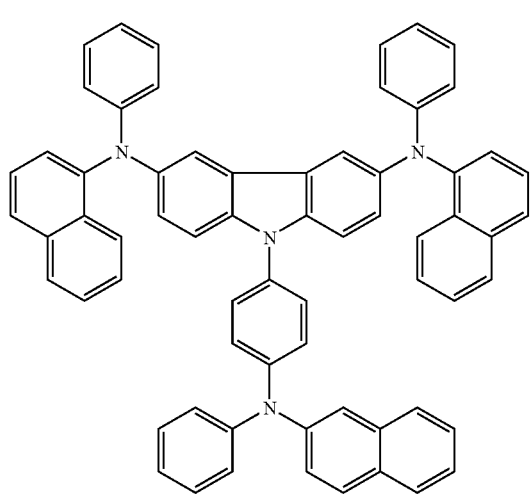
formula 179
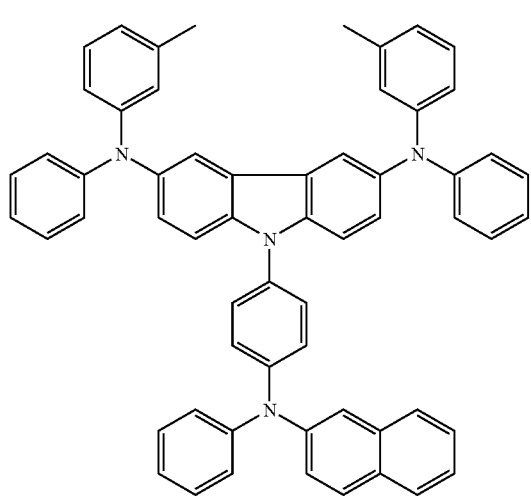

-continued
formula 180
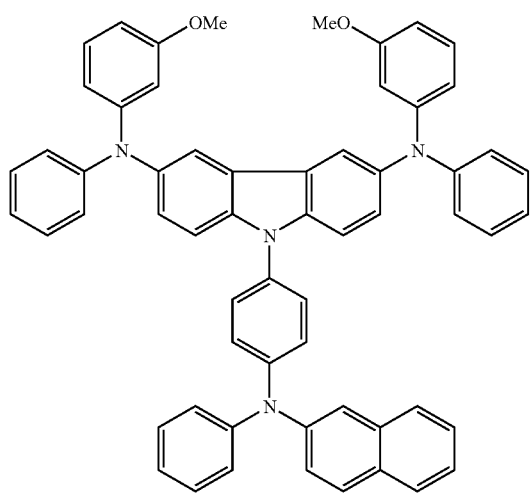
formula 181
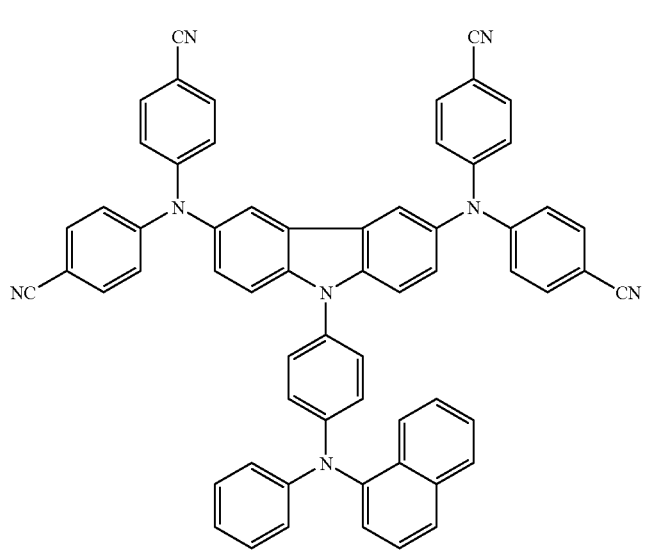
formula 182
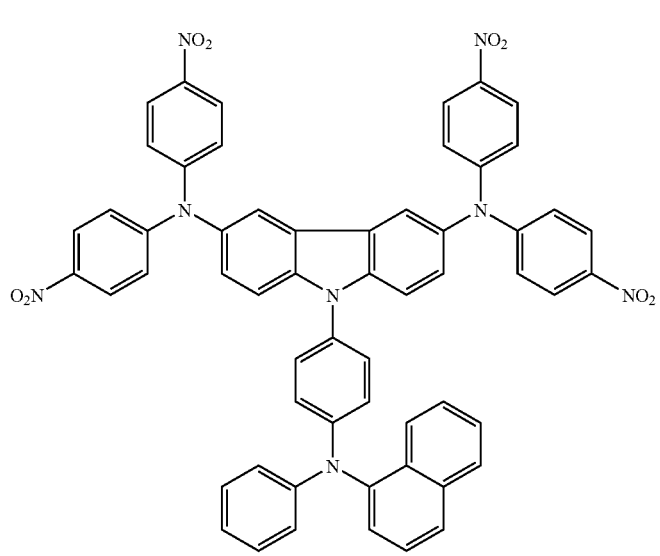

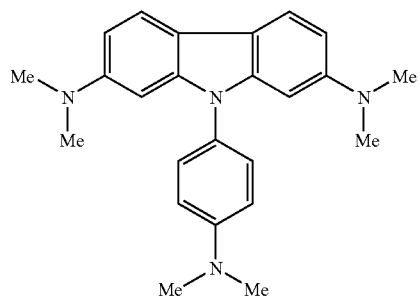
formula 183
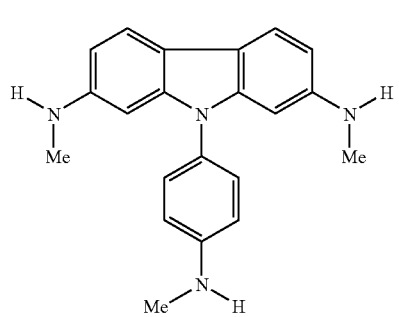
formula 184
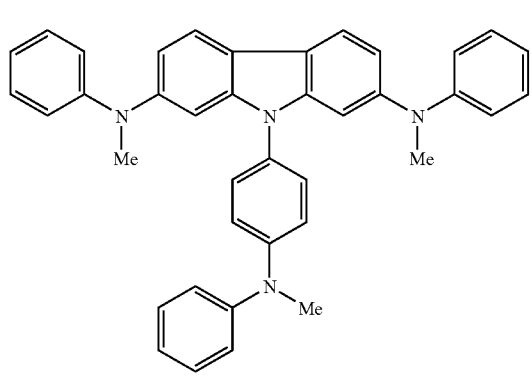
formula 185
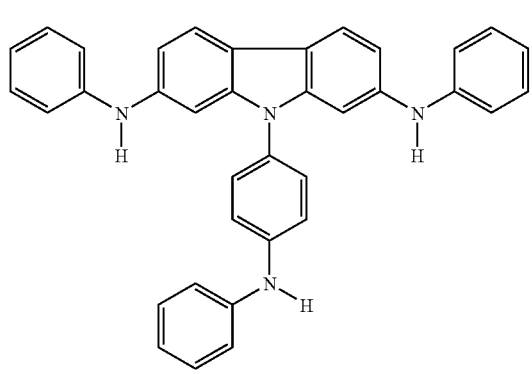
formula 186

-continued
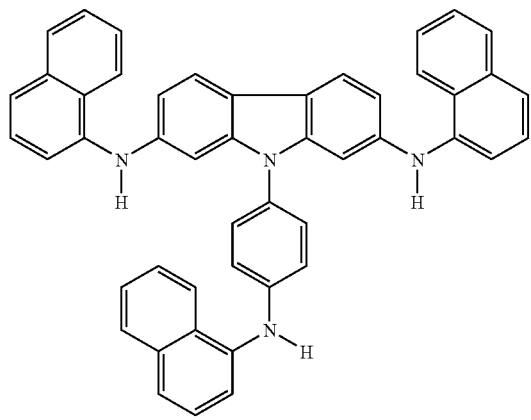
formula 187
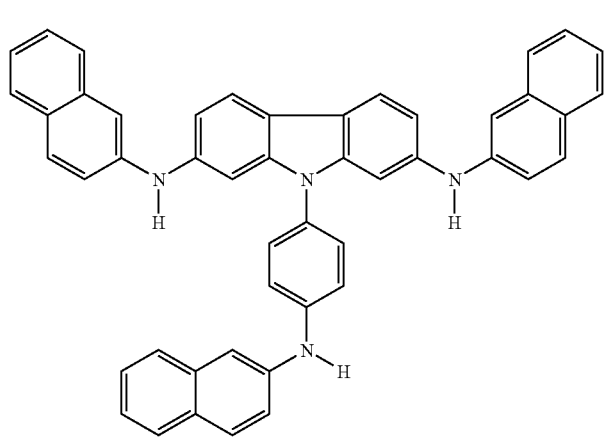
formula 188
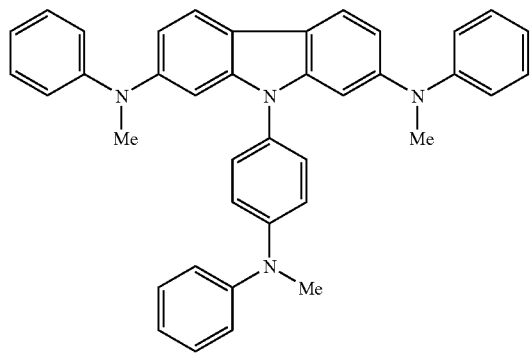
formula 189
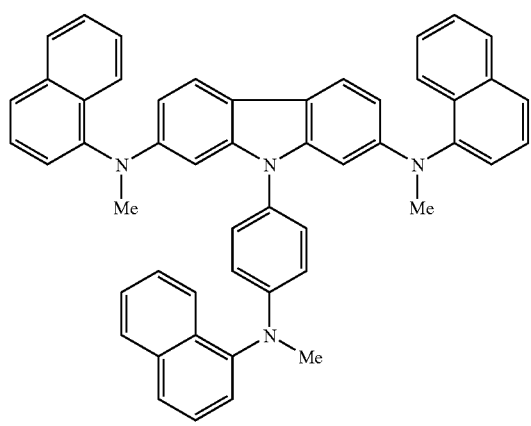
formula 190

-continued
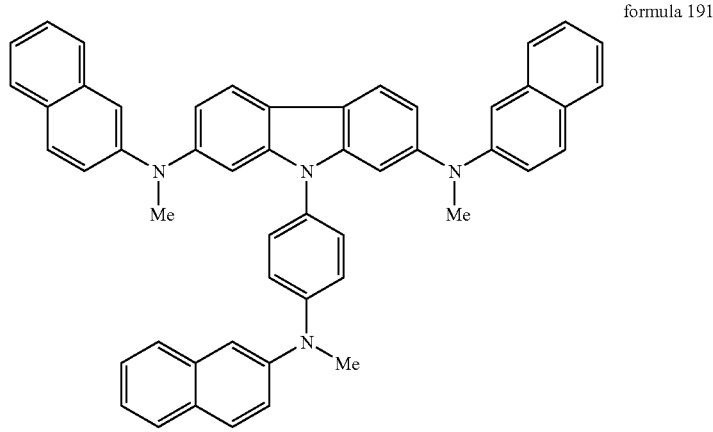
formula 191
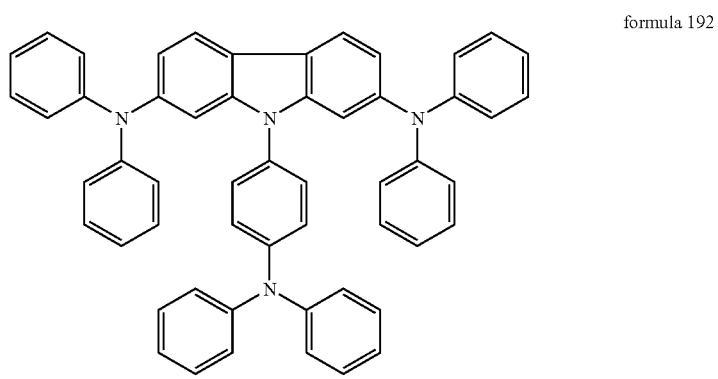
formula 192
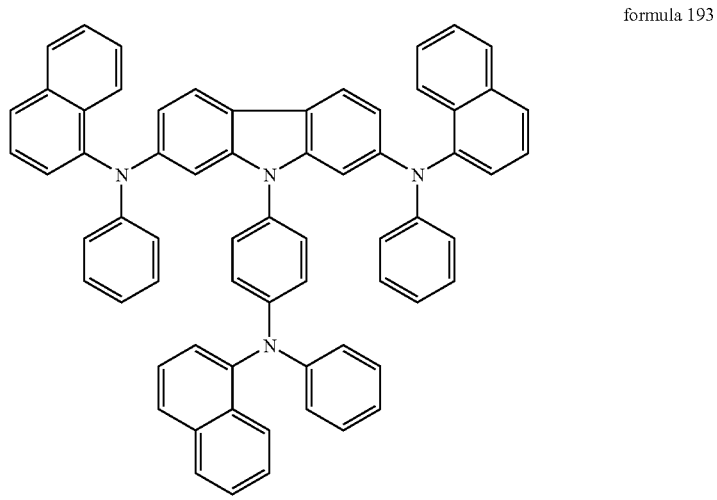
formula 193

-continued
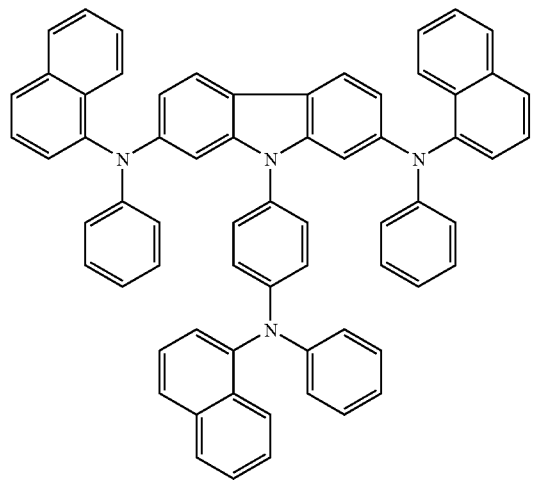
formula 193
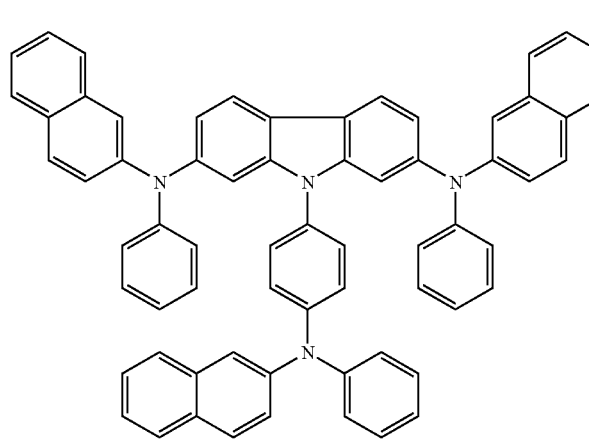
formula 194
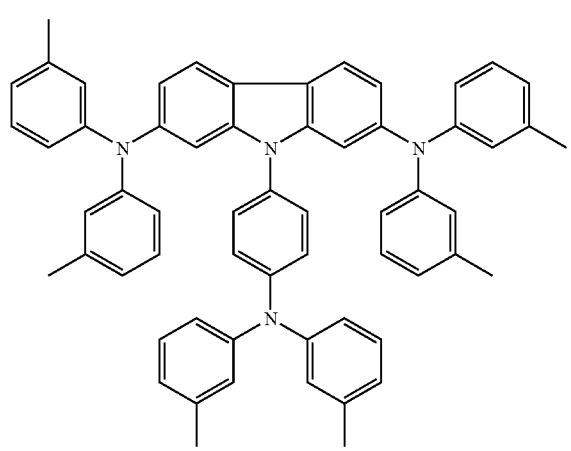
formula 195

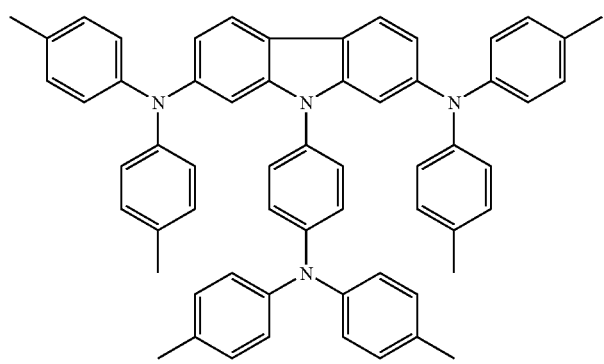
formula 196
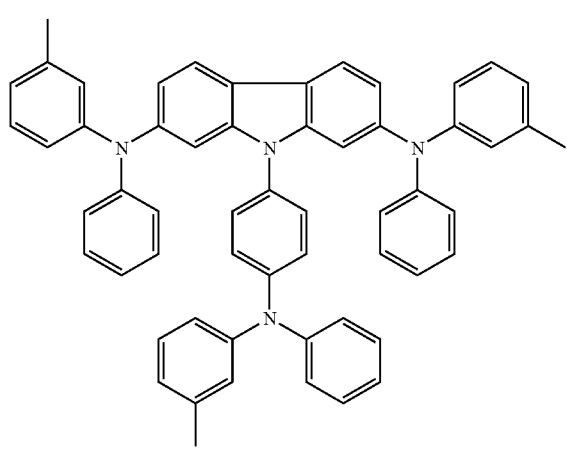
formula 197
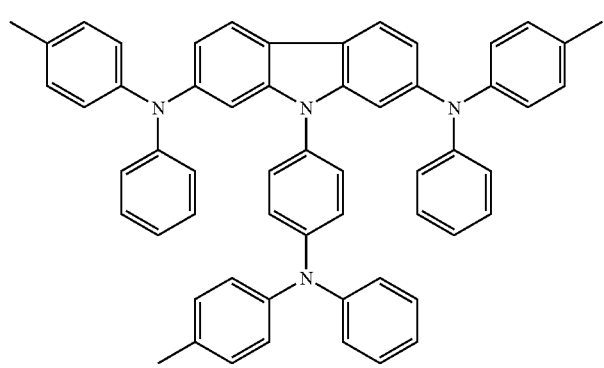
formula 198
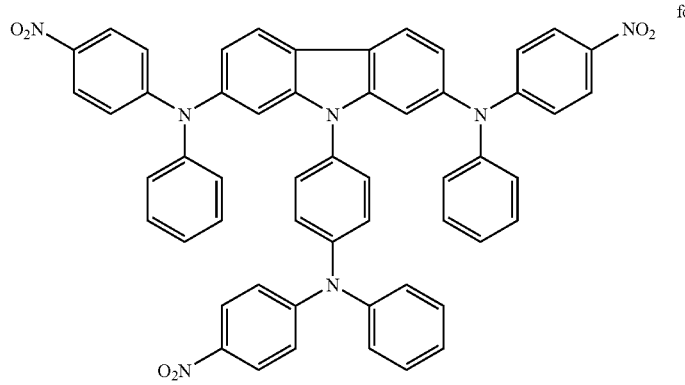
formula 199

-continued
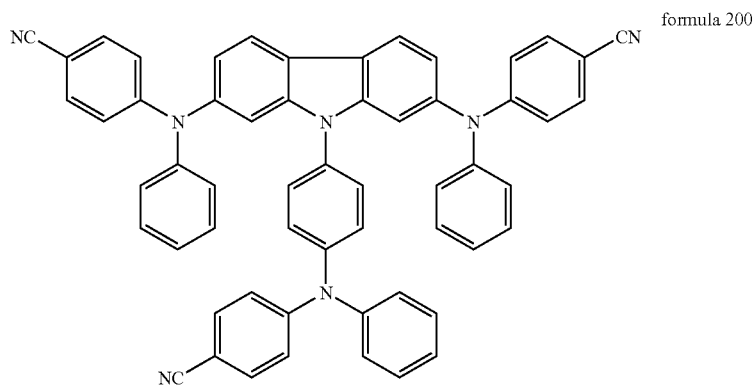
formula 200
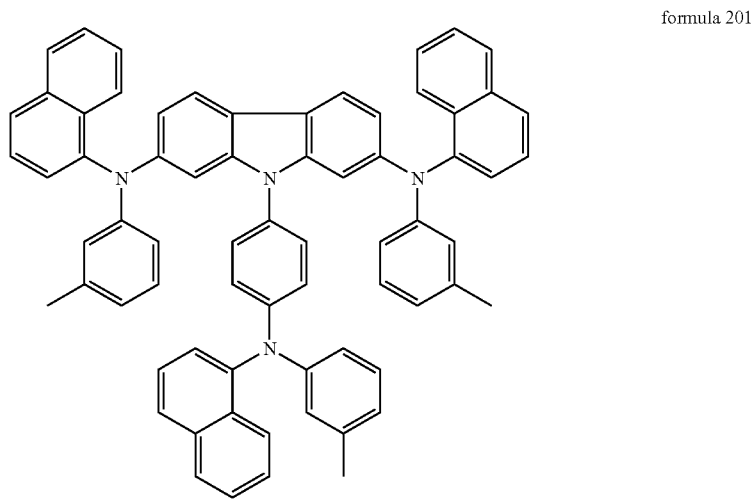
formula 201
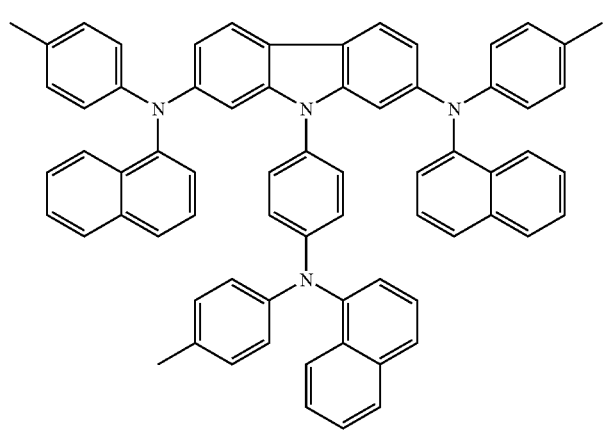
formula 202

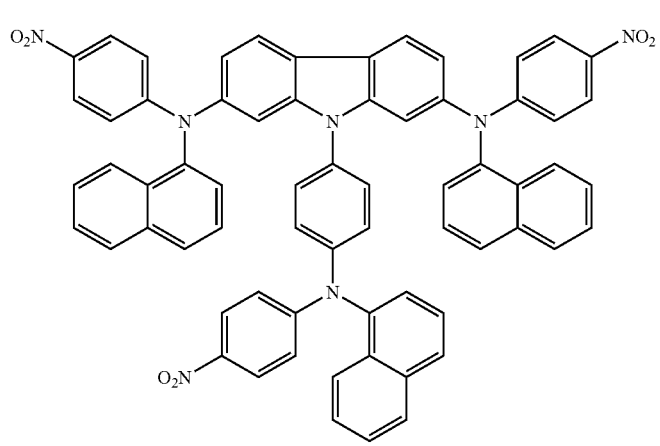
formula 203
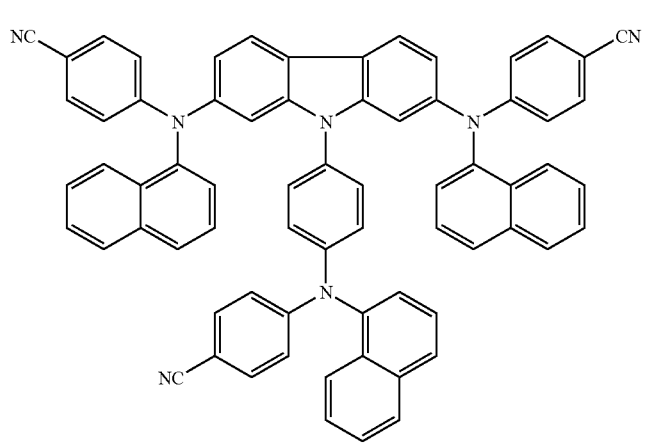
formula 204
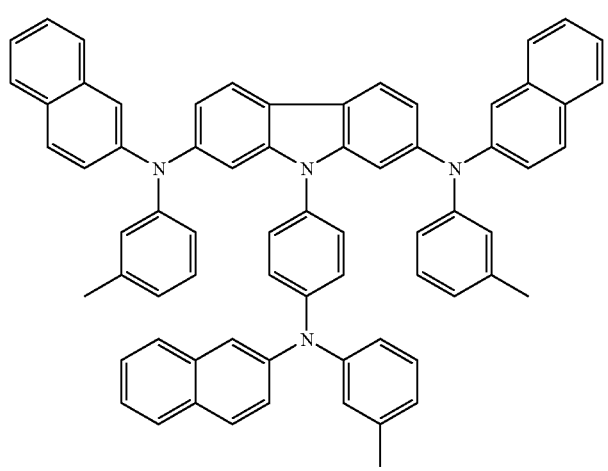
formula 205

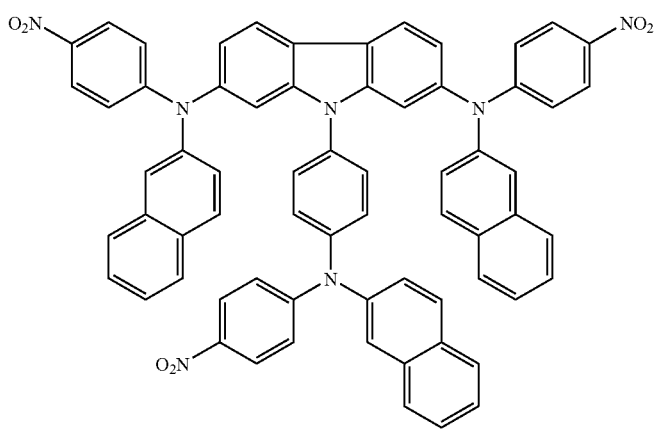
formula 206
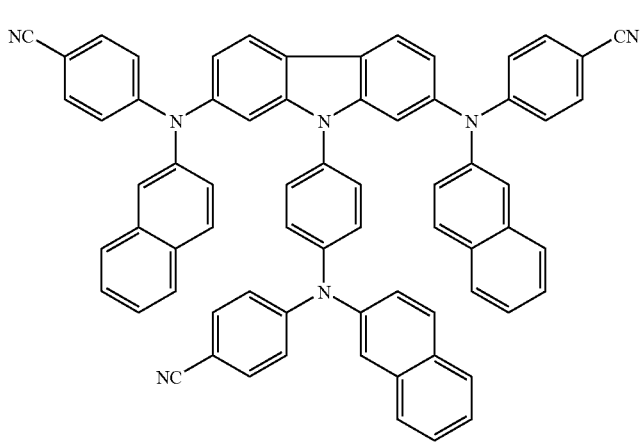
formula 207
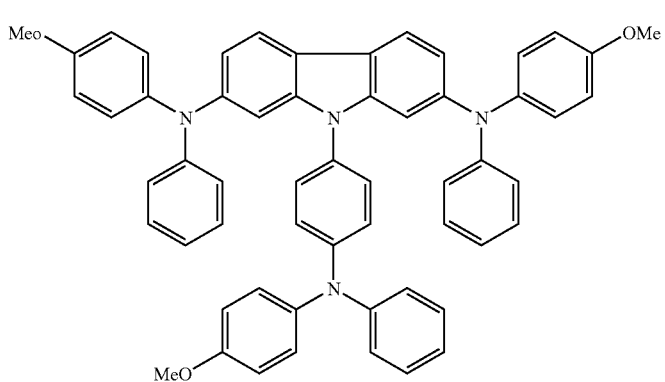
formula 208

-continued
formula 209
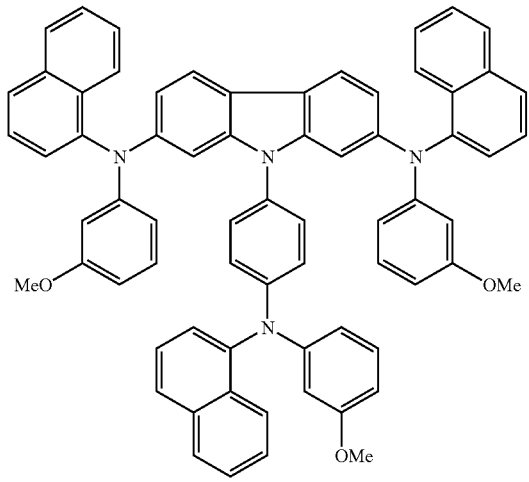
formula 210
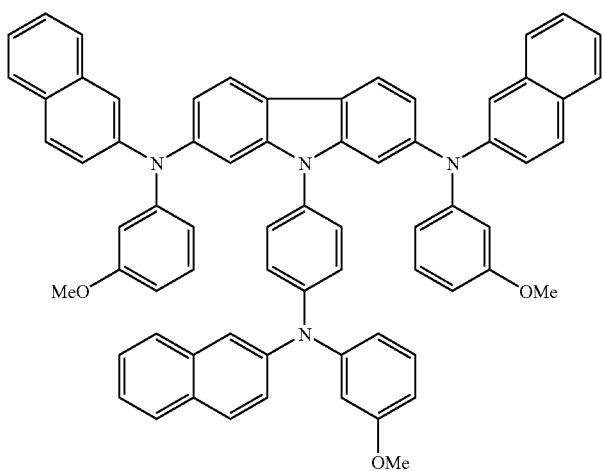
formula 211
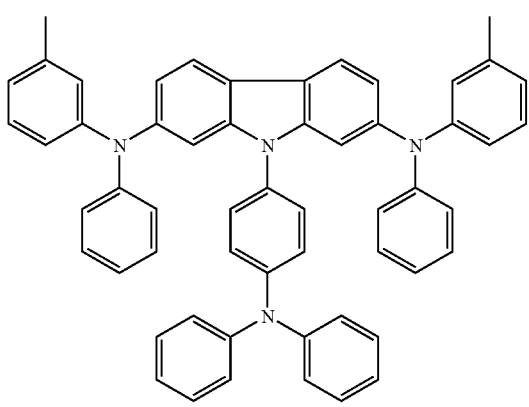

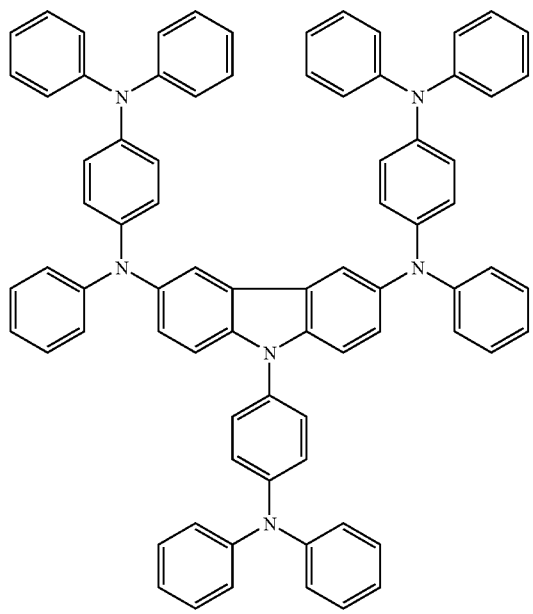
formula 212
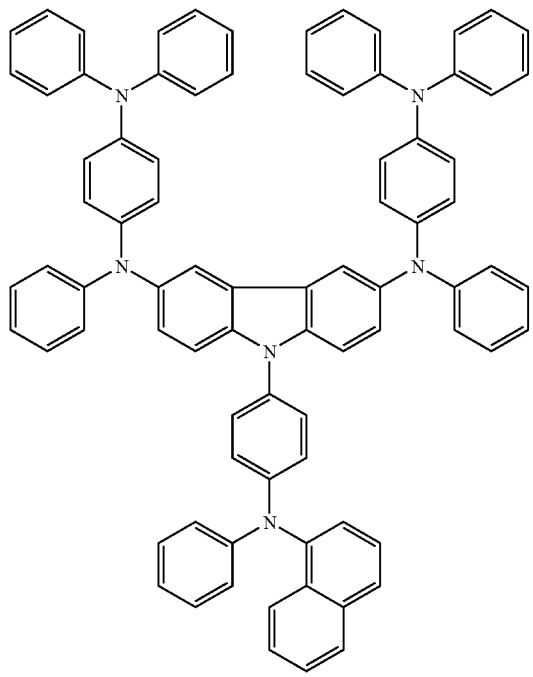
formula 213

-continued
formula 214
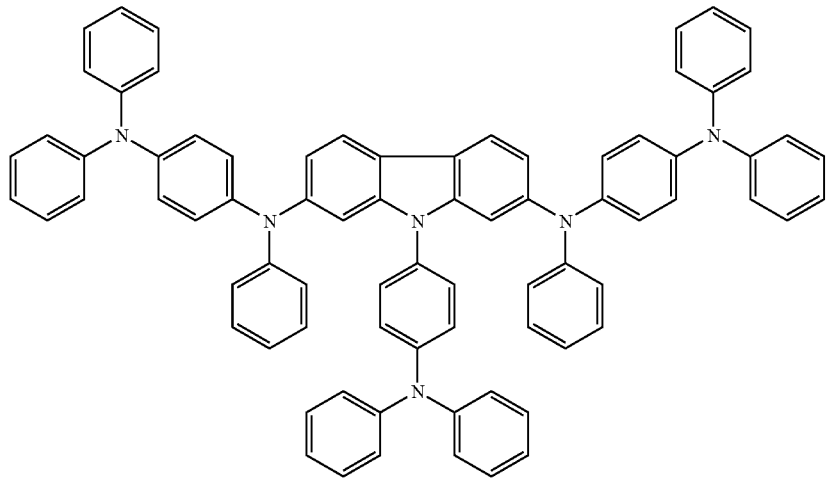
formula 215
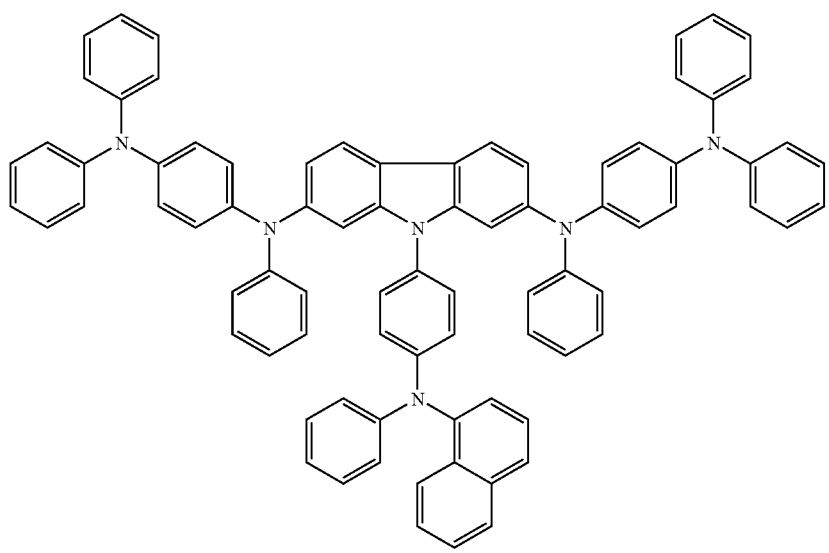
formula 216
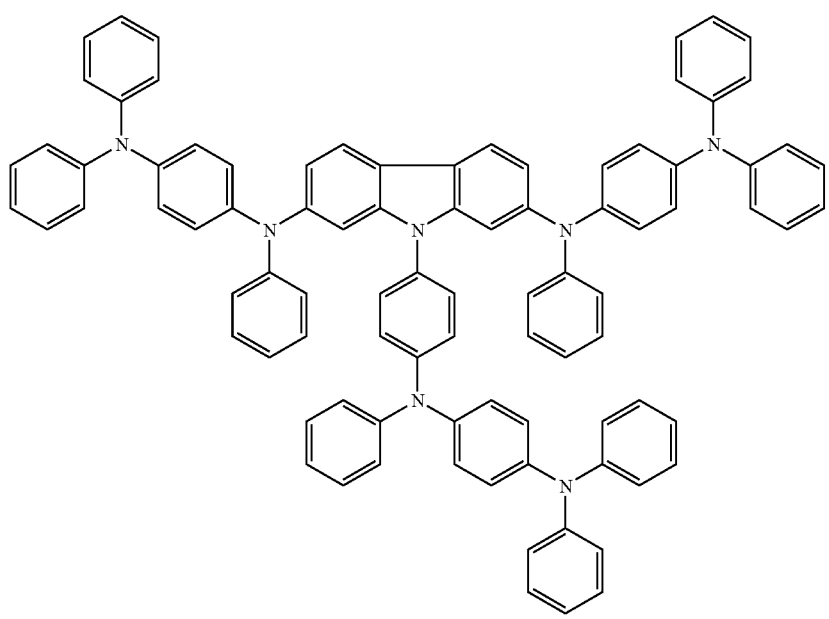

-continued
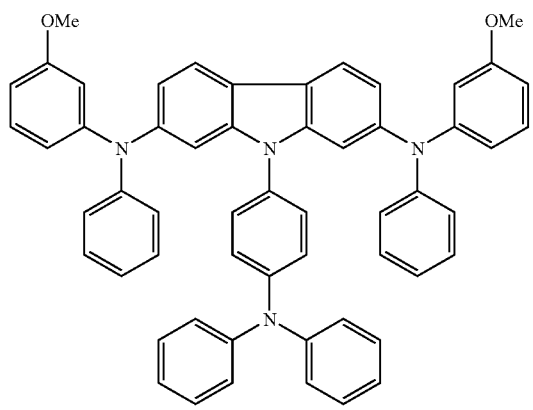
formula 217
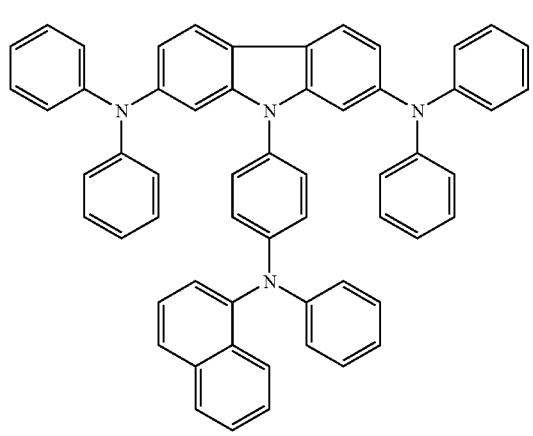
formula 218
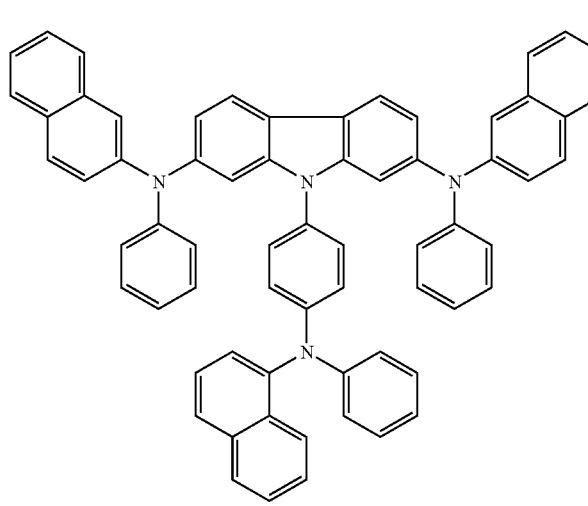
formula 219 formula 220
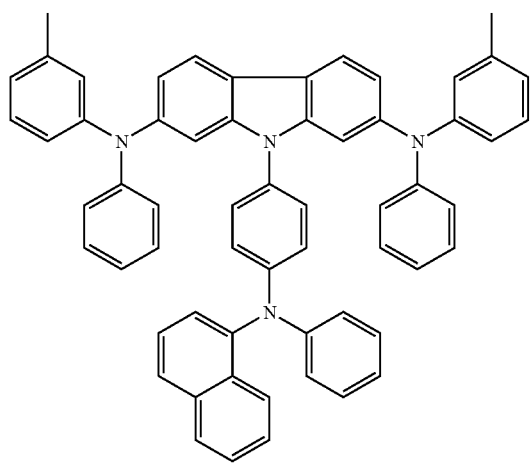
formula 221
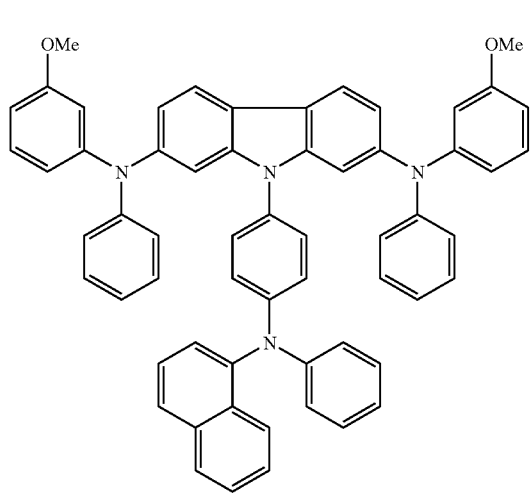
formula 222
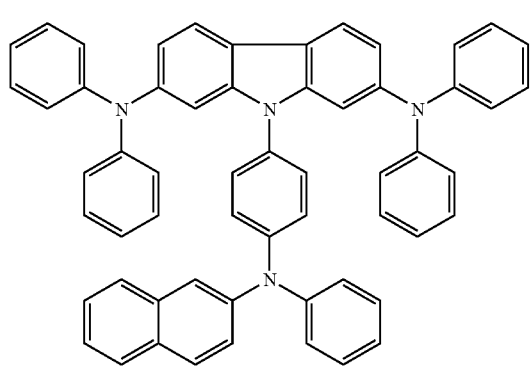

-continued
formula 223
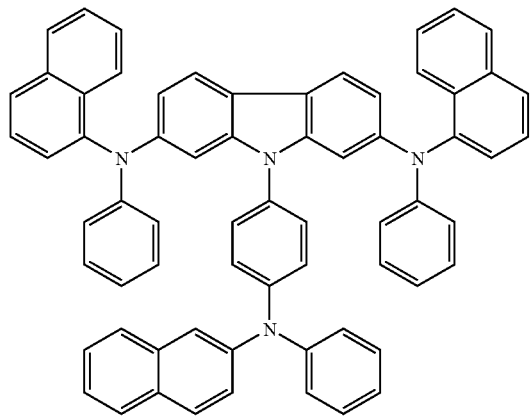
formula 224
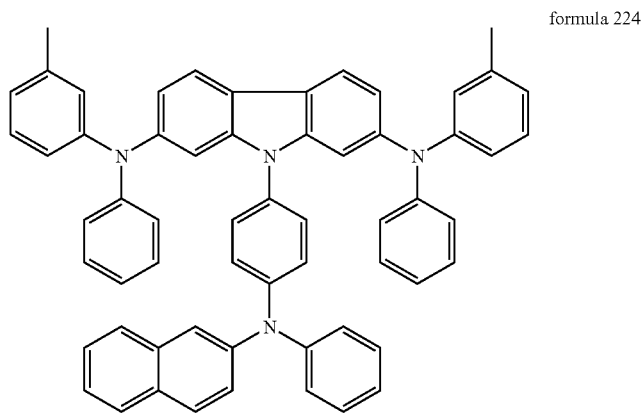
formula 225
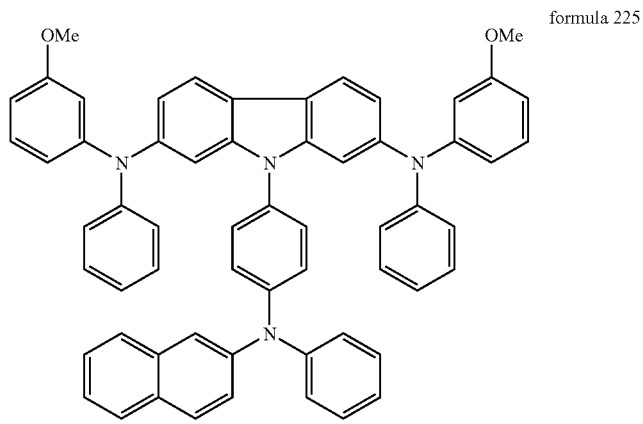

-continued
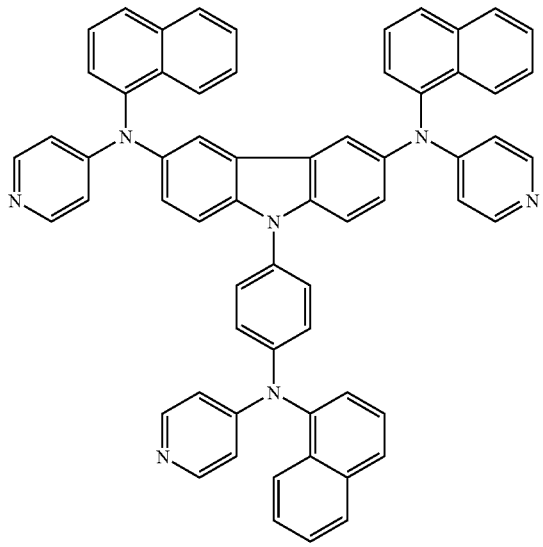
formula 226
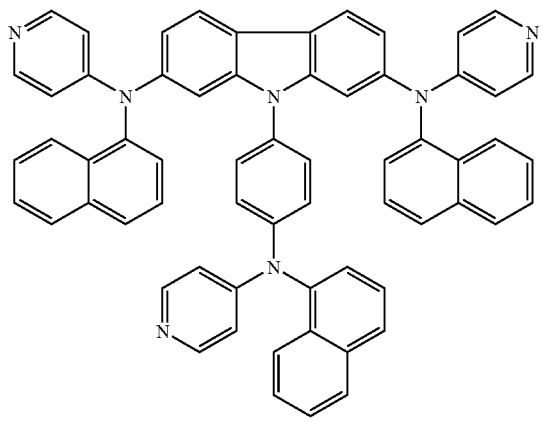
formula 227
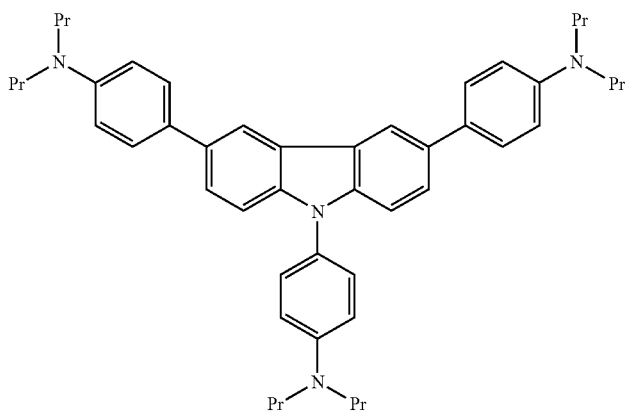
formula 228

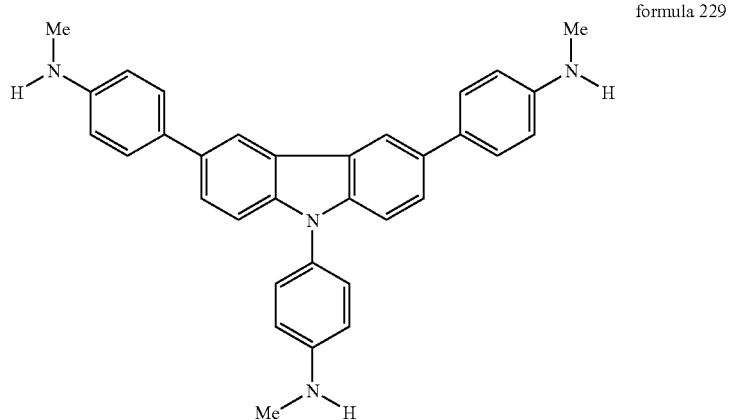
formula 229
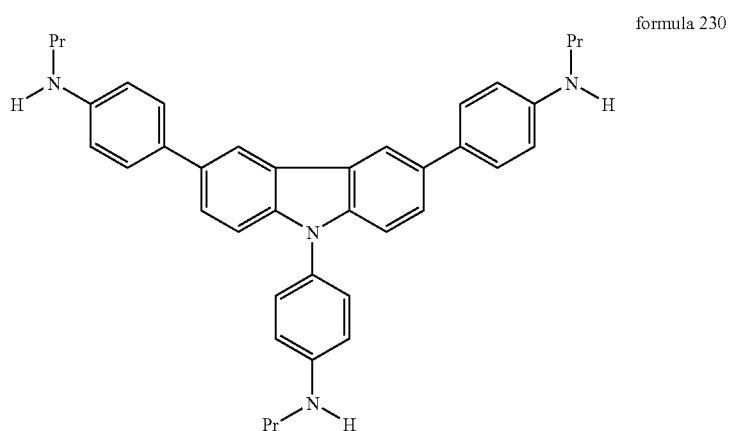
formula 230
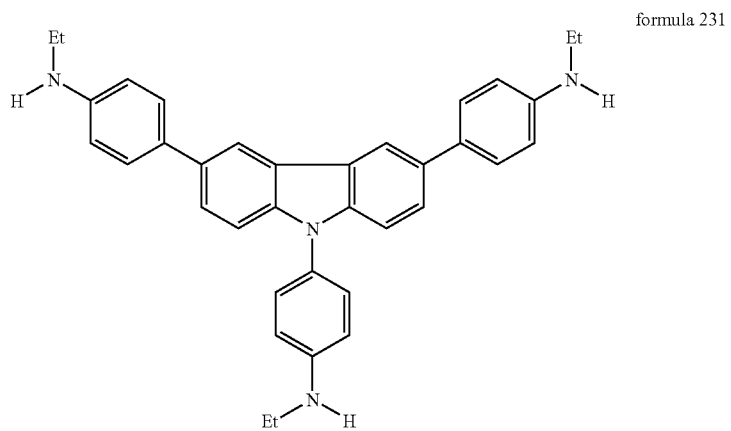
formula 231

-continued
formula 232
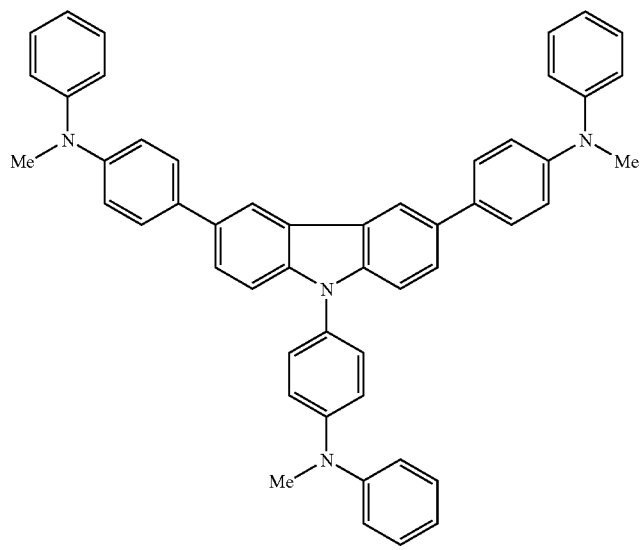
formula 233
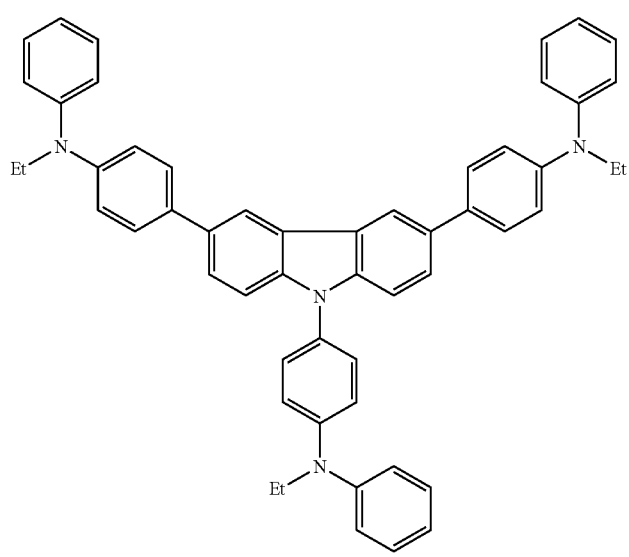
formula 234
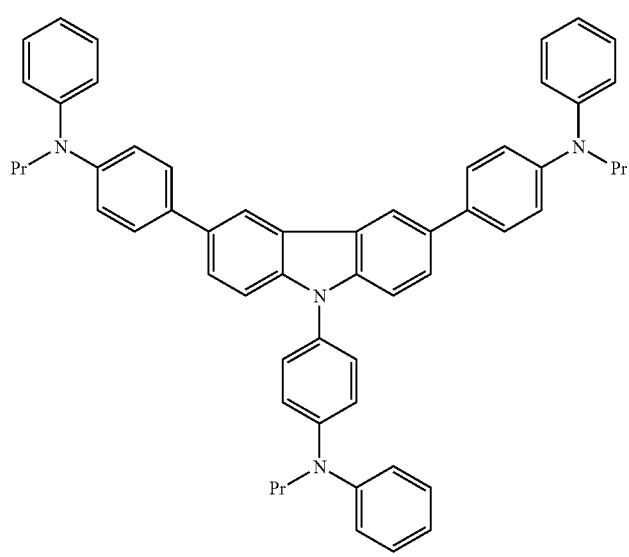

formula 235
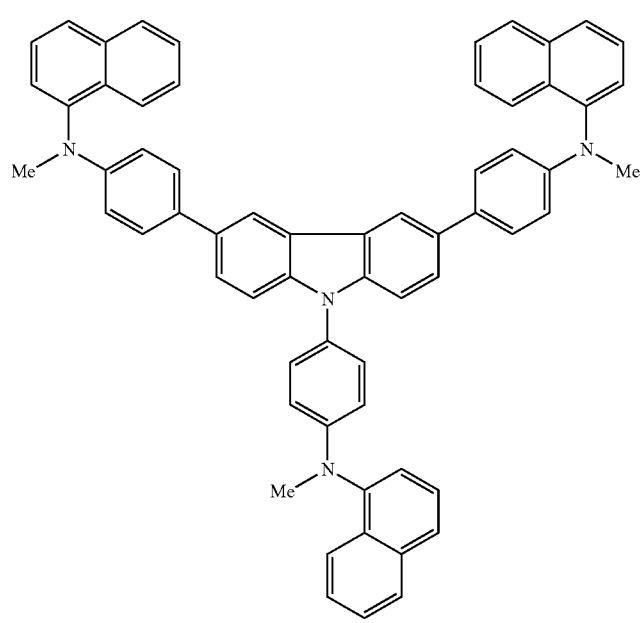
formula 236
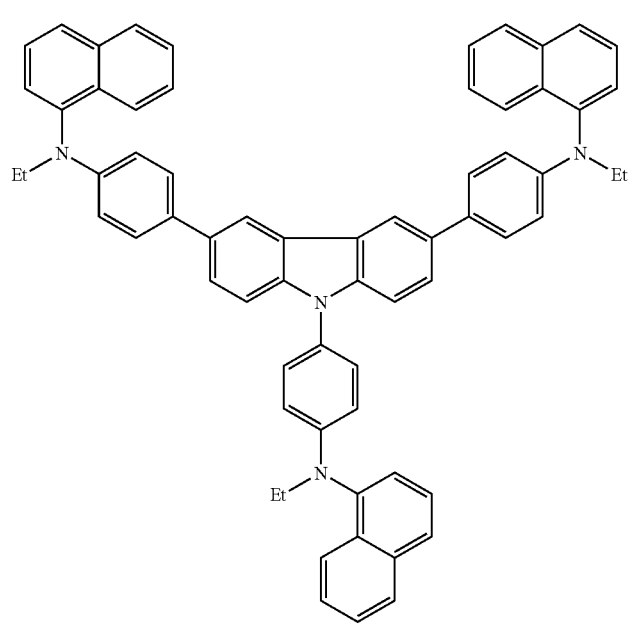

-continued
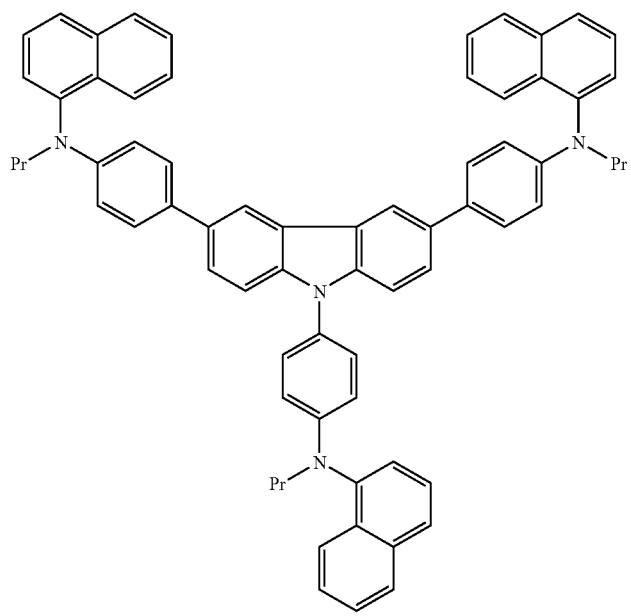
formula 237
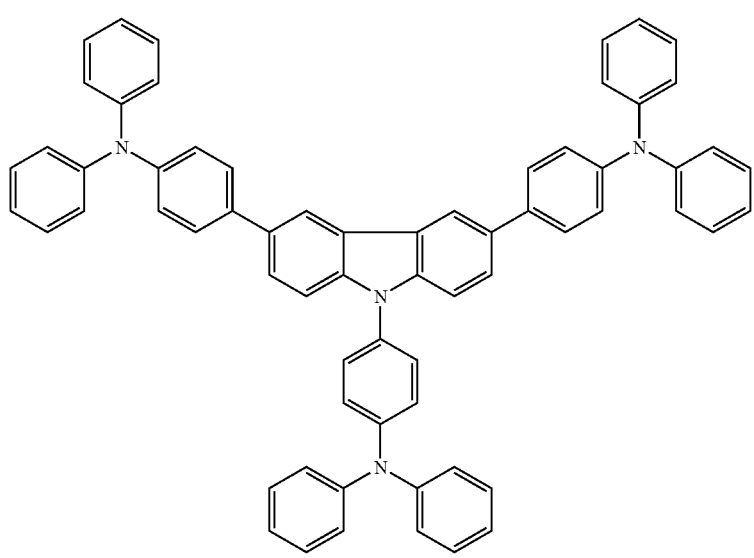
formula 238

-continued
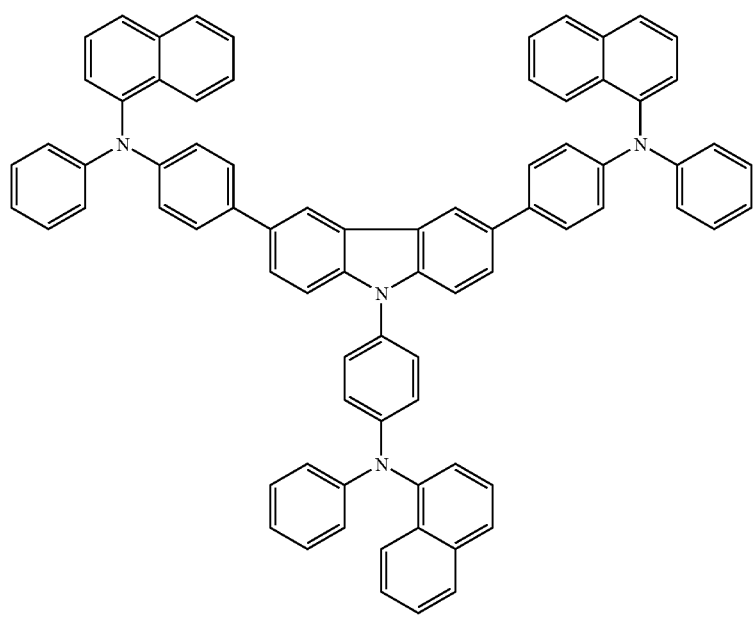
formula 239
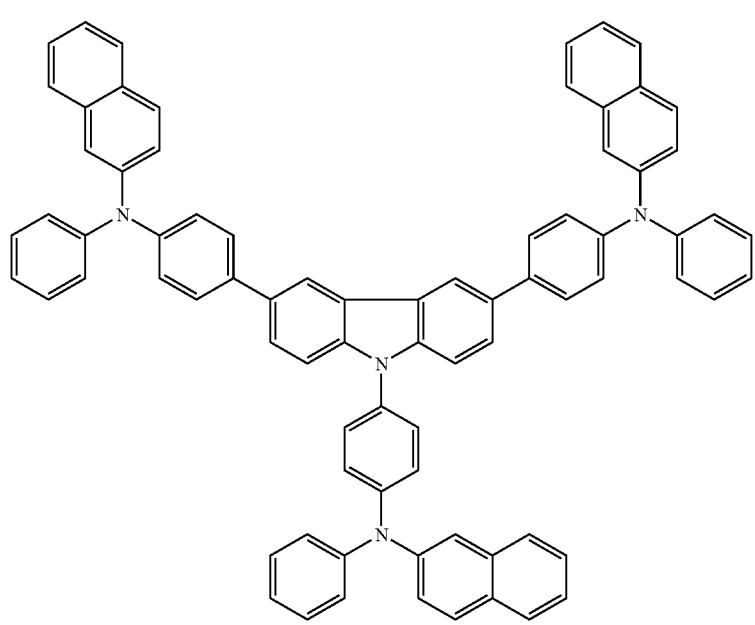
formula 240

-continued
formula 241
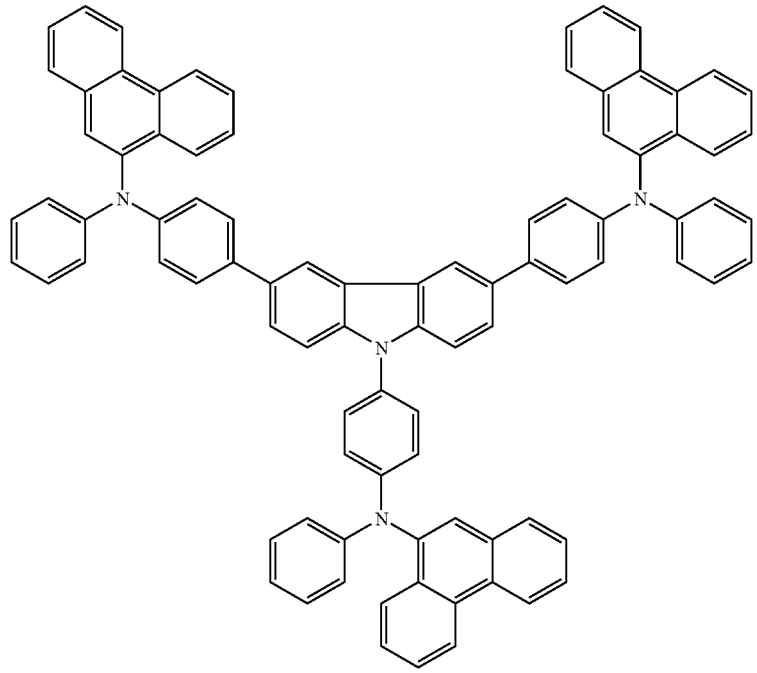
formula 242
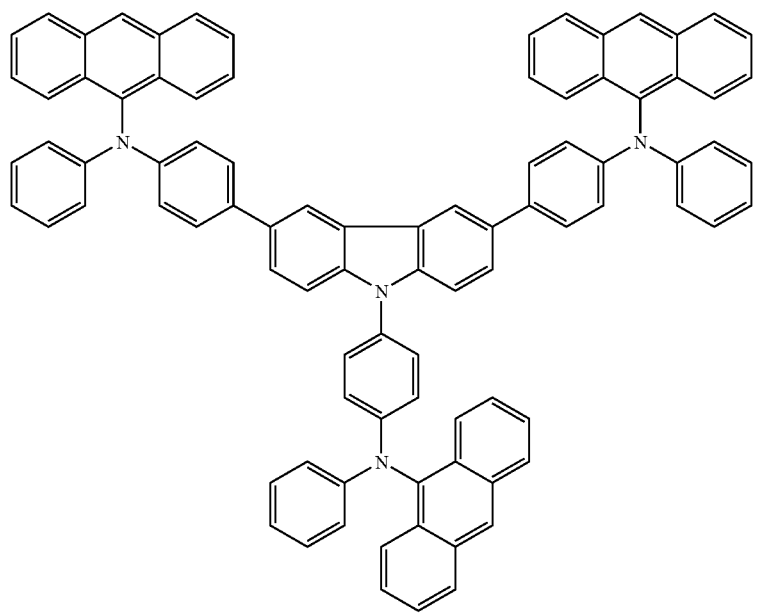

formula 243
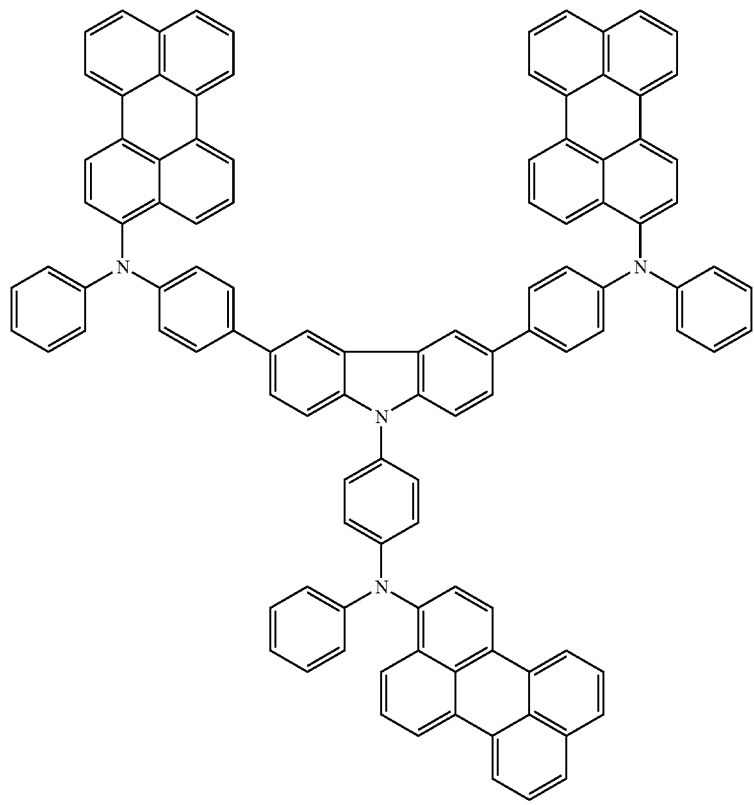
formula 244
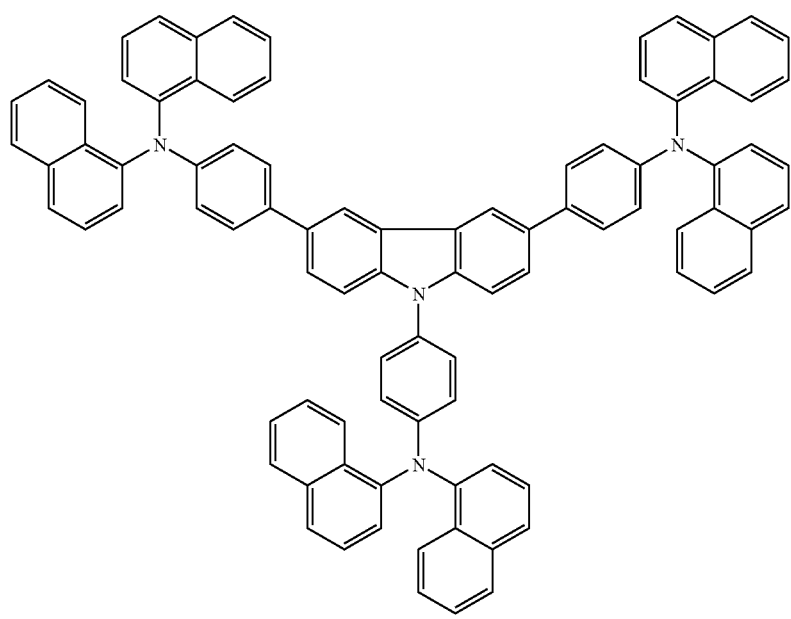

formula 245
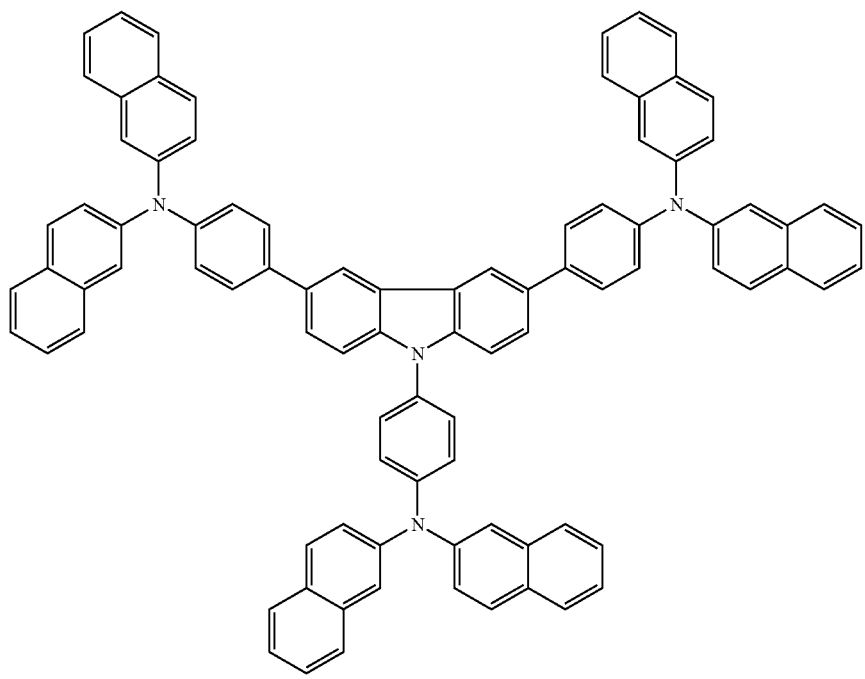
formula 246
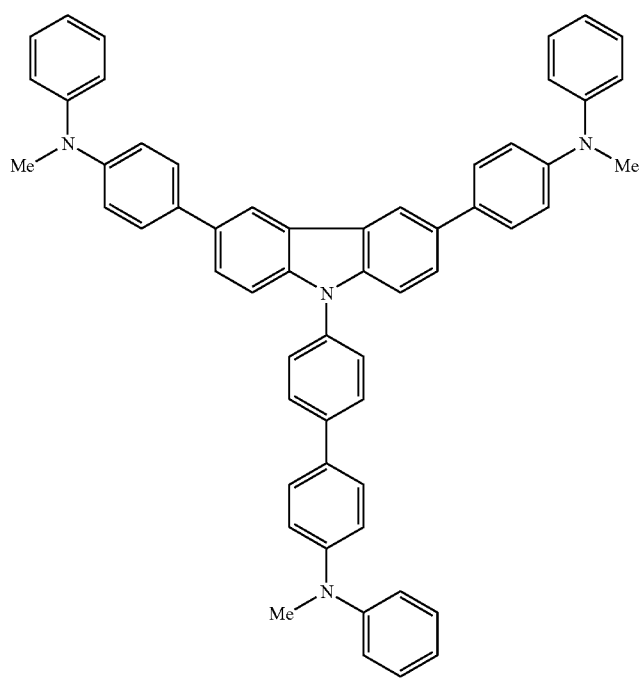

-continued
formula 247
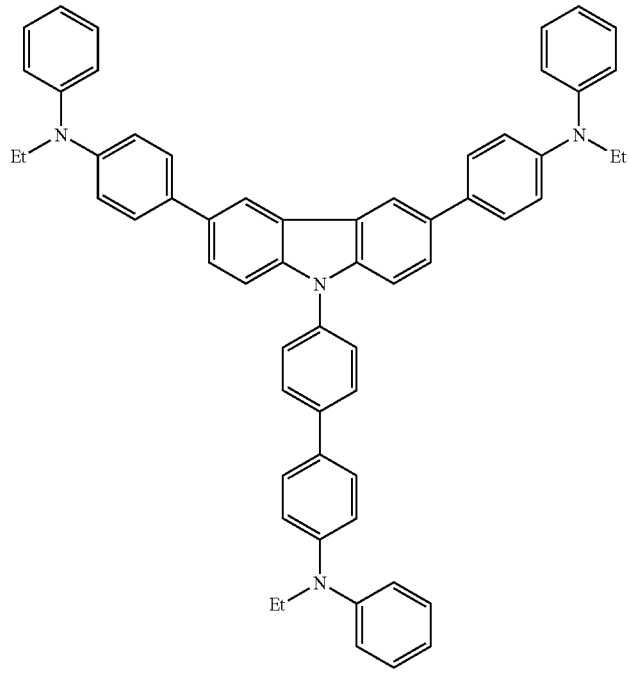
formula 248
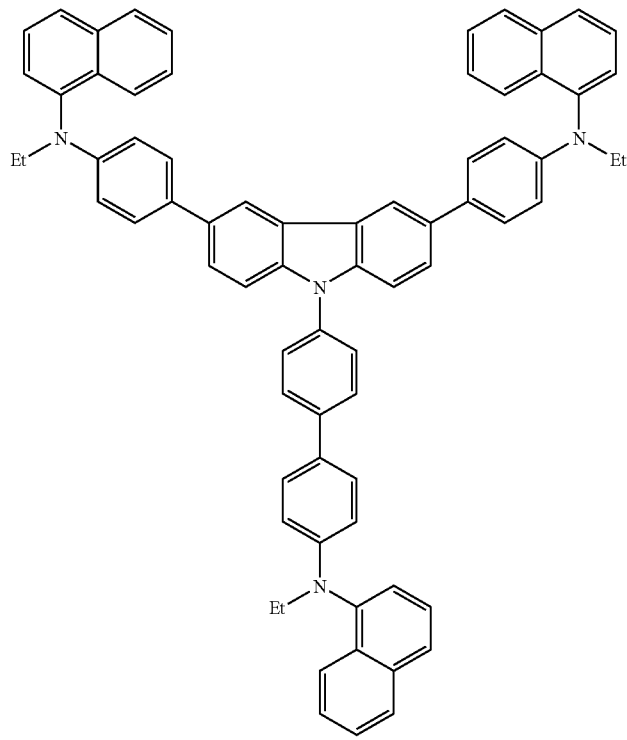

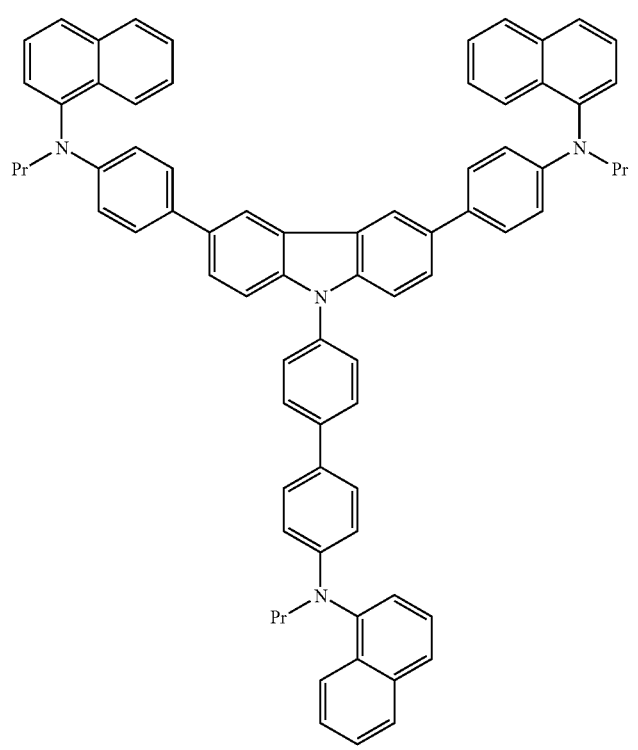
formula 249
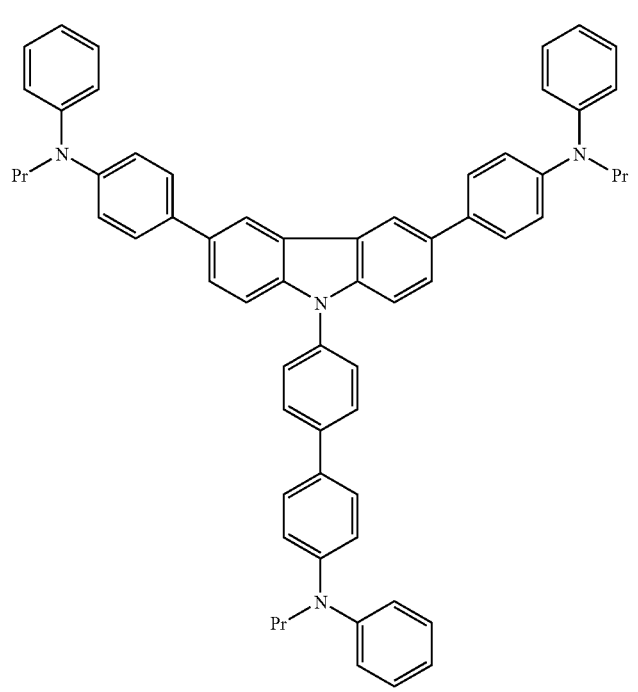
formula 250 formula 251
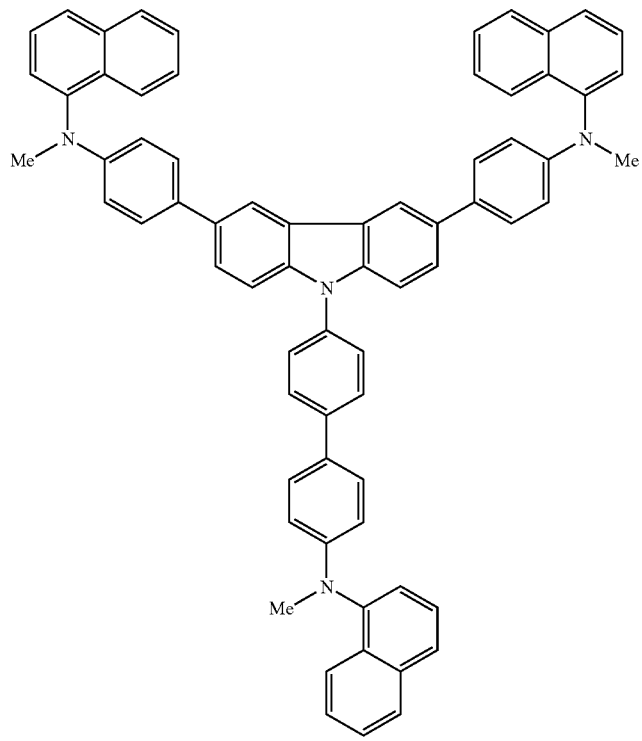
formula 252
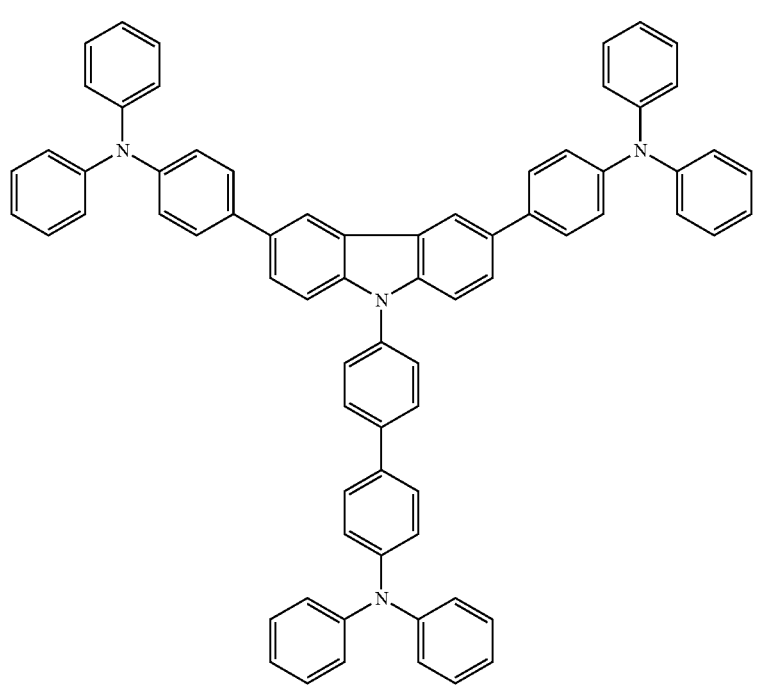

formula 253
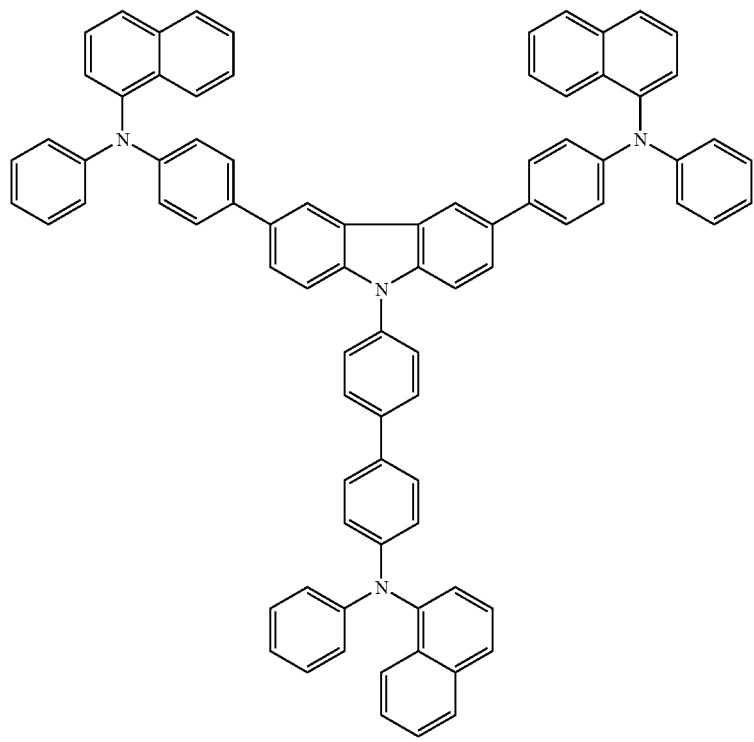
formula 254
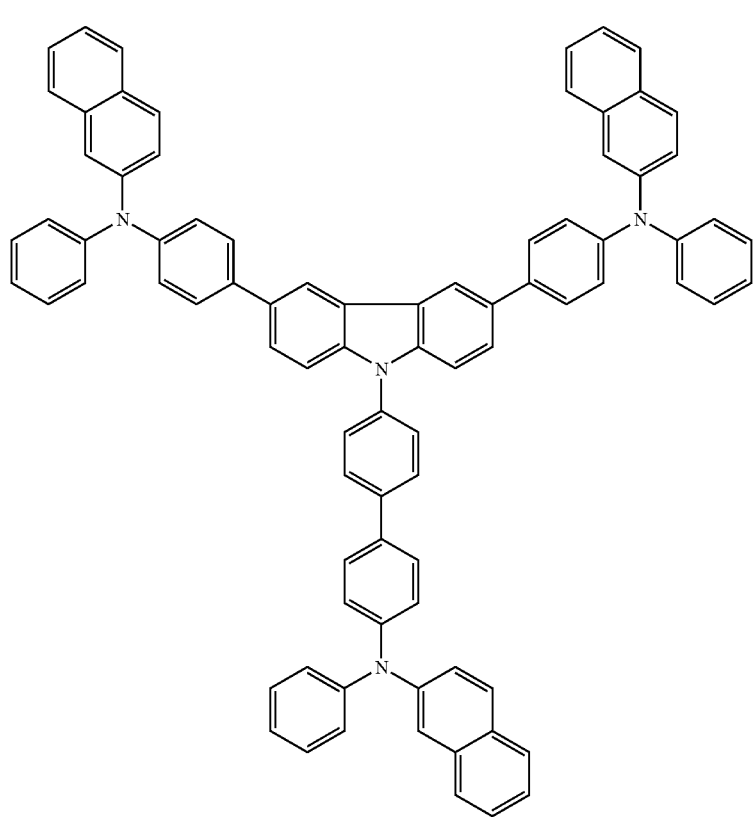

-continued
formula 255
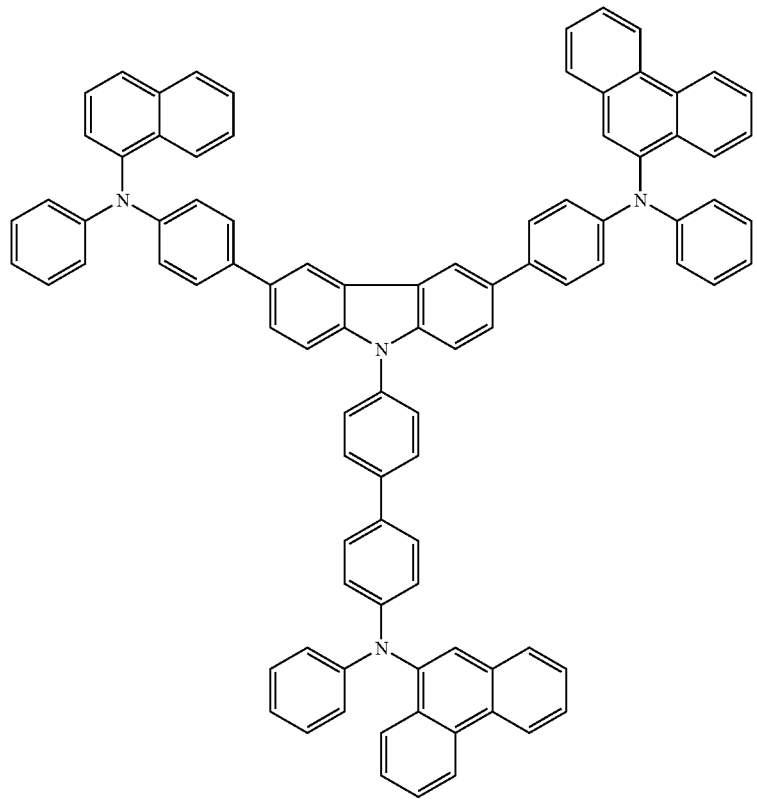
formula 256
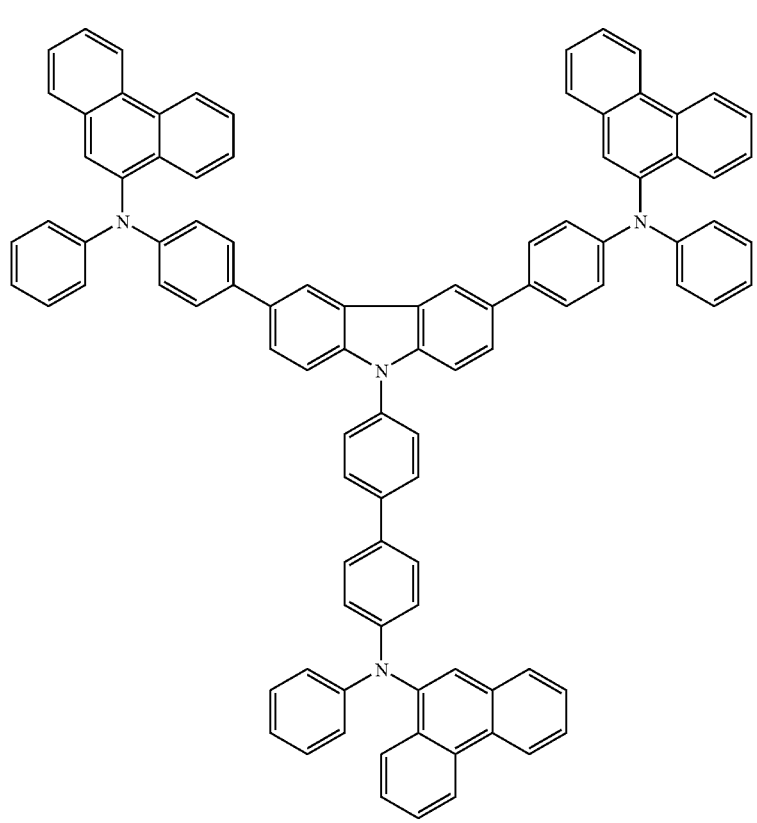

-continued
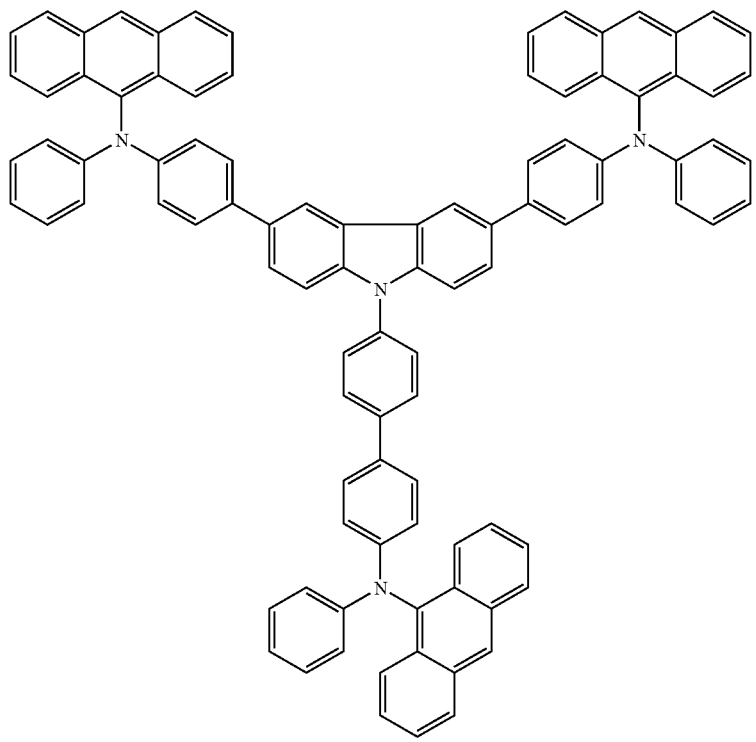
formula 257
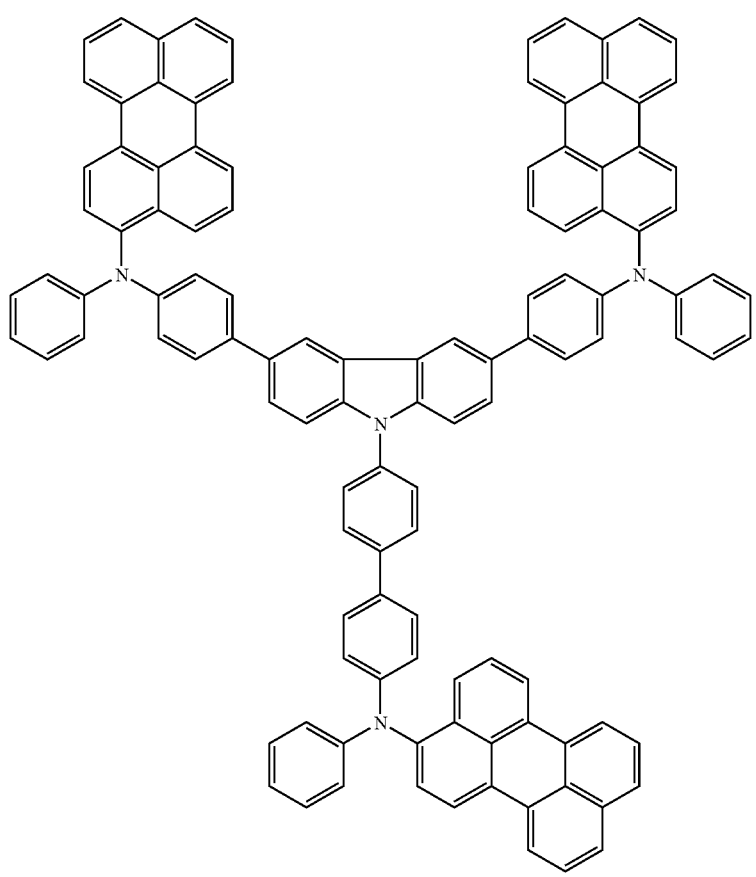
formula 258

-continued

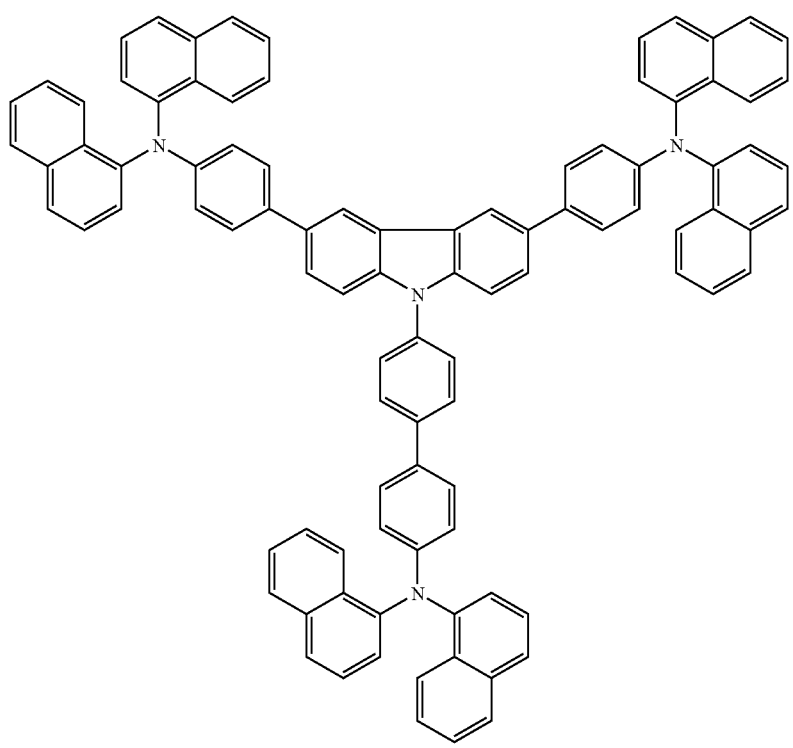

formula 259

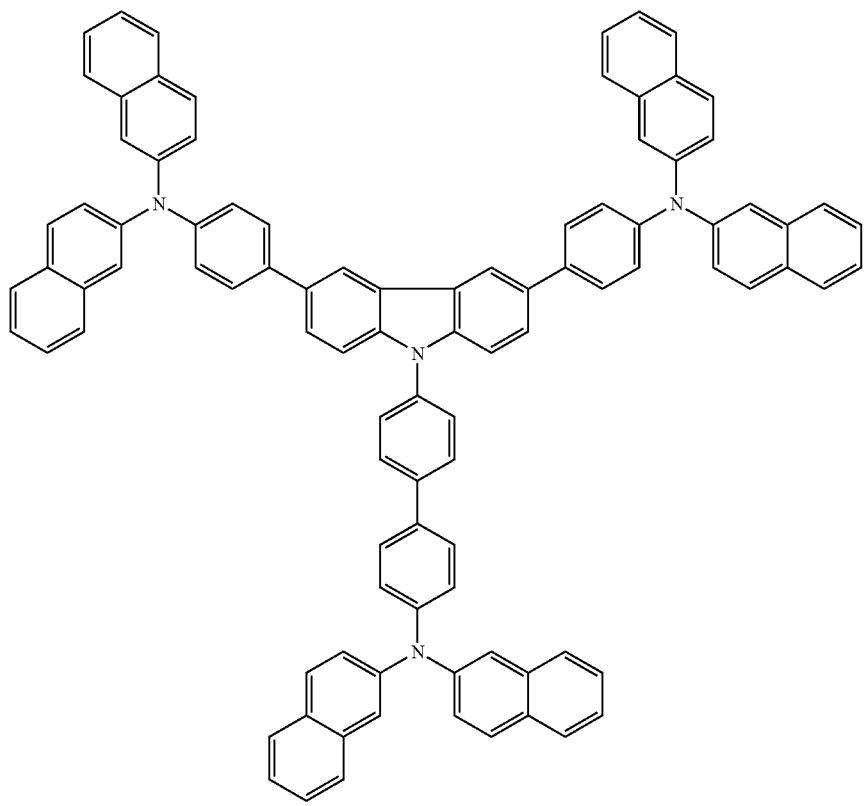

formula 260

The organic compounds represented by the above formulae may be synthesized from their starting materials through three to eight processing steps. In one embodiment of the synthetic process, the above compounds can be prepared from carbazole. First, carbazole is treated with a halogen atom or halogenated benzene to form a starting material substituted with halogen or halogenated benzene. Next, a compound corresponding to each of A, B, C, D or R1-R10 of the above formula 1 is introduced to the starting material to substitute for the halogen atom of the starting material, thereby forming a desired compound. In the process, a catalyst may be used. There is no particular limitation in the selection of a halogen atom. Generally, bromine, chlorine, etc. may be used.

It will be appreciated that a suitable synthetic process can be designed by one skilled in the art with reference to the structural formula of the compound according to the present invention.

Synthetic processes for some compounds will be described in the following Examples.

FIG. 1 shows a preferred embodiment of the organic electroluminescence device. The organic compound according to the present invention can be used in at least one organic material layer disposed between an anode and cathode, i.e., at least one layer selected from the group consisting of a hole injection layer, hole transport layer and a light emitting layer. More particularly, the compound can be used in a hole injection layer, hole transport layer, hole injection/hole transport layer, or a hole injection/hole transport/light emitting layer.

Meanwhile, it is known that a host material having a large energy gap, for example CBP, is doped with an organic phosphorescent material such as phenylpyridine iridium to provide a high-efficiency device successfully. This indicates that limited efficiency by the singlet-singlet transition may be overcome by triplet-triplet transition. Therefore, when the novel hole injection material according to the present invention is applied as a host material for phosphorescence-based luminescence, it will be possible to obtain an organic electroluminescence device having significantly improved luminous efficiency and lifespan (C. Adachi, M. A. Baldo, and S. R. Forrest, *Applied Physics Letter*, 77, 904, 2000., C. Adachi, M. A. Baldo, S. R. Forrest, S. Lamansky, M. E. Thompsom, and R. C. Kwong, *Applied Physics Letter*, 78, 1622, 2001).

According to the present invention, the organic electroluminescence devices comprising the compounds represented by the above formulae 1-3 and 28-260 in organic material layers can provide significantly improved efficiency and lifespan and show excellent stability.

BEST MODE FOR CARRYING OUT THE INVENTION

Hereinafter, synthetic processes of the organic compound represented by the above formula 1 and manufacture of organic electroluminescence devices using the same will be described in more detail through Examples and Comparative Examples. It is to be understood that the following examples are illustrative only and the present invention is not limited thereto.

In order to prepare the compound represented by the above formula 1, the compounds represented by the following formulae a-h may be used as starting materials.

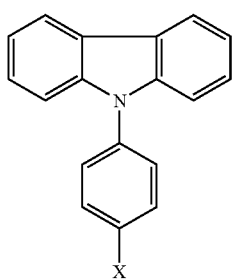

[formula a]

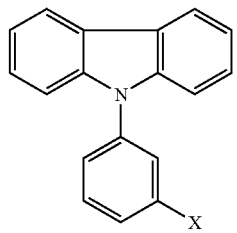

[formula b]

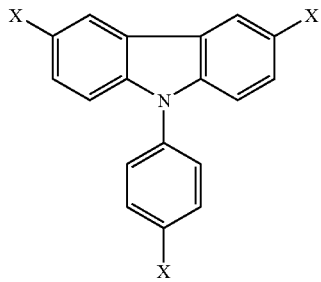

[formula c]

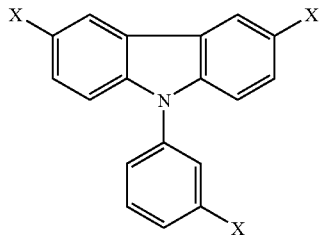

[formula d]

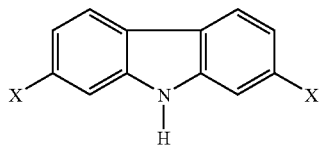

[formula e]

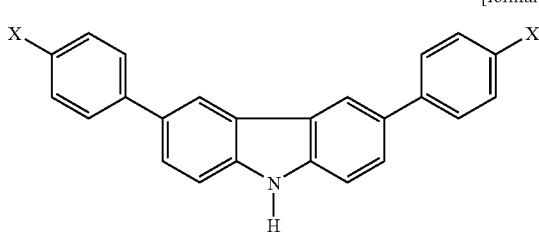

[formula f]

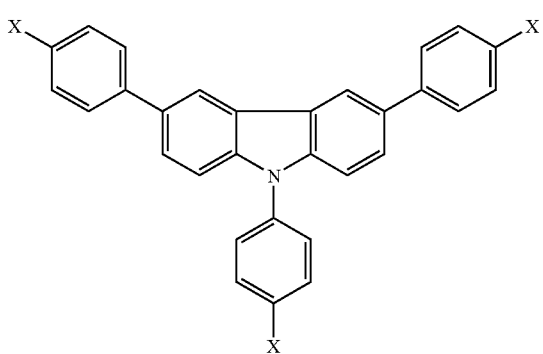

[formula g]

-continued

[formula h]

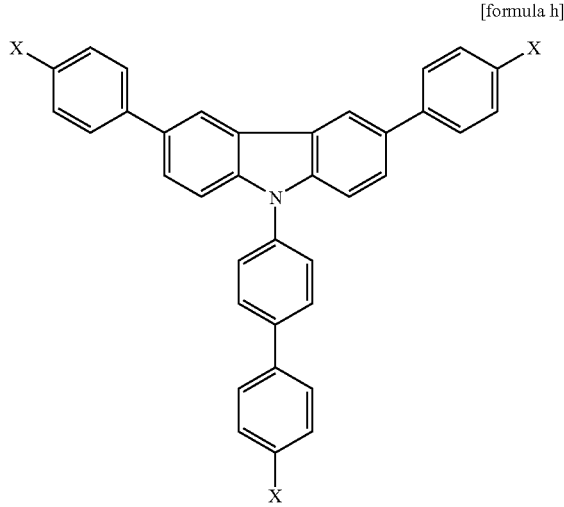

In the above formulae a-h, X represents a halogen atom. There is no particular limitation in the selection of a halogen atom. In the following examples, the compounds represented by formulae a-h wherein X is Br are selected as starting materials. The starting materials are prepared according to the following Preparation Examples 1 to 8.

Preparation Example 1

Preparation of the Starting Material Represented by Formula a

Carbazole (5.00 g, 29.9 mmol), 1-bromo-4-iodobenzene (9.30 g, 32.9 mmol), $K_2CO_3$ (16.5 g, 120 mmol), Cu (3.80 g, 59.8 mmol) and 18-crown-6 (0.40 g, 1.49 mmol) were refluxed in 50 ml of o-dichlorobenzene for 15 hours. After the completion of the reaction, the reaction mixture was cooled to room temperature and the precipitate was filtered off. The filtrate was washed with water three times, dried over $MgSO_4$ and concentrated under reduced pressure. The reaction mixture was purified by column chromatography to obtain the compound represented by formula a as starting material (5.85 g, 61%). $^1$H NMR (300 MHz, $CDCl_3$) 8.13-8.11 (d, 2H), 7.71-7.69 (d, 2H), 7.44-7.21 (m, 8H); MS [M+H] 322.

Preparation Example 2

Preparation of the Starting Material Represented by Formula b

Carbazole (5.00 g, 29.9 mmol), 1-bromo-3-iodobenzene (9.30 g, 32.9 mmol), $K_2CO_3$ (16.5 g, 120 mmol), Cu (3.80 g, 59.8 mmol) and 18-crown-6 (0.40 g, 1.49 mmol) were refluxed in 50 ml of o-dichlorobenzene for 15 hours. After the completion of the reaction, the reaction mixture was cooled to room temperature and the precipitate was filtered off. The filtrate was washed with water three times, dried over $MgSO_4$ and concentrated under reduced pressure. The reaction mixture was purified by column chromatography to obtain the compound represented by formula b as starting material (5.85 g, 61%). MS [M+H] 322.

Preparation Example 3

Preparation of the Starting Material Represented by Formula c

The starting material represented by formula a (1.50 g, 4.66 mmol) was dissolved in dimethylformaide (DMF, 20 ml) and N-bromosuccinimide (NBS, 1.82 g, 10.2 mmol) was added thereto. The reaction mixture was reacted at 50-60° C. for 2 hours and water (15 ml) was added thereto. The resultant precipitate was filtered, washed with water and then recrystallized in dichloromethane/n-hexane to obtain the compound represented by formula c as starting material (1.93 g, 86%). $^1$H NMR (300 MHz, $CDCl_3$) 8.17 (s, 2H), 7.75-7.74 (d, 2H), 7.51-7.48 (d, 2H), 7.38-7.35 (d, 2H), 7.22-7.19 (d, 2H); MS [M+H] 478.

Preparation Example 4

Preparation of the Starting Material Represented by Formula d

The starting material represented by formula b (1.50 g, 4.66 mmol) was dissolved in dimethylformaide (DMF, 20 ml) and N-bromosuccinimide (NBS, 1.82 g, 10.2 mmol) was added thereto. The reaction mixture was reacted at 50-60° C. for 2 hours and water (15 ml) was added thereto. The resultant precipitate was filtered, washed with water and then recrystallized in dichloromethane/n-hexane to obtain the compound represented by formula d as starting material (1.93 g, 86%). MS [M+H] 478.

Preparation Example 5

Preparation of the Starting Material Represented by Formula e 2,5-dibromonitrobenzene (12.0 g, 42.7 mmol) was dissolved in dimethylformamide (DMF, 80 ml), Cu (6.0 g, 93.94 mmol) was added thereto, and then the reaction mixture was reacted at 120° C. for 3 hours. The reaction mixture was cooled to room temperature, the insoluble material was filtered off and the filtrate was concentrated. The resultant product was recrystallized in ethanol to obtain 4,4'-dibromo-2,2'-dinitrobiphenyl (10.2 g, 60%). MS [M+] 354.

4,4'-dibromo-2,2'-dinitrobiphenyl (6.1 g, 15.17 mmol) was stirred in HCl 30 ml/EtOH 75 ml, Sn powder (7.2 g, 60.68 mmol) was added thereto, and then the reaction mixture was refluxed for 24 hours. Next, the reaction mixture was cooled to room temperature, neutralized with 10% NaOH solution, and then recrystallized in ethanol to obtain 4,4'-dibromo-2, 2'-diaminobiphenyl (3.5 g, 67%). MS [M+H] 341.

4,4'-dibromo-2,2'-diaminobiphenyl (3.5 g, 10.23 mmol) was dissolved in phosphoric acid and heated at 190° C. for 24 hours. The reaction mixture was cooled to room temperature and then $NaHCO_3$ (aq) was gradually added thereto to form a solid. Then, the solid was filtered to obtain 2,7-dibromocarbazole (2.2 g, 66%), the compound represented by formula e. MS [M+] 323.

Preparation Example 6

Preparation of the Starting Material Represented by Formula f 3,6-dibromocarbazole (1.63 g, 5.00 mmol), 4-bromophenylboronic acid (2.95 g, 15.0 mmol), 2M potassium carbonate solution (10 ml) and tetrakis(triphenylphosphine)palladium (29.0 mg, 0.25 mmol) were added to 100 ml of THF. The reaction mixture was stirred under reflux for about 24 hours and then cooled to room temperature. Next, the reaction mixture was introduced into toluene and brine and the toluene layer was separated. The separated layer was dried over $MgSO_4$, filtered and concentrated. Then, the reaction mixture was purified by column chromatography to obtain the compound represented by formula f as starting material (1.15 g, 48%). $^1$H NMR (300 MHz, CDCl$_3$) 10.1 (s, 1H), 7.77 (s, 2H), 7.49-7.46 (m, 6H), 7.37 (d, 4H), 7.30 (d, 2H); MS [M+H] 476.

Preparation Example 7

Preparation of the Starting Material Represented by Formula g

The compound represented by formula f (1.43 g, 3.00 mmol), 1-bromo-4-iodobenzene (1.87 g, 6.60 mmol), K$_2$CO$_3$ (3.32 g, 24 mmol), Cu (0.76 g, 12.0 mmol) and 18-crown-6 (0.08 g, 0.30 mmol) were refluxed in 10 ml of o-dichlorobenzene for 15 hours. After the completion of the reaction, the reaction mixture was cooled to room temperature and the precipitate was filtered off. The filtrate was washed with water three times, dried over MgSO$_4$ and concentrated under reduced pressure. The reaction mixture was purified by column chromatography to obtain the compound represented by formula g as starting material (1.02 g, 54%). $^1$H NMR (300 MHz, CDCl$_3$) 7.77 (s, 2H), 7.49-7.40 (m, 8H), 7.37 (d, 4H), 7.30 (d, 2H), 7.20 (d, 2H); MS [M+H] 630.

Preparation Example 8

Preparation of the Starting Material Represented by Formula h

The compound represented by formula c (2.40 g, 5.00 mmol), 4-bromophenylboronic acid (3.94 g, 20.0 mmol), 2M potassium carbonate solution (20 ml) and tetrakis(triphenylphosphine)palladium (58.0 mg, 0.50 mmol) were added to 100 ml of THF. The reaction mixture was stirred under reflux for about 24 hours and then cooled to room temperature. Next, the reaction mixture was introduced into toluene and brine and the toluene layer was separated. The separated layer was dried over MgSO$_4$, filtered and concentrated. Then, the reaction mixture was purified by column chromatography to obtain the compound represented by formula h as starting material (2.09 g, 59%). 1H NMR (300 MHz, CDCl$_3$) 7.77 (s, 2H), 7.50-7.46 (m, 10H), 7.37 (m, 6H), 7.30 (m, 4H); MS [M+H] 706.

Example 1

Preparation of the Compound Represented by Formula 61

The compound represented by formula c (1.00 g, 2.08 mmol), diphenylamine (1.16 g, 6.86 mmol), Pd$_2$(dba)$_3$ (0.125 g, 0.13 mmol), P(t-Bu)$_3$ (0.04 g, 0.2 mmol) and sodium tert-butoxide (1.80 g, 18.7 mmol) were added to xylene (40 ml) and the mixture was refluxed for about 3 hours. After the completion of the reaction, the reaction mixture was cooled to room temperature and added to a mixed solution of THF and H$_2$O. The organic layer was separated, dried over MgSO$_4$ and then concentrated. The resultant product was purified by column chromatography and recrystallized in ethyl acetate/n-hexane to obtain the compound represented by formula 61 (1.16 g, 75%). $^1$H NMR (300 MHz, CDCl$_3$) 6.78 (d, 2H), 6.96 (m, 14H), 7.12 (m, 6H), 7.25 (s, 2H), 7.5-7.51 (m, 14H), 7.65 (d, 2H); MS [M+H] 745.

Example 2

Preparation of the Compound Represented by Formula 62

The compound represented by formula c (1.00 g, 2.08 mmol), N-phenyl-1-naphthylamine (1.50 g, 6.86 mmol), Pd$_2$(dba)$_3$ (0.125 g, 0.13 mmol), P(t-Bu)$_3$ (0.04 g, 0.2 mmol) and sodium tert-butoxide (1.80 g, 18.7 mmol) were added to xylene (40 ml) and the mixture was refluxed for about 3 hours. After the completion of the reaction, the reaction mixture was cooled to room temperature and added to a mixed solution of THF and H$_2$O. The organic layer was separated, dried over MgSO$_4$ and then concentrated. The resultant product was purified by column chromatography and recrystallized in ethyl acetate/n-hexane to obtain the compound represented by formula 62 (1.46 g, 79%). $^1$H NMR (300 MHz, CDCl$_3$) 6.78 (d, 2H), 6.96-7.12 (m, 14H), 7.25 (s, 2H), 7.5-7.51 (m, 8H), 7.65-7.66 (m, 8H), 7.80-7.81 (m, 6H), 8.11-8.12 (m, 6H); MS [M+H] 895.

Example 3

Preparation of the Compound Represented by Formula 63

The compound represented by formula c (1.00 g, 2.08 mmol), N-phenyl-2-naphthylamine (1.50 g, 6.86 mmol), Pd$_2$(dba)$_3$ (0.125 g, 0.13 mmol), P(t-Bu)$_3$ (0.04 g, 0.2 mmol) and sodium tert-butoxide (1.80 g, 18.7 mmol) were added to xylene (40 ml) and the mixture was refluxed for about 3 hours. After the completion of the reaction, the reaction mixture was cooled to room temperature and added to a mixed solution of THF and H$_2$O. The organic layer was separated, dried over MgSO$_4$ and then concentrated. The resultant product was purified by column chromatography and recrystallized in ethyl acetate/n-hexane to obtain the compound represented by formula 63 (1.21 g, 65%). $^1$H NMR (300 MHz, CDCl$_3$) 6.78 (d, 2H), 6.96-7.0 (m, 8H), 7.12 (m, 3H), 7.25-7.29 (m, 8H), 7.51-7.73 (m, 16H), 7.94-8.05 (m, 9H); MS [M+H] 895.

Example 4

Preparation of the Compound Represented by Formula 64

The compound represented by formula c (1.00 g, 2.08 mmol), N-phenyl-(9-phenanthrenyl)amine (1.85 g, 6.86 mmol), Pd$_2$(dba)$_3$ (0.125 g, 0.13 mmol), P(t-Bu)$_3$ (0.04 g, 0.2 mmol) and sodium tert-butoxide (1.80 g, 18.7 mmol) were added to xylene (40 ml) and the mixture was refluxed for about 3 hours. After the completion of the reaction, the reaction mixture was cooled to room temperature and added to a mixed solution of THF and H$_2$O. The organic layer was separated, dried over MgSO$_4$ and then concentrated. The resultant product was purified by column chromatography and recrystallized in ethyl acetate/n-hexane to obtain the compound represented by formula 64 (0.93 g, 43%). $^1$H NMR (300 MHz, CDCl$_3$) 6.78 (d, 2H), 6.96-6.97 (m, 8H), 7.12 (t, 3H), 7.25 (s, 2H), 7.41 (m, 3H), 7.5-7.51 (m, 8H), 7.65 (d, 2H), 8.32-8.38 (m, 12H), 8.62 (d, 6H), 9.43 (m, 6H); MS [M+H] 1045.

Example 5

Preparation of the Compound Represented by Formula 65

The compound represented by formula c (1.00 g, 2.08 mmol), N-phenyl-(9-anthrenyl)amine (1.85 g, 6.86 mmol), $Pd_2(dba)_3$ (0.125 g, 0.13 mmol), $P(t-Bu)_3$ (0.04 g, 0.2 mmol) and sodium tert-butoxide (1.80 g, 18.7 mmol) were added to xylene (40 ml) and the mixture was refluxed for about 3 hours. After the completion of the reaction, the reaction mixture was cooled to room temperature and added to a mixed solution of THF and $H_2O$. The organic layer was separated, dried over $MgSO_4$ and then concentrated. The resultant product was purified by column chromatography and recrystallized in ethyl acetate/n-hexane to obtain the compound represented by formula 65 (1.24 g, 57%). $^1$H NMR (300 MHz, $CDCl_3$) 6.78 (d, 2H), 6.96-6.6.98 (m, 8H), 7.12 (t, 3H), 7.23 (s, 2H), 7.5-7.51 (m, 8H), 7.65-7.66 (m, 7H), 7.81-7.84 (m, 10H), 8.14-8.15 (m, 12H); MS [M+H] 1045.

Example 6

Preparation of the Compound Represented by Formula 68

The compound represented by formula c (1.00 g, 2.08 mmol), di-(1-naphthyl)amine (1.85 g, 6.86 mmol), $Pd_2(dba)_3$ (0.125 g, 0.13 mmol), $P(t-Bu)_3$ (0.04 g, 0.2 mmol) and sodium tert-butoxide (1.80 g, 18.7 mmol) were added to xylene (40 ml) and the mixture was refluxed for about 3 hours. After the completion of the reaction, the reaction mixture was cooled to room temperature and added to a mixed solution of THF and $H_2O$. The organic layer was separated, dried over $MgSO_4$ and then concentrated. The resultant product was purified by column chromatography and recrystallized in ethyl acetate/n-hexane to obtain the compound represented by formula 68 (1.04 g, 48%). $^1$H NMR (300 MHz, $CDCl_3$) 6.78 (d, 2H), 7.0-7.05 (m, 8H), 7.25 (s, 2H), 7.50-7.66 (m, 16H), 7.80-7.81 (m, 12H), 8.11-8.16 (m, 12H); MS [M+H] 1045.

Example 7

Preparation of the Compound Represented by Formula 69

The compound represented by formula c (1.00 g, 2.08 mmol), di-(2-naphthyl)amine (1.85 g, 6.86 mmol), $Pd_2(dba)_3$ (0.125 g, 0.13 mmol), $P(t-Bu)_3$ (0.04 g, 0.2 mmol) and sodium tert-butoxide (1.80 g, 18.7 mmol) were added to xylene (40 ml) and the mixture was refluxed for about 3 hours. After the completion of the reaction, the reaction mixture was cooled to room temperature and added to a mixed solution of THF and $H_2O$. The organic layer was separated, dried over $MgSO_4$ and then concentrated. The resultant product was purified by column chromatography and recrystallized in ethyl acetate/n-hexane to obtain the compound represented by formula 69 (0.89 g, 41%). $^1$H NMR (300 MHz, $CDCl_3$) 6.78 (d, 2H), 7.0 (d, 2H), 7.26-7.29 (m, 14H), 7.5-7.53 (m, 16H), 7.94-8.05 (m, 18H); MS [M+H] 1045.

Example 8

Preparation of the Compound Represented by Formula 71

The compound represented by formula c (1.50 g, 3.13 mmol), p,p'-ditolylamine (2.03 g, 10.3 mmol), $Pd_2(dba)_3$ (0.19 g, 0.21 mmol), $P(t-Bu)_3$ (0.06 g, 0.31 mmol) and sodium tert-butoxide (1.05 g, 10.96 mmol) were added to xylene (30 ml) and the mixture was refluxed for about 3 hours. After the completion of the reaction, the reaction mixture was cooled to room temperature and added to a mixed solution of THF and $H_2O$. The organic layer was separated, dried over $MgSO_4$ and then concentrated. The resultant product was purified by column chromatography and recrystallized in ethyl acetate/n-hexane to obtain the compound represented by formula 71 (1.31 g, 50%). $^1$H NMR (300 MHz, $CDCl_3$) 2.55 (s, 18H), 6.48-6.70 (m, 16H), 6.95-7.01 (m, 14H), 7.2-7.35 (m, 4H); MS [M+H] 829.

Example 9

Preparation of the Compound Represented by Formula 72

The compound represented by formula c (1.50 g, 3.13 mmol), m,m'-ditolylamine (1.96 ml, 10.3 mmol), $Pd_2(dba)_3$ (0.19 g, 0.21 mmol), $P(t-Bu)_3$ (0.06 g, 0.31 mmol) and sodium tert-butoxide (1.05 g, 10.96 mmol) were added to xylene (30 ml) and the mixture was refluxed for about 3 hours. After the completion of the reaction, the reaction mixture was cooled to room temperature and added to a mixed solution of THF and $H_2O$. The organic layer was separated, dried over $MgSO_4$ and then concentrated. The resultant product was purified by column chromatography and recrystallized in ethyl acetate/n-hexane to obtain the compound represented by formula 72 (1.55 g, 60%). $^1$H NMR (300 MHz, $CDCl_3$) 2.55 (s, 18H), 6.48-6.70 (m, 16H), 6.95-7.01 (m, 14H), 7.2-7.35 (m, 4H); MS [M+H] 829.

Example 10

Preparation of the Compound Represented by Formula 89

The compound represented by formula c (1.50 g, 3.13 mmol), 3-methyldiphenylamine (1.88 g, 10.3 mmol), $Pd_2(dba)_3$ (0.19 g, 0.21 mmol), $P(t-Bu)_3$ (0.06 g, 0.31 mmol) and sodium tert-butoxide (1.05 g, 10.96 mmol) were added to xylene (30 ml) and the mixture was refluxed for about 3 hours. After the completion of the reaction, the reaction mixture was cooled to room temperature and added to a mixed solution of THF and $H_2O$. The organic layer was separated, dried over $MgSO_4$ and then concentrated. The resultant product was purified by column chromatography and recrystallized in ethyl acetate/n-hexane to obtain the compound represented by formula 89 (1.62 g, 66%). MS [M+H] 787.

Example 11

Preparation of the Compound Represented by Formula 95

The compound represented by formula c (1.50 g, 3.13 mmol), N-(3-methylphenyl)-1-naphthylamine (2.40 g, 10.3 mmol), $Pd_2(dba)_3$ (0.19 g, 0.21 mmol), $P(t-Bu)_3$ (0.06 g, 0.31 mmol) and sodium tert-butoxide (1.05 g, 10.96 mmol) were added to xylene (30 ml) and the mixture was refluxed for about 3 hours. After the completion of the reaction, the reaction mixture was cooled to room temperature and added to a mixed solution of THF and $H_2O$. The organic layer was separated, dried over $MgSO_4$ and then concentrated. The resultant product was purified by column chromatography and recrystallized in ethyl acetate/n-hexane to obtain the compound represented by formula 95 (1.92 g, 65%). MS [M+H] 937.

Example 12

Preparation of the Compound Represented by Formula 96

The compound represented by formula c (1.50 g, 3.13 mmol), N-(4-methylphenyl)-1-naphthylamine (2.40 g, 10.3 mmol), $Pd_2(dba)_3$ (0.19 g, 0.21 mmol), $P(t-Bu)_3$ (0.06 g, 0.31 mmol) and sodium tert-butoxide (1.05 g, 10.96 mmol) were added to xylene (30 ml) and the mixture was refluxed for about 3 hours. After the completion of the reaction, the reaction mixture was cooled to room temperature and added to a mixed solution of THF and $H_2O$. The organic layer was separated, dried over $MgSO_4$ and then concentrated. The resultant product was purified by column chromatography and recrystallized in ethyl acetate/n-hexane to obtain the compound represented by formula 96 (1.92 g, 65%). MS [M+H] 937.

Example 13

Preparation of the Compound Represented by Formula 101

The compound represented by formula c (1.50 g, 3.13 mmol), N-(3-methylphenyl)-2-naphthylamine (2.40 g, 10.3 mmol), $Pd_2(dba)_3$ (0.19 g, 0.21 mmol), $P(t-Bu)_3$ (0.06 g, 0.31 mmol) and sodium tert-butoxide (1.05 g, 10.96 mmol) were added to xylene (30 ml) and the mixture was refluxed for about 3 hours. After the completion of the reaction, the reaction mixture was cooled to room temperature and added to a mixed solution of THF and $H_2O$. The organic layer was separated, dried over $MgSO_4$ and then concentrated. The resultant product was purified by column chromatography and recrystallized in ethyl acetate/n-hexane to obtain the compound represented by formula 101 (1.92 g, 65%). MS [M+H] 937.

Example 14

Preparation of the Compound Represented by Formula 102

The compound represented by formula c (1.50 g, 3.13 mmol), N-(4-methylphenyl)-2-naphthylamine (2.40 g, 10.3 mmol), $Pd_2(dba)_3$ (0.19 g, 0.21 mmol), $P(t-Bu)_3$ (0.06 g, 0.31 mmol) and sodium tert-butoxide (1.05 g, 10.96 mmol) were added to xylene (30 ml) and the mixture was refluxed for about 3 hours. After the completion of the reaction, the reaction mixture was cooled to room temperature and added to a mixed solution of THF and $H_2O$. The organic layer was separated, dried over $MgSO_4$ and then concentrated. The resultant product was purified by column chromatography and recrystallized in ethyl acetate/n-hexane to obtain the compound represented by formula 102 (1.92 g, 65%). MS [M+H] 937.

Example 15

Preparation of the Compound Represented by Formula 113

The compound represented by formula d (1.00 g, 2.08 mmol), diphenylamine (1.16 g, 6.86 mmol), $Pd_2(dba)_3$ (0.125 g, 0.13 mmol), $P(t-Bu)_3$ (0.04 g, 0.2 mmol) and sodium tert-butoxide (1.80 g, 18.7 mmol) were added to xylene (40 ml) and the mixture was refluxed for about 3 hours. After the completion of the reaction, the reaction mixture was cooled to room temperature and added to a mixed solution of THF and $H_2O$. The organic layer was separated, dried over $MgSO_4$ and then concentrated. The resultant product was purified by column chromatography and recrystallized in ethyl acetate/n-hexane to obtain the compound represented by formula 113 (1.16 g, 75%). MS [M+H] 745.

Example 16

Preparation of the Compound Represented by Formula 114

The compound represented by formula d (1.00 g, 2.08 mmol), N-phenyl-1-naphthylamine (1.50 g, 6.86 mmol), $Pd_2(dba)_3$ (0.125 g, 0.13 mmol), $P(t-Bu)_3$ (0.04 g, 0.2 mmol) and sodium tert-butoxide (1.80 g, 18.7 mmol) were added to xylene (40 ml) and the mixture was refluxed for about 3 hours. After the completion of the reaction, the reaction mixture was cooled to room temperature and added to a mixed solution of THF and $H_2O$. The organic layer was separated, dried over $MgSO_4$ and then concentrated. The resultant product was purified by column chromatography and recrystallized in ethyl acetate/n-hexane to obtain the compound represented by formula 114 (1.46 g, 79%). MS [M+H] 895.

Example 17

Preparation of the Compound Represented by Formula 115

The compound represented by formula d (1.00 g, 2.08 mmol), N-phenyl-2-naphthylamine (1.50 g, 6.86 mmol), $Pd_2(dba)_3$ (0.125 g, 0.13 mmol), $P(t-Bu)_3$ (0.04 g, 0.2 mmol) and sodium tert-butoxide (1.80 g, 18.7 mmol) were added to xylene (40 ml) and the mixture was refluxed for about 3 hours. After the completion of the reaction, the reaction mixture was cooled to room temperature and added to a mixed solution of THF and $H_2O$. The organic layer was separated, dried over $MgSO_4$ and then concentrated. The resultant product was purified by column chromatography and recrystallized in ethyl acetate/n-hexane to obtain the compound represented by formula 115 (1.21 g, 65%). MS [M+H] 895.

Example 18

Preparation of the Compound Represented by Formula 116

The compound represented by formula d (1.50 g, 3.13 mmol), 3-methyldiphenylamine (1.88 g, 10.3 mmol), $Pd_2(dba)_3$ (0.19 g, 0.21 mmol), $P(t-Bu)_3$ (0.06 g, 0.31 mmol) and sodium tert-butoxide (1.05 g, 10.96 mmol) were added to xylene (30 ml) and the mixture was refluxed for about 3 hours. After the completion of the reaction, the reaction mixture was cooled to room temperature and added to a mixed solution of THF and $H_2O$. The organic layer was separated, dried over $MgSO_4$ and then concentrated. The resultant product was purified by column chromatography and recrystallized in ethyl acetate/n-hexane to obtain the compound represented by formula 116 (1.62 g, 66%). MS [M+H] 787.

Example 19

Preparation of the Compound Represented by Formula 120

The compound represented by formula d (1.50 g, 3.13 mmol), N-(3-methylphenyl)-1-naphthylamine (2.40 g, 10.3 mmol), Pd$_2$(dba)$_3$ (0.19 g, 0.21 mmol), P(t-Bu)$_3$ (0.06 g, 0.31 mmol) and sodium tert-butoxide (1.05 g, 10.96 mmol) were added to xylene (30 ml) and the mixture was refluxed for about 3 hours. After the completion of the reaction, the reaction mixture was cooled to room temperature and added to a mixed solution of THF and H$_2$O. The organic layer was separated, dried over MgSO$_4$ and then concentrated. The resultant product was purified by column chromatography and recrystallized in ethyl acetate/n-hexane to obtain the compound represented by formula 120 (1.92 g, 65%). MS [M+H] 937.

Example 20

Preparation of the Compound Represented by Formula 121

The compound represented by formula d (1.50 g, 3.13 mmol), N-(3-methylphenyl)-2-naphthylamine (2.40 g, 10.3 mmol), Pd$_2$(dba)$_3$ (0.19 g, 0.21 mmol), P(t-Bu)$_3$ (0.06 g, 0.31 mmol) and sodium tert-butoxide (1.05 g, 10.96 mmol) were added to xylene (30 ml) and the mixture was refluxed for about 3 hours. After the completion of the reaction, the reaction mixture was cooled to room temperature and added to a mixed solution of THF and H$_2$O. The organic layer was separated, dried over MgSO$_4$ and then concentrated. The resultant product was purified by column chromatography and recrystallized in ethyl acetate/n-hexane to obtain the compound represented by formula 121 (1.92 g, 65%). MS [M+H] 937.

Example 21

Preparation of the Compound Represented by Formula 192

1) The compound represented by formula e (5.0 g, 15.38 mmol) and di-tert-butyl-dicarbonate (5.04 g, 23.08 mmol) were dissolved in 50 ml of THF and 4-(dimethylamino)pyridine (0.19 g, 1.54 mmol) was added thereto. Then, the reaction mixture was reacted at room temperature for 24 hours. After the completion of the reaction, the reaction mixture was concentrated and recrystallized in ethanol to obtain a product (6.16 g, 94%).

2) The product obtained from step 1) (6.16 g, 14.49 mmol), diphenylamine (5.89 g, 34.78 mmol), sodium tert-butoxide (4.18 g, 43.47 mmol), Pd$_2$(dba)$_3$ (0.17 g, 0.29 mmol) and P(t-Bu)$_3$ (0.06 g, 0.29 mmol) were added to xylene (30 ml) and the mixture was refluxed for about 3 hours. After the completion of the reaction, the reaction mixture was cooled to room temperature and added to a mixed solution of THF and H$_2$O. The organic layer was separated, dried over MgSO$_4$ and then concentrated. The resultant product was purified by column chromatography and recrystallized in ethyl acetate/n-hexane to obtain a compound (5.88 g, 67%).

3) The compound obtained from step 2) (5.88 g, 9.77 mmol) was dissolved in trifluoroacetic acid/chloroform=50 ml/50 ml and the solution was refluxed for 3 hours. The reaction mixture was cooled to room temperature, quenched with aqueous NaOH solution, extracted with methylene chloride (MC) and then washed with water many times. The resultant product was dried over magnesium sulfate and allowed to evaporate. The crude product was purified by column chromatography (ethyl acetate/hexane=1/9) to obtain a compound (2.9 g, 59%).

4) The product obtained from step 3) (2.9 g, 5.78 mmol), 4-bromophenyl-diphenylamine (1.36 g, 4.21 mmol), Pd$_2$(dba)$_3$ (0.05 g, 0.084 mmol) and P(t-Bu)$_3$ (0.017 g, 0.084 mmol) and sodium tert-butoxide (1.21 g, 12.63 mmol) were added to xylene (30 ml) and the mixture was refluxed for about 3 hours. After the completion of the reaction, the reaction mixture was cooled to room temperature and added to a mixed solution of THF and H$_2$O. The organic layer was separated, dried over MgSO$_4$ and then concentrated. The resultant product was purified by column chromatography and recrystallized in ethyl acetate/n-hexane to obtain the compound represented by formula 192 (1.5 g, 49%). MS [M+H] 745.

Example 22

Preparation of the Compound Represented by Formula 193

1) The compound represented by formula e (5.0 g, 15.38 mmol) and di-tert-butyl-dicarbonate (5.04 g, 23.08 mmol) were dissolved in 50 ml of THF and 4-(dimethylamino)pyridine (0.19 g, 1.54 mmol) was added thereto. Then, the reaction mixture was reacted at room temperature for 24 hours. After the completion of the reaction, the reaction mixture was concentrated and recrystallized in ethanol to obtain a product (6.16 g, 94%).

2) The product obtained from step 1) (6.16 g, 14.49 mmol), N-phenyl-1-naphthylamine (7.63 g, 34.78 mmol), sodium tert-butoxide (4.18 g, 43.47 mmol), Pd$_2$(dba)$_3$ (0.17 g, 0.29 mmol) and P(t-Bu)$_3$ (0.06 g, 0.29 mmol) were added to xylene (30 ml) and the mixture was refluxed for about 3 hours. After the completion of the reaction, the reaction mixture was cooled to room temperature and added to a mixed solution of THF and H$_2$O. The organic layer was separated, dried over MgSO$_4$ and then concentrated. The resultant product was purified by column chromatography and recrystallized in ethyl acetate/n-hexane to obtain a compound (6.0 g, 59%).

3) The compound obtained from step 2) (6.0 g, 8.54 mmol) was dissolved in trifluoroacetic acid/chloroform=50 ml/50 ml and the solution was refluxed for 3 hours. The reaction mixture was cooled to room temperature, quenched with aqueous NaOH solution, extracted with methylene chloride and then washed with water many times. The resultant product was dried over magnesium sulfate and allowed to evaporate. The crude product was purified by column chromatography (ethyl acetate/hexane=1/9) to obtain a compound (3.8 g, 74%).

4) The product obtained from step 3) (3.8 g, 6.31 mmol), 4-bromophenyl-N-phenyl-1-naphthylamine (1.57 g, 4.21 mmol), Pd$_2$(dba)$_3$ (0.05 g, 0.084 mmol) and P(t-Bu)$_3$ (0.017 g, 0.084 mmol) and sodium tert-butoxide (1.21 g, 12.63 mmol) were added to xylene (30 ml) and the mixture was refluxed for about 3 hours. After the completion of the reaction, the reaction mixture was cooled to room temperature and added to a mixed solution of THF and H$_2$O. The organic layer was separated, dried over MgSO$_4$ and then concentrated. The resultant product was purified by column chromatography and recrystallized in ethyl acetate/n-hexane to obtain the compound represented by formula 193 (1.2 g, 32%). MS [M+H] 895.

Example 23

Preparation of the Compound Represented by Formula 194

1) The compound represented by formula e (5.0 g, 15.38 mmol) and di-tert-butyl-dicarbonate (5.04 g, 23.08 mmol) were dissolved in 50 ml of THF and 4-(dimethylamino)pyridine (0.19 g, 1.54 mmol) was added thereto. Then, the reaction mixture was reacted at room temperature for 24 hours. After the completion of the reaction, the reaction mixture was concentrated and recrystallized in ethanol to obtain a product (6.16 g, 94%).

2) The product obtained from step 1) (6.16 g, 14.49 mmol), N-phenyl-2-naphthylamine (7.63 g, 34.78 mmol), sodium tert-butoxide (4.18 g, 43.4 mmol), $Pd_2(dba)_3$ (0.17 g, 0.29 mmol) and $P(t-Bu)_3$ (0.06 g, 0.29 mmol) were added to xylene (30 ml) and the mixture was refluxed for about 3 hours. After the completion of the reaction, the reaction mixture was cooled to room temperature and added to a mixed solution of THF and $H_2O$. The organic layer was separated, dried over $MgSO_4$ and then concentrated. The resultant product was purified by column chromatography and recrystallized in ethyl acetate/n-hexane to obtain a compound (6.0 g, 59%).

3) The compound obtained from step 2) (6.0 g, 8.54 mmol) was dissolved in trifluoroacetic acid/chloroform=50 ml/50 ml and the solution was refluxed for 3 hours. The reaction mixture was cooled to room temperature, quenched with aqueous NaOH solution, extracted with methylene chloride and then washed with water many times. The resultant product was dried over magnesium sulfate and allowed to evaporate. The crude product was purified by column chromatography (ethyl acetate/hexane=1/9) to obtain a compound (3.8 g, 74%).

4) The product obtained from step 3) (3.8 g, 6.31 mmol), 4-bromophenyl-N-phenyl-2-naphthylamine (1.57 g, 4.21 mmol), $Pd_2(dba)_3$ (0.05 g, 0.084 mmol) and $P(t-Bu)_3$ (0.017 g, 0.084 mmol) and sodium tert-butoxide (1.21 g, 12.63 mmol) were added to xylene (30 ml) and the mixture was refluxed for about 3 hours. After the completion of the reaction, the reaction mixture was cooled to room temperature and added to a mixed solution of THF and $H_2O$. The organic layer was separated, dried over $MgSO_4$ and then concentrated. The resultant product was purified by column chromatography and recrystallized in ethyl acetate/n-hexane to obtain the compound represented by formula 194 (1.2 g, 32%). MS [M+H] 895.

Example 24

Preparation of the Compound Represented by Formula 197

1) The compound represented by formula e (5.0 g, 15.38 mmol) and di-tert-butyl-dicarbonate (5.04 g, 23.08 mmol) were dissolved in 50 ml of THF and 4-(dimethylamino)pyridine (0.19 g, 1.54 mmol) was added thereto. Then, the reaction mixture was reacted at room temperature for 24 hours. After the completion of the reaction, the reaction mixture was concentrated and recrystallized in ethanol to obtain a product (6.16 g, 94%).

2) The product obtained from step 1) (6.16 g, 14.49 mmol), 3-methyl-diphenylamine (6.37 g, 34.78 mmol), sodium tert-butoxide (4.18 g, 43.47 mmol), $Pd_2(dba)_3$ (0.17 g, 0.29 mmol) and $P(t-Bu)_3$ (0.06 g, 0.29 mmol) were added to xylene (30 ml) and the mixture was refluxed for about 3 hours. After the completion of the reaction, the reaction mixture was cooled to room temperature and added to a mixed solution of THF and $H_2O$. The organic layer was separated, dried over $MgSO_4$ and then concentrated. The resultant product was purified by column chromatography and recrystallized in ethyl acetate/n-hexane to obtain a compound (6.3 g, 69%).

3) The compound obtained from step 2) (6.3 g, 10.0 mmol) was dissolved in trifluoroacetic acid/chloroform=50 ml/50 ml and the solution was refluxed for 3 hours. The reaction mixture was cooled to room temperature, quenched with aqueous NaOH solution, extracted with methylene chloride and then washed with water many times. The resultant product was dried over magnesium sulfate and allowed to evaporate. The crude product was purified by column chromatography (ethyl acetate/hexane=1/9) to obtain a compound (3.8 g, 71%).

4) The product obtained from step 3) (3.8 g, 7.17 mmol), 4-bromophenyl-(3-methyl)-diphenylamine (1.42 g, 4.21 mmol), $Pd_2(dba)_3$ (0.05 g, 0.084 mmol) and $P(t-Bu)_3$ (0.017 g, 0.084 mmol) and sodium tert-butoxide (1.21 g, 12.63 mmol) were added to xylene (30 ml) and the mixture was refluxed for about 3 hours. After the completion of the reaction, the reaction mixture was cooled to room temperature and added to a mixed solution of THF and $H_2O$. The organic layer was separated, dried over $MgSO_4$ and then concentrated. The resultant product was purified by column chromatography and recrystallized in ethyl acetate/n-hexane to obtain the compound represented by formula 197 (1.2 g, 36%). MS [M+H] 787.

Example 25

Preparation of the Compound Represented by Formula 218

1) The compound represented by formula e (5.0 g, 15.38 mmol) and di-tert-butyl-dicarbonate (5.04 g, 23.08 mmol) were dissolved in 50 ml of THF and 4-(dimethylamino)pyridine (0.19 g, 1.54 mmol) was added thereto. Then, the reaction mixture was reacted at room temperature for 24 hours. After the completion of the reaction, the reaction mixture was concentrated and recrystallized in ethanol to obtain a product (6.16 g, 94%).

2) The product obtained from step 1) (6.16 g, 14.49 mmol), diphenylamine (5.89 g, 34.78 mmol), sodium tert-butoxide (4.18 g, 43.47 mmol), $Pd_2(dba)_3$ (0.17 g, 0.29 mmol) and $P(t-Bu)_3$ (0.06 g, 0.29 mmol) were added to xylene (30 ml) and the mixture was refluxed for about 3 hours. After the completion of the reaction, the reaction mixture was cooled to room temperature and added to a mixed solution of THF and $H_2O$. The organic layer was separated, dried over $MgSO_4$ and then concentrated. The resultant product was purified by column chromatography and recrystallized in ethyl acetate/n-hexane to obtain a compound (5.88 g, 67%).

3) The compound obtained from step 2) (5.88 g, 9.77 mmol) was dissolved in trifluoroacetic acid/chloroform=50 ml/50 ml and the solution was refluxed for 3 hours. The reaction mixture was cooled to room temperature, quenched with aqueous NaOH solution, extracted with methylene chloride and then washed with water many times. The resultant product was dried over magnesium sulfate and allowed to evaporate. The crude product was purified by column chromatography (ethyl acetate/hexane=1/9) to obtain a compound (2.9 g, 59%).

4) The product obtained from step 3) (2.9 g, 57.8 mmol), 4-bromophenyl-N-phenyl-1-naphthylamine (1.57 g, 4.21 mmol), $Pd_2(dba)_3$ (0.05 g, 0.084 mmol) and $P(t-Bu)_3$ (0.017 g, 0.084 mmol) and sodium tert-butoxide (1.21 g, 12.63 mmol) were added to xylene (30 ml) and the mixture was refluxed for about 3 hours. After the completion of the reaction, the reaction mixture was cooled to room temperature and added to a mixed solution of THF and $H_2O$. The organic layer was separated, dried over $MgSO_4$ and then concentrated. The resultant product was purified by column chromatography and recrystallized in ethyl acetate/n-hexane to obtain the compound represented by formula 218 (1.5 g, 49%). MS [M+H] 795.

Example 26

Preparation of the Compound Represented by Formula 219

1) The compound represented by formula e (5.0 g, 15.38 mmol) and di-tert-butyl-dicarbonate (5.04 g, 23.08 mmol) were dissolved in 50 ml of THF and 4-(dimethylamino)pyridine (0.19 g, 1.54 mmol) was added thereto. Then, the reaction mixture was reacted at room temperature for 24 hours. After the completion of the reaction, the reaction mixture was concentrated and recrystallized in ethanol to obtain a product (6.16 g, 94%).

2) The product obtained from step 1) (6.16 g, 14.49 mmol), N-phenyl-2-naphthylamine (7.63 g, 34.78 mmol), sodium tert-butoxide (4.18 g, 43.47 mmol), $Pd_2(dba)_3$ (0.17 g, 0.29 mmol) and $P(t-Bu)_3$ (0.06 g, 0.29 mmol) were added to xylene (30 ml) and the mixture was refluxed for about 3 hours. After the completion of the reaction, the reaction mixture was cooled to room temperature and added to a mixed solution of THF and $H_2O$. The organic layer was separated, dried over $MgSO_4$ and then concentrated. The resultant product was purified by column chromatography and recrystallized in ethyl acetate/n-hexane to obtain a compound (6.0 g, 59%).

3) The compound obtained from step 2) (6.0 g, 8.54 mmol) was dissolved in trifluoroacetic acid/chloroform=50 ml/50 ml and the solution was refluxed for 3 hours. The reaction mixture was cooled to room temperature, quenched with aqueous NaOH solution, extracted with methylene chloride and then washed with water many times. The resultant product was dried over magnesium sulfate and allowed to evaporate. The crude product was purified by column chromatography (ethyl acetate/hexane=1/9) to obtain a compound (3.8 g, 74%).

4) The product obtained from step 3) (3.8 g, 6.31 mmol), 4-bromophenyl-N-phenyl-1-naphthylamine (1.57 g, 4.21 mmol), $Pd_2(dba)_3$ (0.05 g, 0.084 mmol) and $P(t-Bu)_3$ (0.017 g, 0.084 mmol) and sodium tert-butoxide (1.21 g, 12.63 mmol) were added to xylene (30 ml) and the mixture was refluxed for about 3 hours. After the completion of the reaction, the reaction mixture was cooled to room temperature and added to a mixed solution of THF and $H_2O$. The organic layer was separated, dried over $MgSO_4$ and then concentrated. The resultant product was purified by column chromatography and recrystallized in ethyl acetate/n-hexane to obtain the compound represented by formula 219 (1.2 g, 32%). MS [M+H] 895.

Example 27

Preparation of the Compound Represented by Formula 252

The compound represented by formula c (1.00 g, 2.08 mmol), triphenylamine-4-boronic acid (1.99 g, 6.87 mmol), 2M potassium carbonate solution (10 ml) and tetrakis(triphenylphosphine)palladium (0.07 g, 0.06 mmol) were added to 40 ml of THF. The mixture was stirred under reflux for about 24 hours and then cooled to room temperature. The reaction mixture was added to toluene/brine, and then the toluene layer was separated, dried over $MgSO_4$, filtered and concentrated. The resultant product was purified by column chromatography and recrystallized in ethyl acetate/n-hexane to obtain the compound represented by formula 252 (1.15 g, 55%). $^1H$ NMR (300 MHz, $CDCl_3$) 6.76-6.82 (m, 18H), 6.92-6.95 (m, 6H), 7.31-7.35 (m, 12H), 7.53-7.60 (m, 10H), 7.76-8.07 (m, 6H); MS [M+H] 973.

Example 28

Manufacture of Organic Light Emitting Device

A glass substrate on which a thin film of ITO (indium tin oxide) was coated to a thickness of 1000 Å was immersed in distilled water containing a detergent to wash the substrate with ultrasonic waves. The detergent was a product commercially available from Fisher Co. The distilled water has been filtered twice by using a filter commercially available from Millipore Co. After washing ITO for 30 minutes, washing with ultrasonic waves was repeated twice for 10 minutes by using distilled water. After the completion of washing with distilled water, washing with ultrasonic waves was carried out by using isopropyl alcohol, acetone and methanol, in turn. The resultant substrate was dried and transferred to a plasma cleaner. Then, the substrate was cleaned for 5 minutes by using oxygen plasma and transferred to a vacuum deposition device.

On the ITO transparent electrode (first electrode) prepared as described above, the compound represented by the above formula 61 was coated to a thickness of 600 Å by thermal vacuum deposition, thereby forming a hole injection layer. Next, NPB as a hole transport material was coated thereon to a thickness of 400 Å by vacuum deposition. Additionally, Alq3, which serves as light emitting/electron injection/electron transport material was coated thereon to a thickness of 500 Å by vacuum deposition to complete the formation of a thin film of organic materials. On the Alq3 layer, lithium fluoride (LiF) and aluminum were sequentially vacuum-deposited to a thickness of 15 Å and 2500 Å, respectively, to form a cathode (second electrode). In the above process, deposition rate of each organic material was maintained at 0.5-1.0 Å/sec and deposition rates of lithium fluoride and aluminum were maintained at 0.2 Å/sec and 2-3 Å/sec, respectively.

The resultant organic electroluminescence device showed a spectrum having a luminance of 3.87 cd/A under the application of a forward electric field with a drive voltage of 7.17V at a current density of 100 $mA/cm^2$.

Example 29

Manufacture of Organic Light Emitting Device

On the ITO transparent electrode prepared as described in Example 28, the compound represented by the above formula 62 was coated to a thickness of 800 Å by thermal vacuum deposition, thereby forming a hole injection layer. Next, NPB as a hole transport material was coated thereon to a thickness of 400 Å by vacuum deposition. Additionally, Alq3, which serves as light emitting/electron injection/electron transport material was coated thereon to a thickness of 300 Å by vacuum deposition to complete the formation of a thin film of organic materials. The remaining procedure was the same as Example 28.

The resultant organic electroluminescence device showed a spectrum having a luminance of 3.86 cd/A under the application of a forward electric field with a drive voltage of 7.8V at a current density of 100 $mA/cm^2$.

Example 30

Manufacture of Organic Light Emitting Device

Example 28 was repeated to manufacture an organic electroluminescence device, except that the compound repre-

Example 31

Manufacture of Organic Light Emitting Device

Example 28 was repeated to manufacture an organic electroluminescence device, except that the compound represented by the above formula 64 was used instead of the compound represented by the above formula 61.

The resultant organic electroluminescence device showed a spectrum having a luminance of 3.61 cd/A under the application of a forward electric field with a drive voltage of 8.1V at a current density of 100 mA/cm$^2$.

Example 32

Manufacture of Organic Light Emitting Device

Example 28 was repeated to manufacture an organic electroluminescence device, except that the compound represented by the above formula 69 was used instead of the compound represented by the above formula 61.

The resultant organic electroluminescence device showed a spectrum having a luminance of 3.82 cd/A under the application of a forward electric field with a drive voltage of 8.0V at a current density of 100 mA/cm$^2$.

Example 33

Manufacture of Organic Light Emitting Device

Example 28 was repeated to manufacture an organic electroluminescence device, except that the compound represented by the above formula 71 was used instead of the compound represented by the above formula 61.

The resultant organic electroluminescence device showed a spectrum having a luminance of 4.4 cd/A under the application of a forward electric field with a drive voltage of 7.6V at a current density of 100 mA/cm$^2$.

Example 34

Manufacture of Organic Light Emitting Device

Example 28 was repeated to manufacture an organic electroluminescence device, except that the compound represented by the above formula 72 was used instead of the compound represented by the above formula 61.

The resultant organic electroluminescence device showed a spectrum having a luminance of 4.15 cd/A under the application of a forward electric field with a drive voltage of 7.8V at a current density of 100 mA/cm$^2$.

Example 35

Manufacture of Organic Light Emitting Device

Example 28 was repeated to manufacture an organic electroluminescence device, except that the compound represented by the above formula 89 was used instead of the compound represented by the above formula 61.

The resultant organic electroluminescence device showed a spectrum having a luminance of 4.3 cd/A under the application of a forward electric field with a drive voltage of 7.5 at a current density of 100 mA/cm$^2$.

Example 36

Manufacture of Organic Light Emitting Device

Example 28 was repeated to manufacture an organic electroluminescence device, except that the compound represented by the above formula 95 was used instead of the compound represented by the above formula 61.

The resultant organic electroluminescence device showed a spectrum having a luminance of 4.5 cd/A under the application of a forward electric field with a drive voltage of 7.3V at a current density of 100 mA/cm$^2$.

Example 37

Manufacture of Organic Light Emitting Device

Example 28 was repeated to manufacture an organic electroluminescence device, except that the compound represented by the above formula 96 was used instead of the compound represented by the above formula 61.

The resultant organic electroluminescence device showed a spectrum having a luminance of 4.4 cd/A under the application of a forward electric field with a drive voltage of 7.2V at a current density of 100 mA/cm$^2$.

Example 38

Manufacture of Organic Light Emitting Device

Example 28 was repeated to manufacture an organic electroluminescence device, except that the compound represented by the above formula 113 was used instead of the compound represented by the above formula 61.

The resultant organic electroluminescence device showed a spectrum having a luminance of 4.2 cd/A under the application of a forward electric field with a drive voltage of 7.7V at a current density of 100 mA/cm$^2$.

Example 39

Manufacture of Organic Light Emitting Device

Example 28 was repeated to manufacture an organic electroluminescence device, except that the compound represented by the above formula 114 was used instead of the compound represented by the above formula 61.

The resultant organic electroluminescence device showed a spectrum having a luminance of 4.1 cd/A under the application of a forward electric field with a drive voltage of 7.6V at a current density of 100 mA/cm$^2$.

Example 40

Manufacture of Organic Light Emitting Device

Example 28 was repeated to manufacture an organic electroluminescence device, except that the compound represented by the above formula 120 was used instead of the compound represented by the above formula 61.

The resultant organic electroluminescence device showed a spectrum having a luminance of 3.98 cd/A under the appli-

Example 41

Manufacture of Organic Light Emitting Device

On the ITO transparent electrode prepared as described in Example 28, the compound represented by the above formula 192 was coated to a thickness of 800 Å by thermal vacuum deposition, thereby forming a hole injection layer. Next, NPB as a hole transport material was coated thereon to a thickness of 300 Å by vacuum deposition. Additionally, Alq3, which serves as light emitting/electron injection/electron transport material was coated thereon to a thickness of 300 Å by vacuum deposition to complete the formation of a thin film of organic materials. The remaining procedure was the same as Example 28.

The resultant organic electroluminescence device showed a spectrum having a luminance of 3.7 cd/A under the application of a forward electric field with a drive voltage of 6.7V at a current density of 100 mA/cm$^2$.

Example 42

Manufacture of Organic Light Emitting Device

Example 41 was repeated to manufacture an organic electroluminescence device, except that the compound represented by the above formula 193 was used instead of the compound represented by the above formula 192.

The resultant organic electroluminescence device showed a spectrum having a luminance of 3.6 cd/A under the application of a forward electric field with a drive voltage of 6.9V at a current density of 100 mA/cm$^2$.

Example 43

Manufacture of Organic Light Emitting Device

Example 41 was repeated to manufacture an organic electroluminescence device, except that the compound represented by the above formula 194 was used instead of the compound represented by the above formula 192.

The resultant organic electroluminescence device showed a spectrum having a luminance of 3.5 cd/A under the application of a forward electric field with a drive voltage of 6.8V at a current density of 100 mA/cm$^2$.

Example 44

Manufacture of Organic Light Emitting Device

Example 41 was repeated to manufacture an organic electroluminescence device, except that the compound represented by the above formula 197 was used instead of the compound represented by the above formula 192.

The resultant organic electroluminescence device showed a spectrum having a luminance of 3.9 cd/A under the application of a forward electric field with a drive voltage of 6.9V at a current density of 100 mA/cm$^2$.

Example 45

Manufacture of Organic Light Emitting Device

Example 41 was repeated to manufacture an organic electroluminescence device, except that the compound represented by the above formula 218 was used instead of the compound represented by the above formula 192.

The resultant organic electroluminescence device showed a spectrum having a luminance of 3.8 cd/A under the application of a forward electric field with a drive voltage of 6.8V at a current density of 100 mA/cm$^2$.

Example 46

Manufacture of Organic Light Emitting Device

Example 41 was repeated to manufacture an organic electroluminescence device, except that the compound represented by the above formula 219 was used instead of the compound represented by the above formula 192.

The resultant organic electroluminescence device showed a spectrum having a luminance of 3.6 cd/A under the application of a forward electric field with a drive voltage of 6.8V at a current density of 100 mA/cm$^2$.

Example 47

Manufacture of Organic Light Emitting Device

Example 41 was repeated to manufacture an organic electroluminescence device, except that the compound represented by the above formula 252 was used instead of the compound represented by the above formula 192.

The resultant organic electroluminescence device showed a spectrum having a luminance of 3.2 cd/A under the application of a forward electric field with a drive voltage of 6.88V at a current density of 100 mA/cm$^2$.

As can be seen from the above Examples, the organic electroluminescence device using the compound according to the present invention as a hole injection material can provide excellent electroluminescence effect as demonstrated by a luminance of 3.2-4.5 cd/A under a forward electric field of about 6.88V at a current density of 100 mA/cm$^2$. In other words, when the compound according to the present invention is used as hole injection material in an organic electroluminescence device comprising NPB as hole transport material and Alq3 as light emitting/electron injection/electron transport material, it is possible to improve electroluminescence effect significantly compared to conventional devices.

INDUSTRIAL APPLICABILITY

As can be seen from the foregoing, novel compounds according to the present invention can realize improvements in luminous efficiency and lifespan, when they are used in organic compound layers of an organic electroluminescence (EL) device, which is one of light emitting devices. Therefore, the compound according to the present invention can be advantageously used in the field of electric devices including organic light emitting devices.

The invention claimed is:

1. A compound represented by any one of the following formulae 70, 73 to 82, and 85 to 88:

formula 70
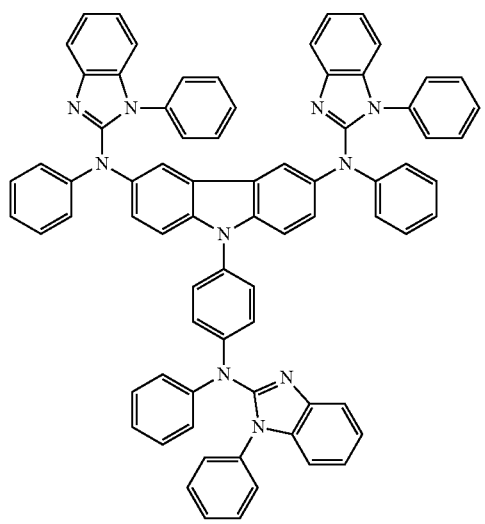
formula 74
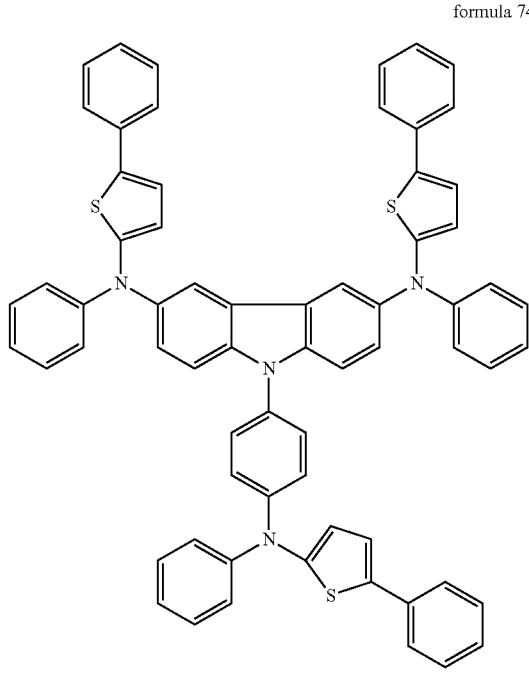
formula 73
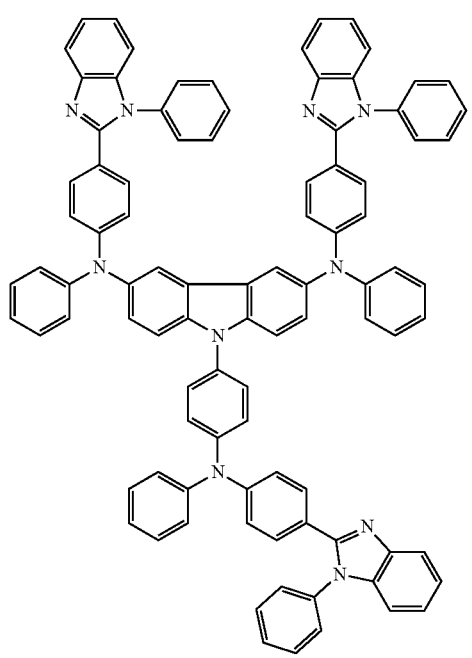
formula 75
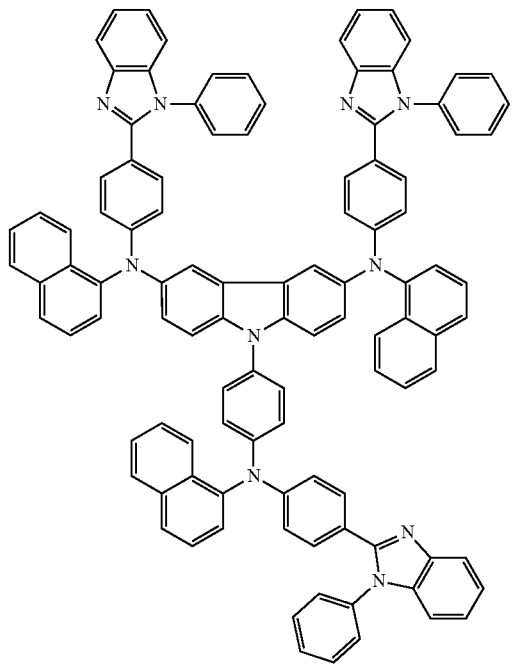

formula 76
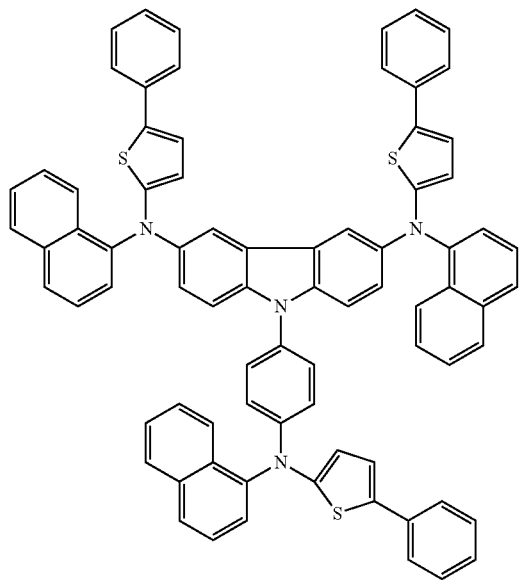
formula 78
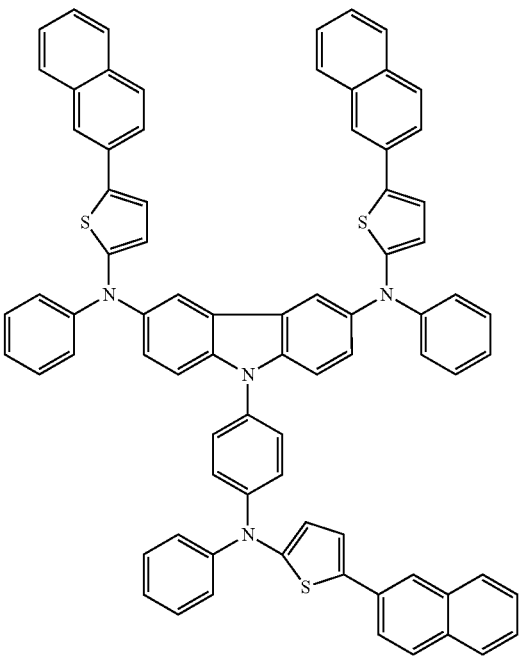
formula 77
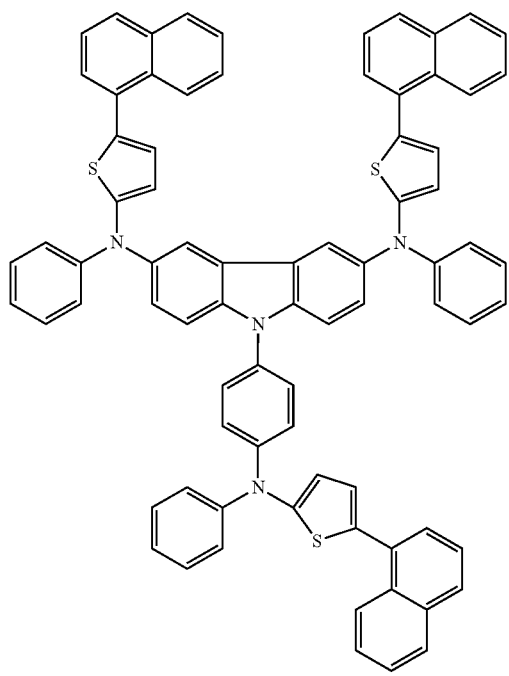
formula 79
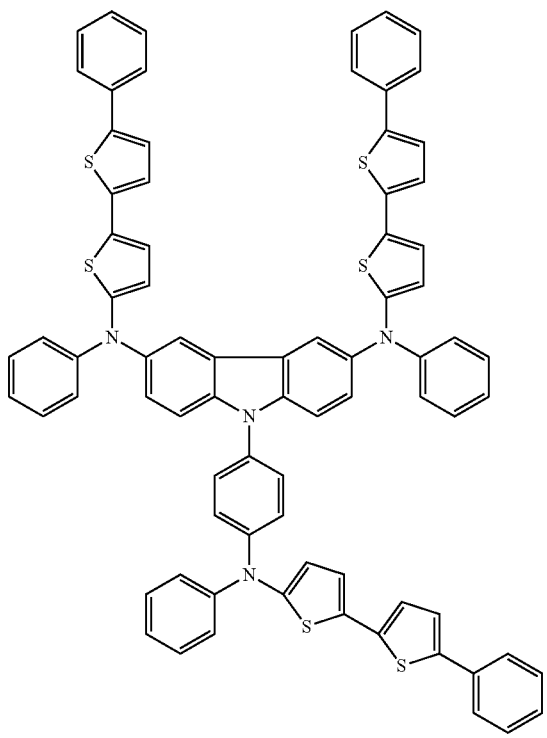

formula 80
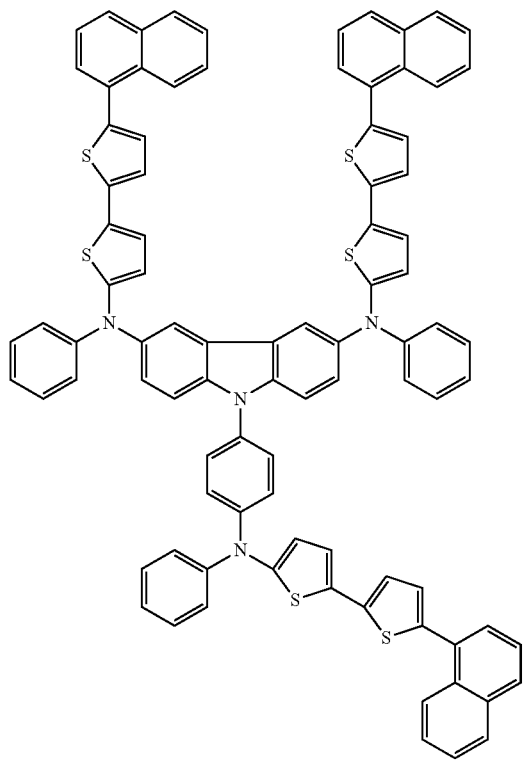
formula 81
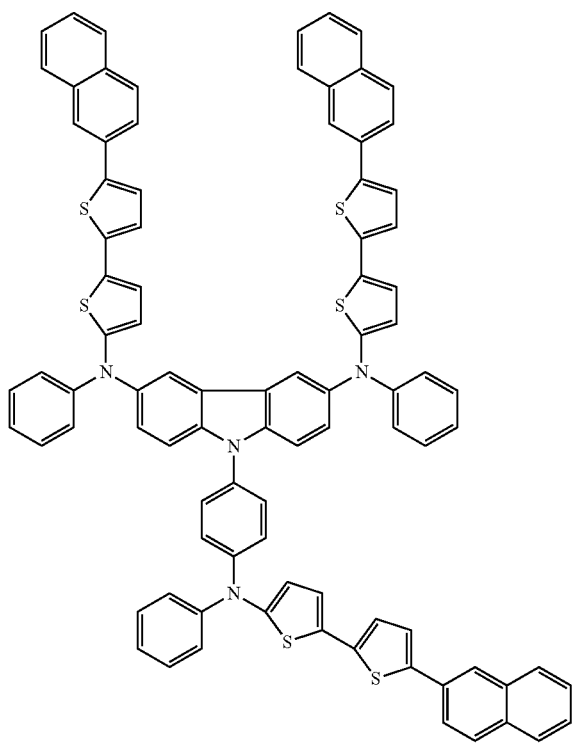
formula 82
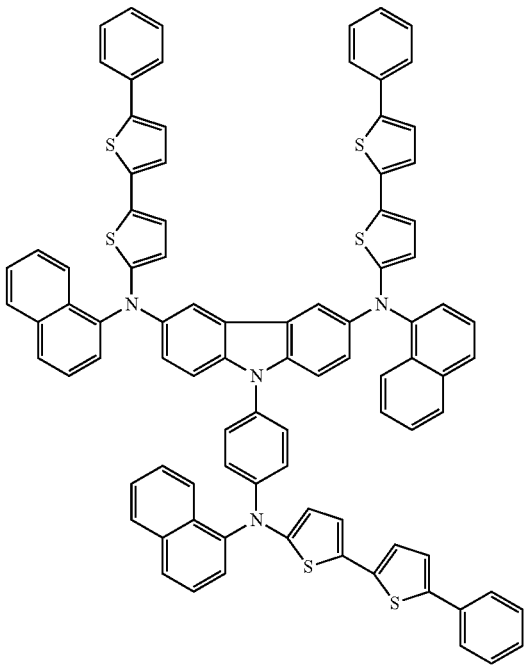
formula 85
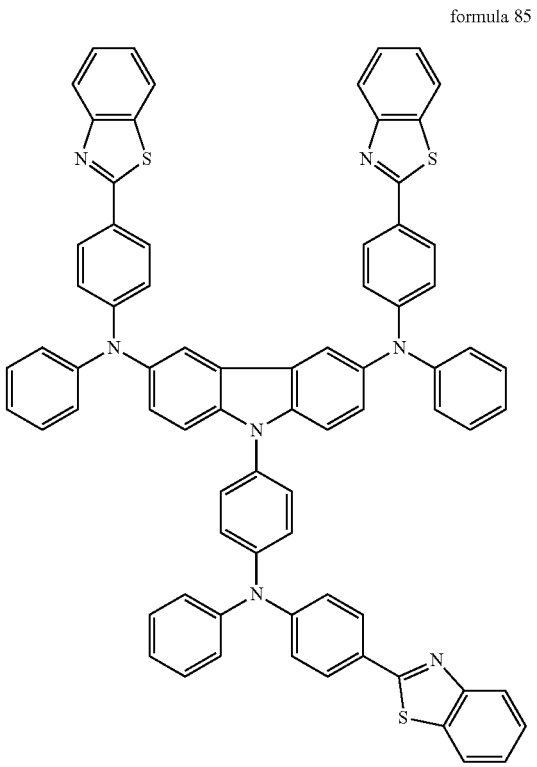

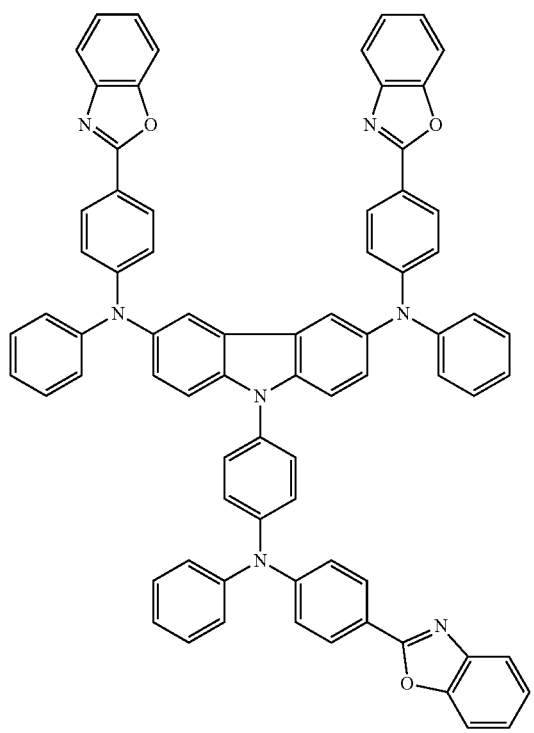

formula 86

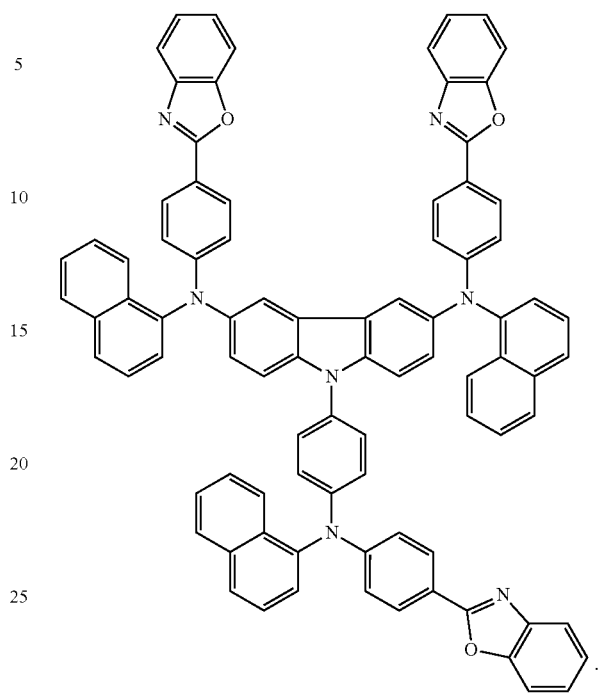

formula 88

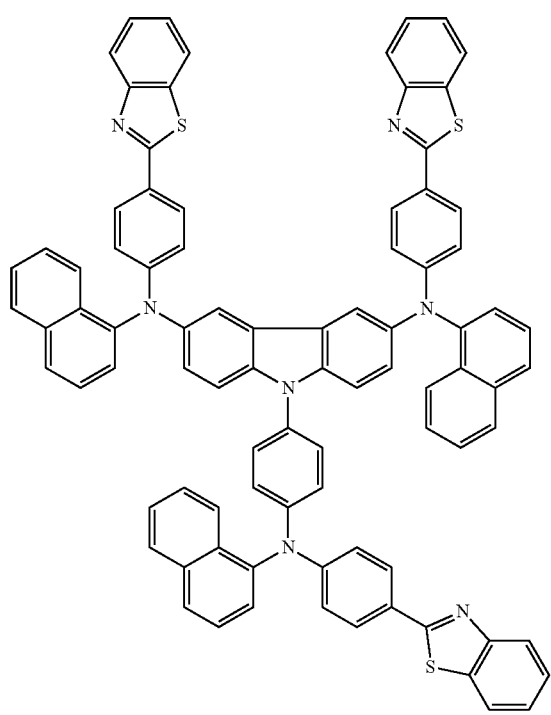

formula 87

2. An organic light emitting device comprising a first electrode, a second electrode and one or more organic compound layers disposed between both the electrodes, wherein at least one of the organic compound layers comprises at least one compound of claim 1.

3. The organic light emitting device according to claim 2, wherein the at least one of the organic compound layers is a hole injection/hole transport layer having hole injection and hole transport functions.

4. The organic light emitting device according to claim 2, wherein the at least one of the organic compound layers is a hole injection/hole transport/light emitting layer having hole injection, hole transport and light emitting functions.

5. The organic light emitting device according to claim 2, wherein the at least one of the organic compound layers is a hole injection layer having hole injection function.

6. The organic light emitting device according to claim 2, which comprises a substrate, anode, hole injection layer, hole transport layer, organic light emitting layer, electron transport layer and a cathode, from the bottom, wherein the at least one of the organic compound layers is at least one selected from the group consisting of the hole injection layer, hole transport layer and the light emitting layer.

* * * * *